United States Patent
O'Keeffe

(10) Patent No.: US 10,401,561 B2
(45) Date of Patent: Sep. 3, 2019

(54) SMART ILLUMINATED ELECTRICAL FACEPLATE

(71) Applicant: James Thomas O'Keeffe, Mountain View, CA (US)

(72) Inventor: James Thomas O'Keeffe, Mountain View, CA (US)

( * ) Notice: Subject to any disclaimer, the term of this patent is extended or adjusted under 35 U.S.C. 154(b) by 0 days.

(21) Appl. No.: 15/390,372

(22) Filed: Dec. 23, 2016

(65) Prior Publication Data
US 2017/0146730 A1    May 25, 2017

Related U.S. Application Data

(60) Continuation of application No. 15/170,836, filed on Jun. 1, 2016, now Pat. No. 9,575,587, which is a division of application No. 15/000,013, filed on Jan. 18, 2016, now Pat. No. 9,389,769.

(60) Provisional application No. 62/273,435, filed on Dec. 31, 2015, provisional application No. 62/191,537, filed on Jul. 13, 2015, provisional application No. 62/242,158, filed on Oct. 15, 2015.

(51) Int. Cl.
| | |
|---|---|
| *G01D 11/26* | (2006.01) |
| *F21V 8/00* | (2006.01) |
| *F21V 33/00* | (2006.01) |
| *F21V 23/04* | (2006.01) |
| *H02B 1/46* | (2006.01) |
| *H03K 17/96* | (2006.01) |

(52) U.S. Cl.
CPC ........ *G02B 6/0095* (2013.01); *F21V 23/0471* (2013.01); *F21V 33/006* (2013.01); *G02B 6/0021* (2013.01); *G02B 6/0038* (2013.01); *G02B 6/0043* (2013.01); *G02B 6/0055* (2013.01); *H02B 1/46* (2013.01); *H03K 17/962* (2013.01); *H03K 17/9645* (2013.01); *G02B 6/0073* (2013.01)

(58) Field of Classification Search
CPC ............ G06F 3/04847; G06F 3/04886; G02B 6/0043; G02B 6/0068; G02B 6/0073; H01H 29/20
See application file for complete search history.

(56) References Cited

U.S. PATENT DOCUMENTS

| | | |
|---|---|---|
| 4,246,494 A | 1/1981 | Foreman |
| 5,248,919 A | 9/1993 | Hanna |
| 5,336,979 A | 8/1994 | Watson |

(Continued)

*Primary Examiner* — Ali Alavi

(57) ABSTRACT

Disclosed wherein is an electrical faceplate, such as a cover for a wall outlet or light switch, that uniformly illuminates by receiving light into a transparent lightguide, homogenizing the light within the lightguide and scattering the homogenized light preferentially through a front surface. In one embodiment a faceplate comprises a substrate operable to cover an interface between an electrical junction box and a wall. The faceplate further comprises a light receiving surface operable to receive light from a light generation component (e.g. an LED) and transmit the light substantially parallel to a front surface, thereby promoting reflection at the front surface that homogenizes the light intensity within the faceplate and a portion operable to scatter light through the front surface. Several embodiments provide a faceplate with a lightguide to homogenize light through a process of total internal reflection to provide uniform illumination of the faceplate.

22 Claims, 30 Drawing Sheets

(56) References Cited

U.S. PATENT DOCUMENTS

| | | |
|---|---|---|
| 7,794,130 B2 | 9/2010 | Chung |
| 7,834,856 B2 | 11/2010 | Grinsphoon |
| 8,878,882 B2 | 4/2014 | Weller |
| 9,167,666 B1 * | 10/2015 | Billheimer ......... H05B 37/0245 |
| 9,362,728 B2 | 6/2016 | Smith |
| 9,389,769 B1 * | 7/2016 | O'Keeffe .............. G06F 1/3262 |
| 9,575,587 B2 | 2/2017 | O'Keeffe |
| 2004/0189952 A1 * | 9/2004 | Kuratomi ............. G03B 21/005 |
| | | 353/31 |
| 2009/0096937 A1 | 4/2009 | Bauer |
| 2010/0045899 A1 | 2/2010 | Ockerse |
| 2010/0187023 A1 | 7/2010 | Min |
| 2011/0037728 A1 | 2/2011 | Gourley |
| 2011/0102377 A1 | 5/2011 | Liao et al. |
| 2011/0181611 A1 | 7/2011 | Zhang |
| 2011/0218650 A1 | 9/2011 | Crucs |
| 2011/0231020 A1 | 9/2011 | Ramachandran et al. |
| 2015/0181405 A1 | 6/2015 | Dua et al. |
| 2015/0301270 A1 | 10/2015 | Molard et al. |

* cited by examiner

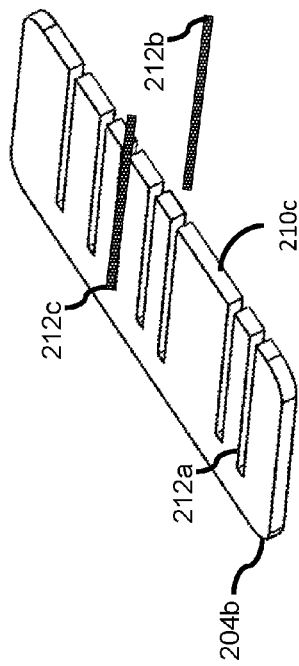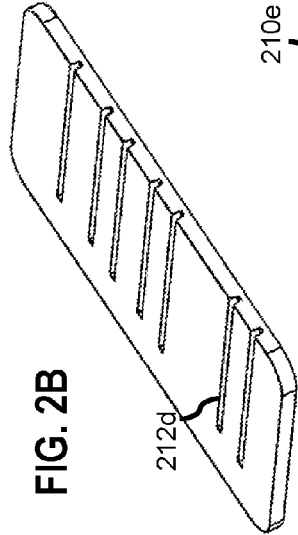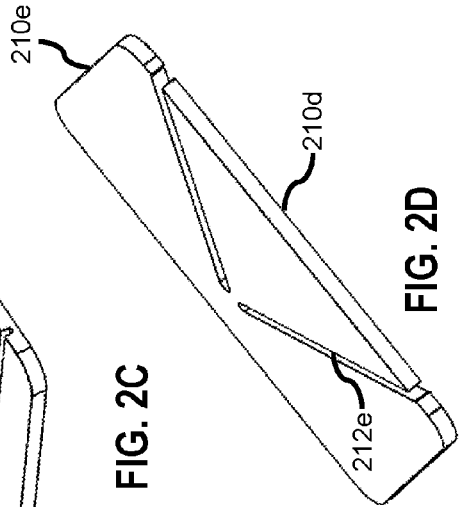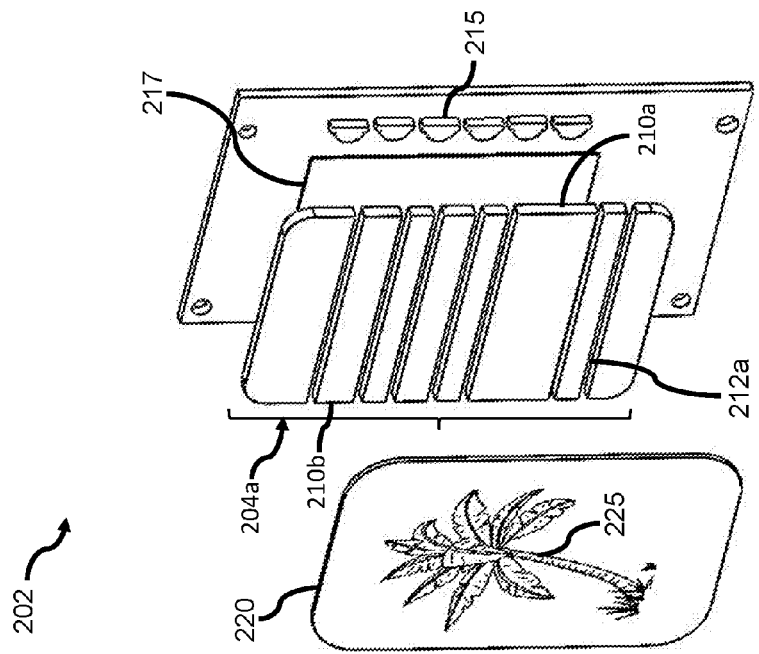

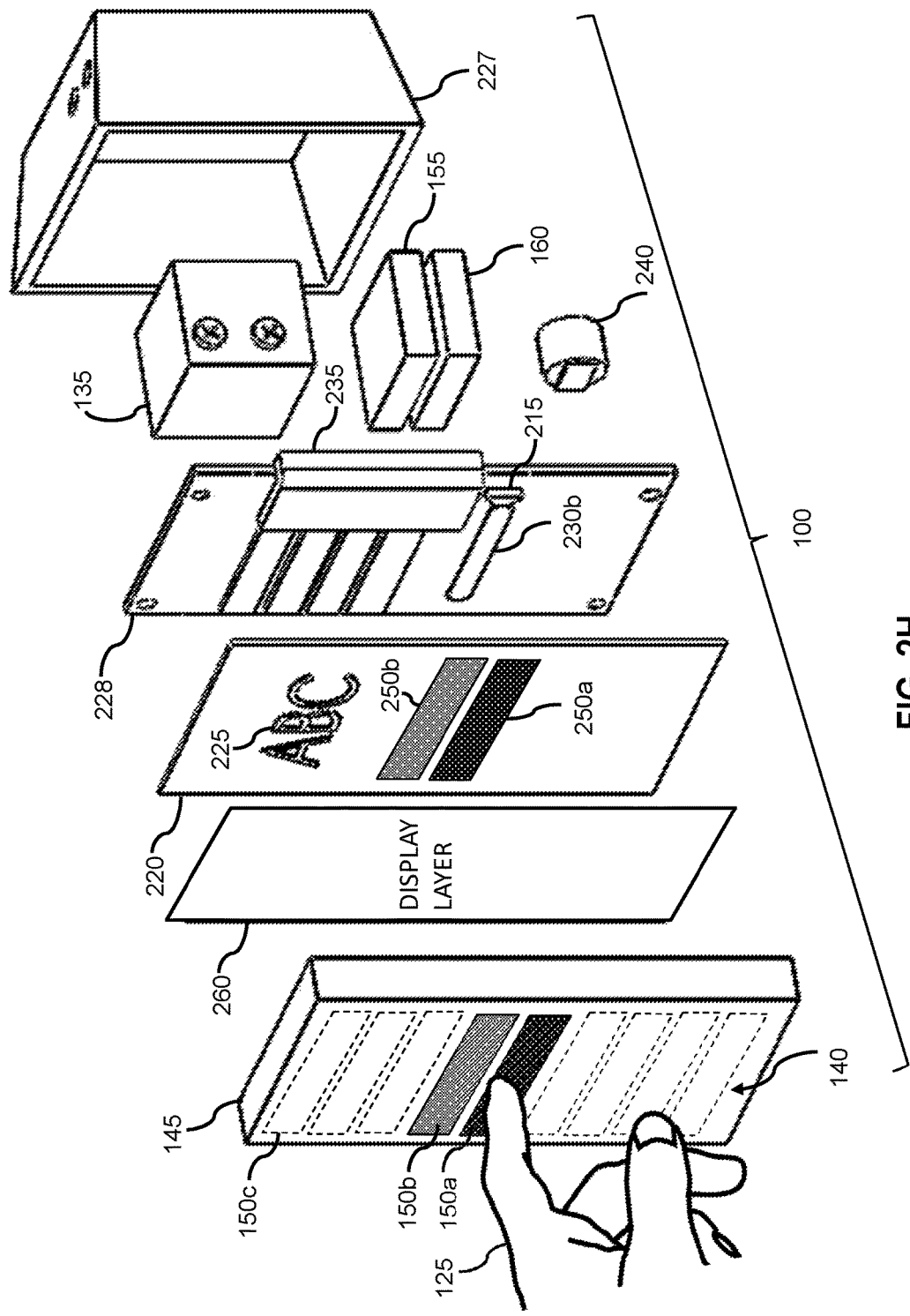

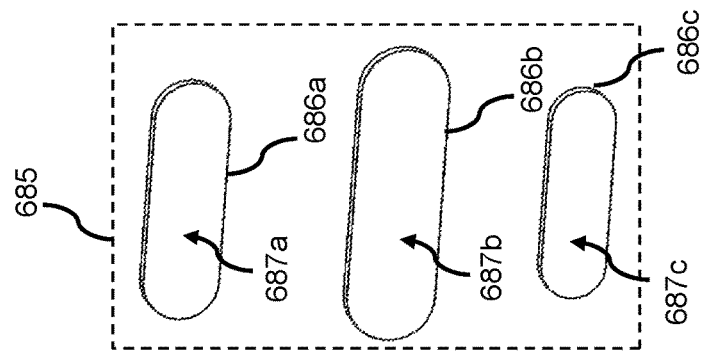
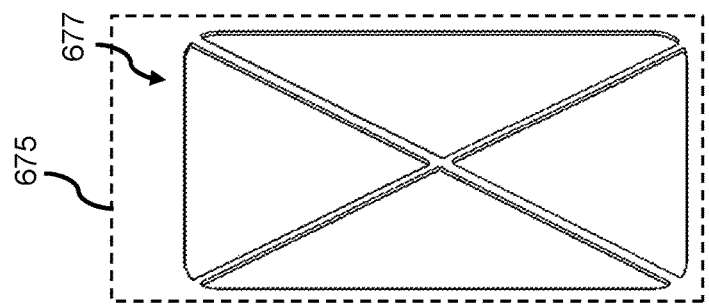
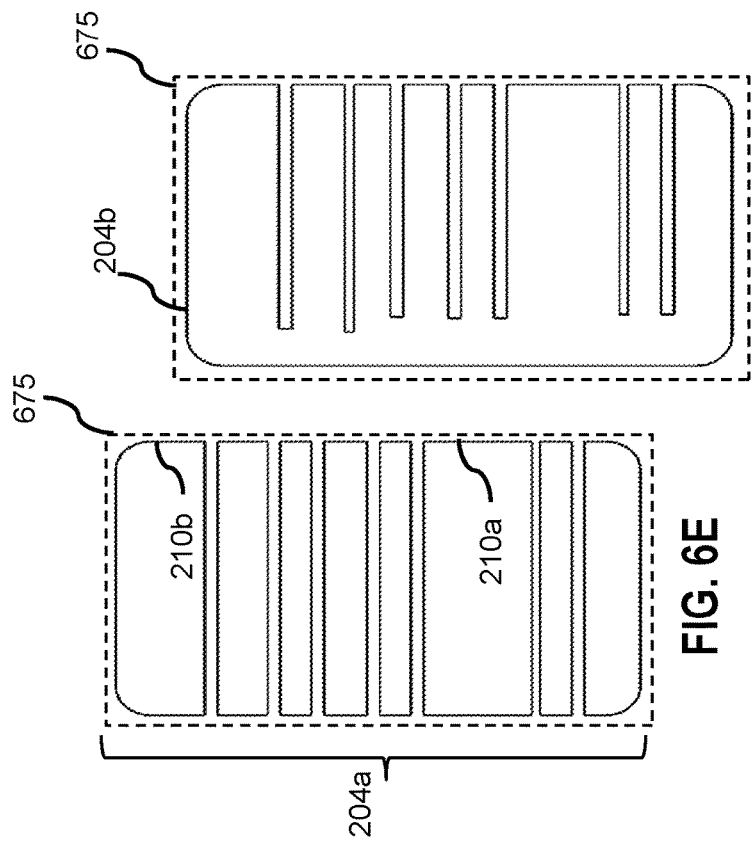

SMART ILLUMINATED ELECTRICAL FACEPLATE

CROSS-REFERENCE TO RELATED APPLICATIONS

This application is a continuation-in-part of application Ser. No. 15/170,836 filed on Jun. 1, 2016, titled "SMART ILLUMINATED ELECTRICAL SWITCH WITH TOUCH CONTROL", which is a divisional application of U.S. Pat. No. 9,389,769 filed on Jan. 18, 2016 and which claims the benefit of provisional patent application Ser. No. 62/242,158, filed on Oct. 15, 2015 and provisional patent application Ser. No. 62/191,537, filed on Jul. 13, 2015 by the present inventor. This application claims the benefit of provisional patent application Ser. No. 62/273,435, filed on Dec. 31, 2015 by the present inventor, the disclosure of which is hereby incorporated herein by reference in its entirety and for any and all purposes.

BACKGROUND OF THE INVENTION

Modern buildings include wiring to deliver electrical power to lights, outlets, and other devices. The electrical wiring often terminates inside electrical junction boxes that are covered by faceplates. With the advent of smart buildings and internet-controlled devices new functionality is being added to faceplates and inside junction boxes, such as internet-connected light switches and USB power plugs. U.S. Pat. No. 9,362,728 issued to Smith discloses a faceplate that contains LEDs to directly illuminate a surrounding area in the vicinity of the faceplate (e.g. illuminate a wall below the faceplate), but does not address how to illuminate the faceplate itself.

SUMMARY

In one embodiment a faceplate for an electrical junction box comprises a lightguide to internally reflect and homogenize incident light. The lightguide comprises a transparent substrate, a front surface sized to cover at least a portion of an electrical junction box, a light injection surface positioned to transmit light from one or more light generation components into the substrate and positioned relative to the front surface such that the transmitted light undergoes total internal reflection at the front surface thereby generating homogenized intensity light. The lightguide further comprises at least a portion of a surface that functions to scatter the homogenized intensity light from the transparent substrate through the front surface of the lightguide, thereby indirectly illuminating the faceplate. For the purposes of this disclosure the term lightguide is equivalent to terms light guide and light-guide.

In one aspect of several embodiments, an electrical switch is provided with a plurality of output power state indicator LEDs that shine parallel to the front of the light switch into a segmented light guide, rather than directly at the user. The segmented lightguide can comprise an array of segments. Light can undergo many reflections in the segments, thereby making the intensity of the light uniform. The array of segments can thereby indirectly, uniformly and dynamically illuminate wide touch areas on the touch sensitive cover of the switch. According to one embodiment, a building-based variable electrical switch (e.g., dimmer switch) provides a wide (e.g., 15 mm) touch-sensitive surface and a variable position illuminated indicator, operable to indicate the power level of the electrical switch. This embodiment enables a user to effectively drag the uniformly illuminated bar of light up and down on the front surface of the light switch and thereby control power to a load device (e.g. an incandescent light or a fan). One aspect of several embodiments is to produce elongated illuminated regions (e.g. an illuminated rectangle) on the wide touch sensitive surface, thereby providing an ergonomic and aesthetic improvement over small indicator LEDs disposed bedside dimmer control areas.

In another embodiment, a dimmer switch comprises a touch sensitive front surface and a segmented backlight. The segmented backlight comprises an array of transparent segments and an array of side illuminating LEDs. The segments are separated by separators that optically isolate individual segments. Separators can be a light blocking medium (e.g. mylar tape) between segments, or a gap between segments prevent light from travelling from one segment to another. The segments can be closely spaced in a first direction, elongated in a second direction and transmit light preferentially through a forward facing surface, towards the touch sensitive surface. Accordingly, the segments can homogenize the light intensity across the forward facing surface through a process of total internal reflection. The segmented backlight thereby enables illumination of shapes on the translucent layer with well-defined edges and uniform illumination intensity. In previous dimmer designs, LEDs shine outwards towards a user, thereby providing direct illumination. In the second embodiment the LEDs are mounted at the edge of the segment array and each LED transmits light laterally, in the elongated direction, into one of the segments. In some embodiments, the backlight can further comprise a scattering enhancing coating on a rear surface of the segments. Aspects of the present disclosure enable light to be constrained within each segment and thereby enable illumination of distinct regions of the touch sensitive front surface. In the second embodiment, the distinct regions with well-defined edges on the touch sensitive surface delineate the perimeter of touch regions on the touch sensitive surfacing which user input causes the electrical switch to operate in distinct power output states. The dimmer switch can have a translucent layer in front of the plurality of segments. The translucent layer operates to illuminate one or more distinct shapes when a segment behind the translucent layer is illuminated. The translucent layer is similar to the diffuser in a monolithic backlight in that it functions to illuminate when light from the backlight passes through it. In several embodiments, the translucent layer is modified to enhance optical isolation between neighboring segments and to customize the appearance of illuminated regions on the front cover. The translucent layer can have artwork and instruction (e.g. UP/DOWN) operable to be uniformly illuminated by one or more of the segments.

In several embodiments, a transparent cover is placed in front of the translucent layer. The thin translucent layer disposed behind a transparent switch cover minimizes the scattering of light in the cover, while the transparent layer obscures the segments and provides improved edge definition. This is in contrast to the thick translucent and opaque materials favored in previous light switch designs. In another aspect of several embodiments, the illuminated regions on the translucent layer can define the perimeter of regions on the touch surface operable to provide a particular power output state of the electrical switch. The boundaries of the touch regions can remain hidden when not illuminated and become visible upon illumination, thereby providing timely and effective indication of the bounds of a control region of a touch sensitive electrical switch.

In another embodiment of the present disclosure, a smart electrical switch can sense an aspect of a person in the vicinity of the switch and in response illuminate a region on the touch sensitive to surface to guide a user towards the touch surface or indicate a present or previous output power setting. In another embodiment a display has a touch sensitive front surface and an edge-lit segmented backlight. The segmented backlight can provide uniform illumination to the display, similar to a standard backlight. In response to direct user interaction with the touch sensitive front surface, the segmented backlight can modify the light intensity of one of more segments. In this way, the backlight can provide a touch-selected region with enhanced illumination. For example, using this embodiment, a user could touch the display of an e-Reader or tablet PC and thereby increase illumination to a segment of the backlight, highlighting a band of text on the screen with increased illumination intensity. Unlike previous technologies where this band would be provided by darkening an LCD layer in the regions of the screen outside the band the present technology enables a user to select a region to receive high illumination intensity. The highlighted portion of the display can further indicate the bounds of a region of the touch surface operable to highlight that portion. This could be useful for power savings and reading portions of a screen without casting excess additional light from the backlight.

ADVANTAGES

The faceplate with lightguide capability described herein is operable to provide the following exemplary advantages: Detailed artwork features can be etched, or adhered to the faceplate and illuminated simultaneously with varying intensities, providing a complex and decorative visual effect. Features etched or adhere to a switch cover or electrical faceplate can illuminate with high contrast relative to smooth surrounding areas. Therefore, the faceplate can provide accent lighting for artwork or instructions behind the switch cover without causing significant light pollution in the vicinity of an electrical junction box.

The disclosed embodiments enable users to change the switch cover or faceplate and associated etched or adhered designs while retaining common electrical components (e.g. light switches and electrical outlets), thereby providing cost effective customization of the electrical switch. Artwork on a faceplate for switch cover can be created by laser or machine etching processes. Such engraving processes are highly automated and thereby enable users to supply personalized designs to be engraved on a switch cover. Light scattering from the deposited or inscribed features produces illuminated areas much smaller than would be possible if the light were produced directly from a user facing LED or illumination component. The intensity of scattered light can be controlled by changing aspects of the engraving such as surface roughness or depth of inscription. Therefore a variety of light intensities can be produced on the switch cover, providing depth and shading to the illuminated features. Using a variety of modern laser inscribing processes a wide variety of designs can be rapidly deposited onto standard faceplate shapes. Unlike previous illuminated faceplates whereby the illumination elements are designed to shine outward at the user or downward at a region below the faceplate (e.g. the SnapPower GuideLight available from SnapPower of Vineyard Utah), the present design projects light into a faceplate or switch cover. By illuminating features with scattered light the contrast of the feature on the background is improved. This enables the feature to remain substantially hidden and blend in with the background until light is introduced into the switch cover. The edge illumination and lightguide aspect of the disclosed faceplate designs trap the majority of the light within the faceplate or switch cover and therefore enable illumination of the features with less light projected into the surrounding room and is thereby less likely to distract a user provide unwanted illumination. In contrast, a typical LED-enabled electrical switch is designed to project the light directly into the vicinity of the user.

The touch sensitive illuminated light switch provides the following exemplary advantages: Light manipulating components (e.g. segmented backlight, translucent layer and switch cover) enable distinct uniform illumination of regions of the touch sensitive surface with enhanced perimeter definition between illuminated and non-illuminated regions. For example, the combination of the thin translucent layer and translucent switch cover diffuse the light from the segmented backlight far less than a traditional translucent polymer switch cover.

In another advantage, the well-defined perimeter of the illuminated regions are useful to delineate the boundaries of touch regions operable to achieve specific switch states. This is in contrast to previous designs where LEDs provide spots of light with indistinct boundaries. In an additional advantage the illuminated electrical switch can indicate the position of a dimmer switch without moving parts. This is particularly useful for wireless and internet connected dimmers whereby a remote signal can change the operating point of the dimmer. A remotely controlled dimmer is difficult to implement with a mechanical indicator (e.g. a control knob or slider) and an illuminated indication of state is easier to remotely actuate.

In another advantage, the illumination functionality and touch sensitive functionality are combined in distinct regions of the touch sensitive surface. This eliminated the need for the user to extrapolate the location of a control surface relative to an indicator light elsewhere on the switch cover. In another advantage, illuminated regions of the touch sensitive surface can be elongated and indicate the operating state of a dimmer switch at greater distances. For example, a wide illuminated segment could guide a user directly to the touch sensitive control surface of the electrical switch in a dark room. In a related advantage several embodiments provide for a touch sensitive surface illuminated by indirect illumination instead of direct illumination. The indirect illumination reduces the glare and light pollution often associated with strong LED light and thereby enables a user to better distinguish the operating position of the load control device. For the purpose of this disclosure an indirect illumination component shines light primarily in a lateral direction to the touch sensitive surface. Indirect illumination refers to illumination of the touch sensitive surface based on light reflected within the backlight and subsequently transmitted from the forward facing surface of the backlight. One example of an indirect illumination component is a right-angle mounted LED shining light parallel to the touch sensitive surface. For the purposes of this disclosure, direct illumination refers to light shining directly from the illumination component through the touch sensitive surface. A direct illumination component is a lighting component designed to shine light normal to the touch sensitive surface (e.g. a surface mounted LED shining upwards) for example, the LEDs in a LED flash lamp are direct light generation components.

In another advantage, the disclosed load control device can provide significantly larger uniformly illuminated regions on the touch sensitive surface relative to previously disclosed illuminated dimmers. In a related advantage, the disclosed load control device provides improved uniformity of illumination regions, relative to direct illumination. The enhanced uniformity is due in part to the segments which can internally reflect the light from light generation components many times. The uniform illumination can have substantially lower peak intensity relative to a direct LED light and can therefore produce a more pleasant illumination experience for a user. Hence the disclosed design can be used to cast considerable light in the vicinity of the switch by spreading the total light flux over a wider area. The large indirect illuminated regions can cast a gentler light than one or more direct LED point sources.

Aspects of this disclosure improve the contrast between illuminated and un-illuminated regions of the touch sensitive surface. Several aspects of this disclosure enhance optical isolation between neighboring segments in the segmented backlight. Consequently segments can be places close together and provide a more aesthetically pleasing appearance (e.g. a uniform column comprised of closely spaced illuminated segments or an illuminated slider).

In some embodiments the illuminated slider can gently illuminate adjacent segments and thereby indicate to a user that the dimmer switch is not in the FULL-ON or FULL-OFF position and that additional levels are available. People can often operate dimmer switches in a suboptimal setting because the switch does not effectively indicate the availability of higher or lower settings. For example a dimmer switch with an operating point less than the FULL-ON operating point can indicate the availability of additional higher power operating points by illuminating a segment above the primarily illuminated segment. This secondary illumination can be at a lower intensity. For example, aspects of this disclosure enable a person to view an illuminated dimmer switch across a room and discern that additional higher power states are available.

This disclosure is particularly useful for providing illuminated segments of the slider with distinct shapes (e.g. uniformly illuminated rectangles). The shape of individual illuminated segments can be varied and is useful to indicate the present operating point to a user. For example, the illuminated slider can comprise a column of elongated illuminated rectangular segments. The width of the rectangular segments can increase progressively in order to indicate higher power operating points of the dimmer switch.

In another advantage, the translucent layer can enable users to express their aesthetic preferences with artwork. Aspects of this disclosure enable the translucent layer and artwork to be uniformly illuminated by segments. Artwork on a translucent layer enables aspects of the load controlled by the switch (e.g. location, purpose) to be announced or described to users. Several embodiment of this disclosure provide for light transmitted from a segmented backlight to generate distinct illuminated regions on a translucent layer with enhanced clarity relative to opaque polymer switch covers. Similarly, the transparent switch cover in several embodiments provides improved sensing of the surrounding environment for sensors such as light level, infrared and motion sensors. For example, the transparent switch cover can be particularly useful to enable a light level sensor to sense transient variations in light that can be associated with a person moving nearby.

In yet another advantage, several embodiments enable a lower profile touch sensitive switch by moving the disposed position of the illumination elements from behind the segment array to beside the segment array. In this manner, the segment array can be in close contact with underlying electrodes while light generation components can be mounted on the same substrate as the touch electrodes and can transmit light into the segments of a segmented backlight from the side. In yet another advantage, several embodiments of this disclosure enable closely spaced illuminated elements on a touch surface to have distinct perimeters, defined by different intensities in optically isolated segments of a segmented backlight. Some embodiments of this disclosure can provide a touch sensitive display (e.g. an LCD display on an eReader or Tablet PC) with a side-illuminated segmented backlight.

DRAWINGS

FIGS. 2A, 2B, 2C and 2D are exploded views of various components of a segmented backlight.

FIGS. 2E, 2F, 2G and 2H are exploded views of a dimmer switch with illuminated touch controls in accordance with an embodiment of this disclosure.

FIGS. 6E, 6F, 6G and 6H show exemplary lightguides in accordance with an embodiment of the present disclosure.

DETAILED DESCRIPTION

Figure 1:
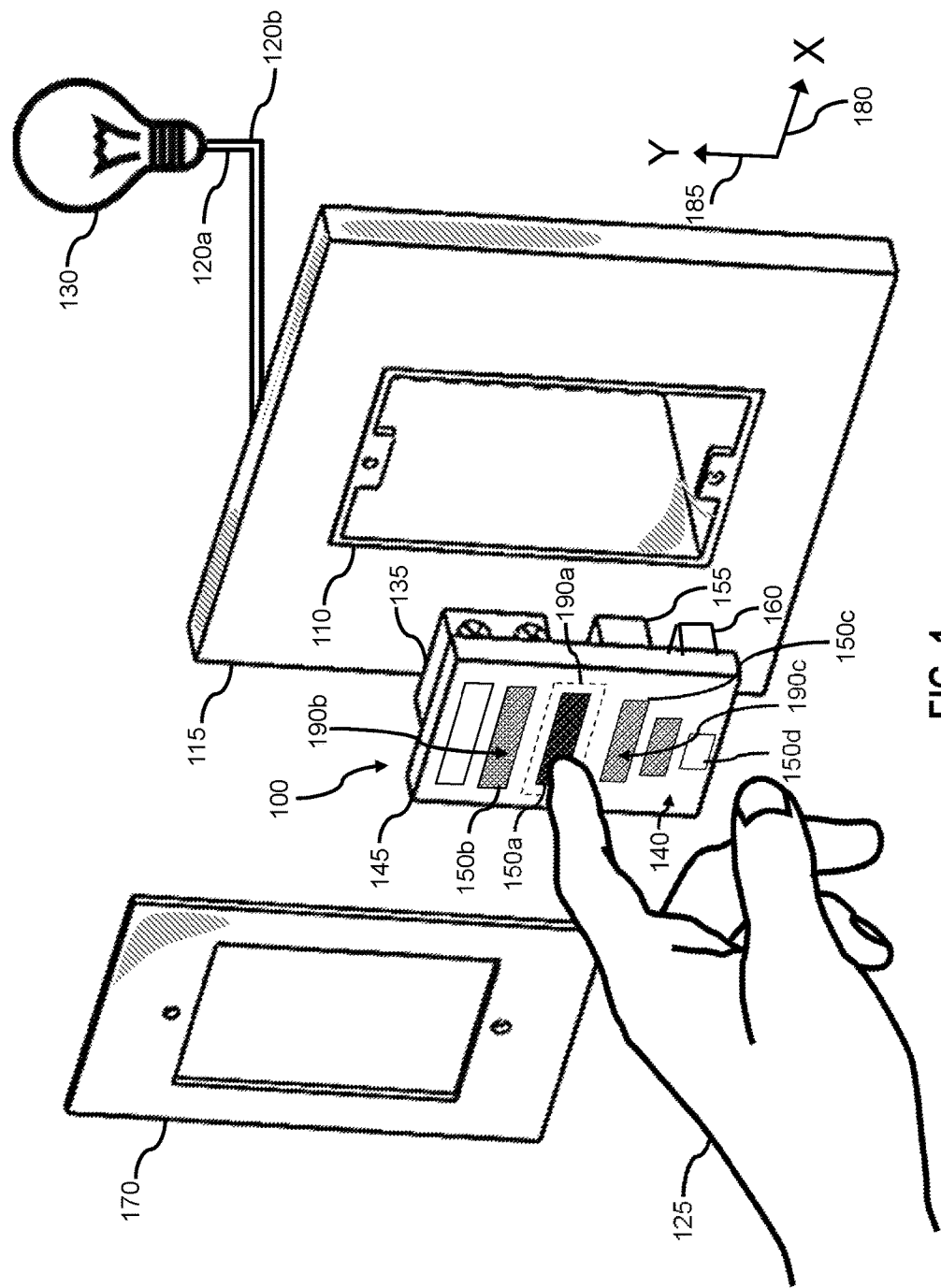
FIG. 1 is front view of a dimmer switch with illuminated touch controls, operable to reside in a wall mounted electrical junction box in accordance with one embodiment of the present disclosure.

In the following detailed description, for purposes of explanation, numerous specific details are set forth to provide a thorough understanding of the various implementations of the present invention. Those of ordinary skill in the art will realize that these various implementations of the present invention are illustrative only and are not intended to be limiting in any way. Other implementations of the present invention will readily suggest themselves to such skilled persons having the benefit of this disclosure.

In addition, for clarity purposes, not all of the routine features of the implementations described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure. For example, of routine features include surge suppression circuitry, fuse circuitry, signal multiplexing circuitry, and switch mounting hardware, including mounting plates and screws.

It is to be appreciated that while one or more implementations are described further herein in the context of a typical building based load control device such as those used in a residential home, the scope of the present teachings is not so limited. More generally, illuminated touch sensitive load control devices according to one or more of the preferred implementations are applicable for a wide variety of buildings, without limitation, duplexes, townhomes, multi-unit apartment buildings, hotels, retail stores, office buildings and industrial buildings. Further, it can be appreciated that an illuminated touch-sensitive variable load control device according to the implementations disclosed could be implemented in a variety of vehicles and electrical equipment, including ships, airplane, motor and fan controllers. Further, it is to be appreciated that while the terms user, customer, installer, homeowner, occupant, guest, tenant, landlord, repair person, and the like may be used to refer to the person or persons who are interacting with the touch sensitive variable load control device or other device or user interface in the context of one or more scenarios described herein, these references are by no means to be considered as limiting the scope of the present teachings with respect to the person or persons who are performing such actions. It is to be appreciated that while the illuminated electrical load control device described in this disclosure is also called a dimmer switch and that such load control devices are operable to control power to a wide variety of loads, including lighting, motors and ceiling fans.

FIG. 1 is front view of an electrical switch 100 with illuminated touch controls, operable to reside in a wall mounted electrical junction box 110 in accordance with one embodiment of the present disclosure. In the embodiment of FIG. 1 electrical switch 100 is a variable load control device (e.g., a dimmer switch). Variable load control devices can operate in a variety of output power states and thereby supply a variable amount of power to an electrical load (e.g. light bulb 130). In the embodiment of FIG. 1, electrical switch 100 is operable to be connected to wires 120a and 120b. Wires 120a and 120b can function to transfer power to a light bulb 130. For example, electrical switch 100 can contain load control component such as a triac that can vary the amount of time (e.g. duty cycle) during each cycle of an alternating voltage supply that the load (e.g. bulb 130) is connected to the voltage supply (e.g. 110 Vac). Examples of power output states of a dimmer switch include ON, whereby the dimmer switch connects the bulb 130 to a building based AC voltage source all the time and provides full power, OFF whereby the dimmer switch disconnects the bulb from the voltage source and 50% duty cycle whereby the dimmer switch connects the bulb to the load for 50% of the time or provides 50% of the maximum power to the bulb.

Electrical junction box 110 is attached to a wall 115 and functions to house the dimmer switch 100. Dimmer switch 100 may be sized to fit in an electrical junction box 110 of a particular size. For example the single-bay junction box illustrated in FIG. 1 is approximately 3 inches wide and can accommodate one standard dimmer switch. The exemplary dimmer switch 100 in FIG. 1 is approximately 2 inches wide and 4 inches high and is designed to fit inside the majority of single-bay electrical junction boxes. Other embodiments of the illuminated dimmer switch 100 can be disposed in a junction box attached to the outside of a wall, as is common on ships and warehouses.

Dimmer switch 100 contains a switch cover 145. Switch cover 145 can occupy the space typically occupied by the paddle, knob or lever in a traditional electrical switch. Unlike mechanical dimmers, the switch cover 145 need not have any moving parts. Switch cover 145 can perform three main functions, firstly to provide a component for the user to interact with and actuate the dimmer. To accomplish this purpose the switch cover has at least one touch-sensitive surface. Secondly, the switch cover 145 can provide electrical isolation from high voltages (e.g. 110 Vac) disposed within the electrical junction box 110. Switch cover 145 can be the size of a standard light switch, thereby enabling a standard faceplate 170 to cover the gap between the dimmer switch and the wall 115. In some embodiments the shape of switch cover 145 can correspond to a standard large decorative light switch, sometimes referred to as Decora® switches. In other embodiments the switch cover can combine the function of the user input surface and the faceplate 170 into a single component. Thirdly, the switch cover 145 can be designed to transmit light from a segmented backlight (not pictured in FIG. 1), thereby enabling the illumination of large distinct regions of the front of the switch cover 145, wherein the regions have substantially well-defined perimeters. Switch cover 145 can be a transparent or translucent material (e.g. plastic or glass). Switch cover 145 can comprise an opaque polymer with a transparent or translucent center section, thereby reducing the diffusion of light from illumination sources inside the switch. In several embodiments the switch cover 145 can be the transparent front cover of a graphical display (e.g., an LCD screen, OLED or LED display). An objective of several embodiments of the switch cover is to minimize the diffusion of light generated by a segmented backlight behind the switch cover 145 and similarly to minimize diffusion of light from distinct boundaries (e.g. at mask interfaces or the edge of segments) generated within the electrical switch.

Switch cover 145 contains a touch sensitive surface 140 operable to register direct user interaction (e.g. touching, pressing, and tapping). A second function of touch sensitive surface is to transmit light from illuminated regions on or behind the touch sensitive surface. A user can interact with the touch sensitive surface in several ways including touching, pressing (e.g. generating pressure at points on the surface), tapping (e.g. transmitting vibration) or modulating a signal transmitted from behind the touch sensitive surface 140 (e.g. an ultrasonic or infrared signal). For the purposes of this disclosure the switch cover 145 is considered to be solid-state and does not require large mechanical movements in the process of a user interacting with the touch sensitive surface. For example a momentary switch, toggle switch or dome switch would require large mechanical movement (e.g. 1 mm) in the process of user interaction. While a touch sensitive surface 140 and the switch cover 145 can experience small movements such as vibration and experience a pressure (e.g. a mechanical load) it does not rely on large mechanical movement of the touch sensitive surface 140.

Touch sensitive surface 140 contains a plurality of closely spaced touch regions (e.g. 150a, 150b, 150c and 150d) and illuminated regions (e.g. 190a, 190b and 190c). Direct user interaction (e.g. touching or pressing) in a touch region (e.g. 150a) can be sensed by a plurality of sensors (not shown in FIG. 1), disposed behind the switch cover. Each touch region encompasses a set of locations on the touch sensitive surface in which direct user interaction generates a common pattern of illuminated regions 190. Similarly each touch region encompasses a set of locations on the touch sensitive surface in which direct user interaction causes a common subset of segments of the segmented backlight to illuminate. The subset can contain a single segment that consistently illuminates when any point in the touch region is touched. The subset of segments can be a plurality of segments such as unique pattern of 3 neighboring segments that illuminate when a touch region encompassed by the vertically highest segment is touched. In this way the dimmer switch can generate a unique subset of illuminated segments forming a slider (i.e. single segment) or a column (i.e. multiple stacked segments) in response to direct user interaction in a touch region, wherein the touch region comprises a set of points operable to cause the subset of segments to illuminate. For example, in one aspect of the embodiment of FIG. 1 direct user interaction with any point in touch region 150a causes a corresponding illumination region 190a to illuminate. In one aspect the embodiment of FIG. 1 can only delineate the bounds of illumination region 190a or 150a when the user interacts with touch region 150a. Permanently delineating the bounds of all touch regions could be confusing to a user. Instead this disclosure enables the bounds of a touch region (e.g. 150a) to be dynamically delineated by an illumination region (e.g. 190a). In the embodiment of FIG. 1 illuminated region 190a encompasses touch region 150a. Several aspects of this disclosure provide for generating illuminated regions 190 with uniform illumination intensity across the area of the region, with large aspect ratios and well-defined perimeters. In several embodiments the well-defined perimeter of an illuminated region can define the perimeter of a touch region. While not a preferred embodiment, the touch region can extend beyond the illuminated region.

A touch processor 155 can receives signals from the touch electrodes and operates a load control component 160 (e.g. a triac) to modulate the power to load device (e.g. bulb 130). In FIG. 1 the touch regions (e.g. 150a and 150b) are also stacked in a first direction 185 (e.g. the Y direction in FIG. 1). The touch regions are elongated in a second direction 180 (e.g. the X direction of FIG. 1). In response to a person 125 touching touch region 150a, a corresponding illumination region 190a is illuminates with a primary intensity. Region 150a can extend beyond the width of a typical finger (e.g. 15 mm). In one aspect, the present disclosure provides means to uniformly illuminate such elongated shapes, thereby providing for wider touch regions (e.g. 150a). When the user 125 sliders their finger up or down on touch sensitive surface 140 an illuminated region (e.g., 190a) can be selected by processor 155 to best match the location of their finger.

In FIG. 1 touch regions 150b and 150c are illuminated at a secondary intensity. Touch regions 150b and 150c are encompassed by corresponding illumination regions 190b and 190c. In this embodiment the illumination regions 190b and 190c are sized to encompass the perimeter of touch regions 150b and 150c. The secondary intensity can be less than the primary intensity and can indicate the availability of higher or lower power operating states of the illuminated load control device. In addition to illustrating availability of neighboring power states, illuminated regions 190b and 190c can also visually illustrate the bounds of touch regions 150b and 150c operable to achieve these power states. Region 150d can be elongated in the second direction 180 and can be shorter than regions 150a, 150b and 150c, thereby indicating a lower power state. Touch regions can be closely spaced and in some embodiments adjoining one another. In this way a user can slide their finger up and down on the touch sensitive surface and achieve an experience similar to a mechanical slider, wherein the illuminated indicator is a narrow bar of light projecting laterally beyond their finger and operable to be dragged up and down on the touch sensitive surface. The touch regions could be elongated in horizontal X direction 180, thereby providing invariance to unintended lateral position variation of the user's finger. Faceplate 170 can surround dimmer switch 100 in the installed position.

Segmented Backlight

FIG. 2A-D illustrate components of an edge-lit segmented backlight 202. Several embodiments of dimmer switch 100 contain a segmented backlight 202 while other embodiments contain several components of a segmented backlight. The segmented backlight 202 can be similar in function to a standard backlight (e.g. in an LCD display) providing uniform illumination for one or more surfaces in front of the backlight. In the context of this disclosure the segmented backlight functions to indirectly light illumination regions 190 on the touch sensitive surface 140, with uniform intensity. The segmented backlight in FIG. 2A comprises a lightguide 204 with a plurality of segments 210, a plurality of separators between the segments, a plurality of illumination components 215 (e.g. LEDs), a rear scattering enhancer 217 and a translucent later 220 with artwork 225.

Several varieties of segmented backlight have been previously disclosed in the context of displays (for example, United States Publication Application No. US 2009/0096937 A1 and United States Publication Application No. US 2010/0045899 A1). Such segmented backlights typically refer to a backlight with a single-segment monolithic lightguide and a segmented array of rear mounted LEDs to selectively illuminate regions of the backlight. The embodiments of the present disclosure relate to a segmented lightguide with separators (e.g. gaps or opaque materials) between segments in the lightguide, thereby enhancing optical isolation. Furthermore, several embodiments of the present disclosure refer edge-lit segmented backlights, wherein the segmented are illuminated from one side of the segments. A subset of edge-lit segmented backlights side illuminated segmented backlights, wherein light is transmitted from LEDs parallel to the touch sensitive surface and is transformed into indirect light transmitted perpendicular to the touch sensitive surface by the segmented backlight. U.S. Pat. No. 8,878,882 B2 discloses an edge-lit segmented backlight but does not address dynamic control of illuminated segments or control of electrical switches.

Referring to FIG. 2A the segmented backlight can contain a lightguide (e.g. 204a) Lightguide 204a comprises a plurality of segments (e.g., 210a and 210b), with at least one surface from each segment occupying a common two-dimensional plane. The primary function of the lightguide is to homogenize light from light generation components and transmit the light through a front surface (e.g. surface 222). Lightguide 204a can comprise a transparent material such as a polymer or glass. Lightguides are somewhat related to light pipes but the purpose of pipes is to transport light from an injection point to an endpoint that is often the same size or smaller than the injection point. In contrast the primary purpose of the lightguide in the segmented backlight is to homogenize light introduced at one or more surfaces and generate uniform intensity light through the forward facing surface of each segment.

The lightguide can comprise a plurality of fully separated segments e.g. lightguide 204a in with separated segments 210a and 210b. FIG. 2B illustrates a joined lightguide 204b comprising a single piece of material and partially joined segments (e.g. 210c). A joined lightguide can still provide segments with considerable optical isolation, particularly when the segments are joined at some distance from the point of light transmission into the segment. In some embodiment of the segmented backlight 202, the outer perimeter of the lightguide forms a regular four sided shape (e.g. a square, rectangle, rectangle with rounded corners or chamfered corners). This can enable the segmented backlight to illuminate a simple shape when all segments are illuminated.

The lightguide 204 can comprise a plurality of segments 210 wherein at least one surface from each segment is disposed on a common plane. In some embodiments the plurality of segments are elongated such as 210a and 210b. In one aspect, each segment can function as an independent lightguide for one or more light generation components 215. Specifically, a segment can function to take light from one or more point illumination sources 215 (e.g. LEDs or bulbs) and constrain the light within the segment by reflecting the light from at least one surface back into the body of the segment and thereby transform the direct light from the light generation component into indirect light with uniform intensity transmitted through the forward facing surface 222 of the segment. This process is known as total internal reflection and is made possible in part by the difference in the index of refraction between the surfaces of the segment and the surrounding material (e.g., the surrounding air). In the embodiment of FIG. 2A each segment can change the primary direction of light from parallel to the switch cover 145 at a light receiving surface to a direction perpendicular to the switch cover. Segments can further function to transmit light preferentially through the forward facing surface 222. In the context of this disclosure light intensity is the rate at which light energy is delivered through a unit area of a surface. For example light intensity can be measured in Watts per square meter. In the context of the disclosure uniform light intensity through the forward facing surface of a segment refers to all points on the forward facing surface experiencing a substantially similar spectrum of light passing through the points, with a substantially similar intensity. While a segment can substantially homogenize light intensity small variations in intensity can persist due in part to fact that light is introduced at a location from a single light generation component or multiple discrete locations in the segment by multiple light generation components. A segment can be considered to produce substantially uniform illumination intensity through a surface (e.g. the front surface) if, for all points P on a straight line segments extending from the point of highest intensity (I_max) on the surface to the point of lowest intensity on the surface the intensity at the point P is greater than $I\_max/4\pi R^2$ wherein R is the distance from the point of maximum intensity to the point P and $\pi$ is 3.14159. Therefore a segment can be considered to produce substantially uniform illumination intensity through a the forward facing surface 222 if the segment produces substantially lower spatial variation of light intensity across the surface than would occur for a similarly illuminated equivalent planar surface in free space if it were illuminated in a similar manner and the segment was not present.

FIG. 2A illustrates that segments can be closely spaced in a first direction (e.g. the Y direction) and elongated in a second direction (e.g. the X direction). Segments can have sharp distinct right-angle edges thereby generating a well-defined illuminated shape in the plane of the forward facing surface 222. Upon transmission of light from a light generation component the forward facing surface 222 can thereby generate high contrast regions of irradiance in the shape of the front surface 222. In the embodiment of FIG. 2A light generation components 215 transmit light into the segments along the elongated axis 180 (e.g. X axis) of the segments. In this case segments further function to accept light in a direction parallel to the touch sensitive surface and bend the light, through multiple reflections, such that light is transmitted towards the user facing surface 222. Segments 210 can be made from a transparent or semitransparent material (e.g., acrylic or polycarbonate, glass or crystal).

The segmented backlight contains one or more separators 212. Separators function to optically isolate segments 210 from one another. A separator can be as simple as an airgap separating two smooth surfaces of opposing segments. Separators enable neighboring segments to transmit light with distinct intensities. Referring to FIG. 2B. Segments can be airgaps e.g. 212a or can be non-light transmitting materials or coatings such as 212b and 212c. The optical isolating properties of the separators can be improved with a variety of reflective or opaque coatings. Reflective coatings (e.g. silver or chrome) and opaque coatings (e.g. enamel, metals or opaque plastic) are examples of separators effective at providing optical isolation between segments of the light guide. In some embodiments the separators can be joined to form one or more groups of separators designed to interdigitate with the lightguide.

Regarding to FIG. 2C in some embodiments the separator can be grooves or channels in the light guide such as 212d. The grooves can extend partially through the thickness of the light guide. The surface of the grooves can be smooth or polished thereby promoting internal reflection of light from a neighboring segment back into that segment. This process of internal reflection of light at a smooth surface is often referred to as total internal reflection and is the basis for constraining light in fiber optic cables and light guides. The gap between adjacent segments in the first direction 185 can be small (e.g. less than 3 mm). In some embodiments the separation between segments can be very small and provide enough space for a thin non-light-transmitting layer to be painted, adhered or printed to one or more opposing surfaces of neighboring segments, thereby substantially blocking light from travelling between neighboring segments.

The segmented backlight can contain a plurality of light generation components 215. Each light generation component 215 transmits light into one segment 210 in the lightguide. Light generation components 215 can be light emitting diodes (LEDs), electroluminescent regions, fluorescent lights or incandescent lights. In many backlights the illumination components are LEDs. Illumination components can be located at one side of the lightguide. The LEDs can be within the perimeter of the light guide and still be located at one side of the lightguide. For example the LEDS can be located recesses within the lightguide and can shine parallel or perpendicular to the touch sensitive surface. A backlight wherein the illumination component are at one side of the backlight is referred to as a side-illuminated segmented backlight. The light generation components of FIG. 2A transmit light in a primary direction parallel to the touch sensitive surface. An example of such illumination components are right-angle surface mounted LEDs such as LTW-006DCG-E2 from Lite-On. Inc. of Milpitas Calif. In the embodiment of FIG. 2A light generation components 215 transmit into lightguide 204 through an edge of the segment. More specifically, light is transmitted at one edge of the segment through a surface that is more perpendicular than parallel to the forward facing surface 222 of the segments. In this case the backlight is referred to as an edge-lit side-illuminated segmented backlight. Finally in the context of this disclosure direct light is light that travels directly from the light generation source (e.g. LED) through the touch sensitive surface without undergoing reflection. Direct light can undergo refraction which is bending of light at a surface (such as a frosted diffuser). In contrast indirect light in the context of this disclosure is light that has undergone at least one reflection within the light guide (i.e. at least one change of direction that maintained light within the lightguide) Lightguides operate largely on the basis of total internal reflection and scattering. The segmented backlight can include a scattering enhancer 217. The scattering enhancer functions to scatter light incident on the rear surface of the segmented backlight towards the front surface 222. The scattering enhancer can be a reflective material behind the rear surface of the lightguide or can be a surface treatment such roughening the rear surface of the backlight segments in order to promote scattering of light incident on the rear surface through the forward facing surface 222, thereby increasing the light intensity. One effective scattering enhancer is a white layer adheres to the rear surface of the segments. Another effective scattering enhancer is a matrix of dimples (e.g. molded dots) on the rear surface that promote scattering of light through the front surface of the segment.

Translucent Layer

In FIG. 2A a translucent layer 220 is placed between the segments (e.g. 210a) and the front cover. Translucent layer 220 can be a thin polymer, paper or other translucent material (e.g. 2-4 mil polyester). One function of the translucent layer is to provide a surface to illuminate in embodiments where the lightguide is transparent and the switch cover is transparent. The transparent layer can be thick and structural, or can be thin and operable illuminate while absorbing as little light as possible, and thereby providing illuminated regions with sharper boundaries. When a translucent layer 220 and a transparent switch cover 145 are combined the two components work to obscure the unilluminated segmented backlight, while clearly delineate the edges of an illuminated segment. This in turn enables the perimeter of closely spaced touch regions on the touch sensitive surface 140 to be distinctly illuminated.

The translucent layer can contain detailed artwork 225 that can be uniformly illuminated when one or more segments are illuminated. Artwork can be printed on a thin translucent layer using a variety of standard printing processes such as inkjet printing. In previous switch designs with opaque switch covers such artwork would have to reside on the outside of the opaque cover to be effectively observed. In several embodiments of the present design the artwork can reside behind a protective transparent switch cover. The translucent layer can be placed close to or in contact with the front surface of the segments 222. In this way light from a segment is not diffused before illuminating a portion of the translucent layer, thereby maintaining the well-defined illumination boundary between segments with different intensities. Referring to FIG. 2D in other embodiments the light guide segments can have more complex shapes such as 210b and 210c.

Figure 2E:
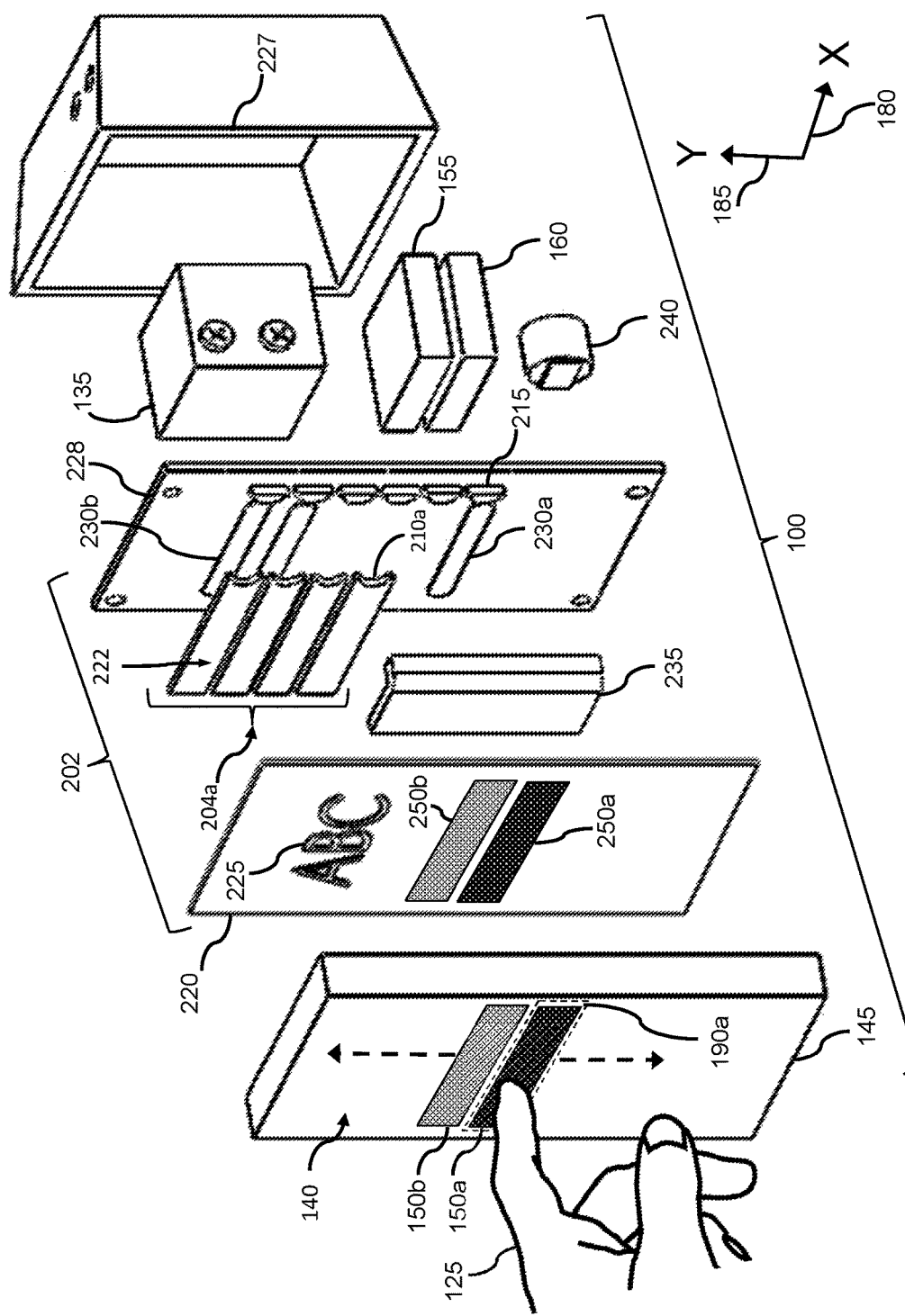

FIG. 2E, illustrates how a segmented light guide and touch sensitive surface can be used to implement a dimmer switch with a touch sensitive distinctly illuminated control feature. The dimmer switch 100 contains a housing 227. Housing 227 can be a polymer housing that functions to protect sensitive electronics in the dimmer switch. Housing 227 can be sized to fit in a standard size of electrical junction box (e.g. a 1-bay junction box or a 2-bay junction box). Dimmer switch 100 can contain one or more electronic substrates 228. Electronic substrate 228 can be a rigid or flexible circuit board and can contain a large number of electrical conductors operable to carry electrical signals.

Dimmer switch 100 contains a plurality of direct input sensors (e.g., 230a and 230b). In the embodiment of FIG. 2E direct input sensors are illustrated as capacitive touch electrodes. In one aspect of several embodiments, direct input sensors are positioned behind the light guide 204 and receive touch indications through the plurality of segments. In this embodiment the shape of touch region (e.g. 150a) can be determined by the shape of the segment behind the touch region. At the same time the shape of a corresponding illuminated region (e.g. 190a in FIG. 1) can be simultaneously determined by the shape of the segment. Direct input sensors (e.g. 230a) can operate to sense direct user interaction with regions (e.g. 150a) of the touch-sensitive user surface 140. Direct input sensors can use one or more technologies, to sense a touch or other direct user interaction with touch sensitive surface 140. These technologies can include pressure sensing, light level sensing (e.g. sensing when a finger block a light sensor), resistive touch sensing, surface acoustic wave touch sensing or capacitance touch sensing (e.g. changes in the rate at which an electrode rises to a threshold voltage when a rapid voltage change is applied). Direct input sensors can sense aspects of reflected signal transmitted from a direct input sensor or from another component in the load control device (e.g. modulating the time of flight or intensity of a reflected infrared signal from an infrared transceiver such as those found on automatic faucets). In surface acoustic touch sensing a surface acoustic wave is generated on the front surface of the faceplate by one or more transmitters. Aspects of the reflected signals (e.g. arrival time and intensity) are used to sense a user touching the faceplate surface.

Direct user input sensors 230a can be solid state, such that they have no moving parts. Examples of solid state direct input sensors include capacitive electrodes, optical receivers or transceivers, infrared receivers or transceivers, pressure sensors. In some embodiments direct user input sensors can have moving parts, for example micromachined MEMs accelerometers or vibration sensors, even though the touch sensitive surface may not execute large motions (e.g. greater than 1 mm)

A touch region is an area of the touch surface defined by a set of locations wherein direct user interaction causes the touch electrodes to generate a pattern of touch signals wherein the pattern of touch signals causes a particular subset of segments of the segmented backlight to be illuminated. In several embodiments direct user interaction in a touch region also causes the electrical switch to operate in a particular power output state. The subset of illuminated segments can indicate the power output state or a closely spaced range of power output states. For example a pattern of three illuminated segments can indicate a power output state between 60% and 70% of full power for a dimmer switch. A touch region (e.g. 150a) can be that area on the touch sensitive user surface in front of a particular touch electrode (e.g. 230a). Alternatively, a touch region can be above the overlapping region of two or more touch electrodes. In this way a touch processor 155 can identify a pattern within a set of touch signals (e.g. a number of touch signals satisfying a criterion) and illuminate a segment of the segmented backlight upon identification of the pattern. A touch region can be the area outlined or circumscribed by the set of locations on the touch sensitive surface 140 in which direct user interaction generates a particular pattern of touch signals, that when processed by the processor cause the processor to illuminate a particular subset of segments of the segmented backlight. In several embodiments the subset of segments is a common or unique response to direct user interaction with any point in a touch region. For example, a touch region can be associated with a first segment of the segmented backlight and also associated with a 50% duty cycle output state of a dimmer switch (i.e. operating the electrical load at 50% of the maximum power). The bounds of the touch region can be defined as the area outlined by the set of points at which direct user interaction causes two underlying touch electrodes to each generate touch signals above a threshold value. In this way the touch region can reside in a well-defined area of the touch sensitive surface above the overlapping junction of the two electrodes. It would be known to a person of skill in the art that a touch sensitive slider capable of producing a wide range of distinct output states can be implemented in this manner with an array of interleaved touch sensors. Several embodiments of this disclosure provide a distinct uniformly-illuminated indicator to track the most recently touched touch region on such a slider. In another embodiment a touch region can correspond to a specific segment of the segmented backlight while corresponding to a range of output states. For example a dimmer switch 100 can have 3 touch regions 150a-c each capable of illuminating a different segment of the illuminated backlight. Locations in each touch region can generate a plurality of closely spaced output states (e.g., 0-30%, 31-60% and 61-100% duty cycle). The exact output state can depend on the location a user touches within a touch region. In this embodiment a touch region corresponds to a segment of the backlight but can provide fine control of a dimmer or fan.

In FIG. 2E segment 210a lights illumination region 190a on the touch sensitive surface 140. Illuminated region 190a encompasses touch region 150a. Segment 210a also light an illuminated region 250a on the translucent layer, thereby providing a uniformly illuminated indication to a user. In the embodiment of FIG. 2E, while 190a is an illuminated region, it can difficult to discern on a transparent switch cover. In contrast a distinct illuminated region 250a is more clearly discernable on the translucent layer behind the cover. The segmented lightguide can produce distinct, uniformly intensity illuminated regions on both a translucent layer and the touch sensitive surface simultaneously (e.g., 190a and 250a).

In the absence of a light guiding component (e.g. a segment) a point light source (e.g. LED) in a non-attenuating medium produces light intensity (measured in watts per square meter) that decreases proportional to the square of the distance from the light source. Hence an illuminated dimmer using direct illumination of the switch cover and without a segmented backlight (e.g. the GRAFIK and Vierti products) produces an illumination indication that that fades quickly with distance from the illumination source. This can produce indistinct illumination regions with low contrast boundaries.

In one aspect of the embodiment of FIG. 1 direct user interaction with a touch region (e.g., 150a and 150b) causes a corresponding elongated illumination region (e.g. 250a, 190a and 250b in FIG. 2E) to appear. A physical aspect of illumination regions can indicate the state of the electrical switch. For example the height of the illuminated region on the touch sensitive surface can indicate a corresponding output state of the electrical switch (e.g. an illuminated region at the top of the touch region can indicate 100% duty cycle or 100% power supplied to a load device). The number of illuminated regions in a column of illuminated regions can indicate the operating state. For example a column of three illuminated regions (e.g. 190a, 190b and 190c) can indicate a 30% power state. The intensity of an illuminated region can indicate the operating state. For example a user could drag an illuminated indicator (e.g. illuminated region corresponding to the most recently touch location) up and down on the touch sensitive surface and the illuminated indication may simultaneously become brighter as it moves upwards. Similarly, a static illumination region may become brighter as a user moves their finger on the touch sensitive surface. In the embodiment of FIG. 1 the illuminated regions (e.g. 190c) at the bottom of the touch sensitive surface are smaller, and the shape of the illuminated indicator can indicate the operating position of the electrical switch.

In several embodiments the illuminated regions (e.g. 190a and 250a) have well defined perimeters, characterized by a sharp change in intensity over a short distance. In the embodiment of FIG. 2E the perimeter of regions 190a and 250a is defined by the perimeter of the forward facing surface 222 of segment 210a. In other embodiments the perimeter of 190a and 250a can be defined at least in part by opaque portions of artwork 225 on either the front or rear surfaces of translucent layer 220. For example artwork 225 can be opaque and form a frame around illuminated region 250a thereby providing a well-defined boundary. In an embodiment with artwork on the rear surface of the translucent layer 220, the artwork can remain hidden until an illuminated segment reveals it. In this embodiment the front surface of the translucent layer can present a uniform uncluttered appearance to the user and upon user interaction the dimmer can illuminate artwork, instructions, detailed shapes or color patterns. In one embodiment the thickness of the translucent layer can be varied to compensate for any variation in the intensity of the illumination from an elongated illuminated segment. In another embodiment the translucent layer and switch cover can be provided as subassembly operable to be changed by the user that the user to fit their decorative preferences. For example the translucent layer can depict seasonal artwork.

Dimmer switch 100 can contain one or more masks 235. Mask 235 can be located between the switch cover and the light generation components 215. Mask 235 functions to block light from reaching the user from particular regions inside the dimmer switch. The mask 235 can also function to partially or fully define the shape of the one or more illuminated regions on the translucent layer 225 or touch sensitive surface 140. For example mask 235 can cover the light generation components thereby blocking light from directly shining light towards the user. A portion of the mask 235 can extend over one, some or all of the plurality of segments and thereby provide a high contrast boundary to some or all of the perimeter of one or more illuminated regions (e.g. 250*a* and 190*a*). Mask 235 can be a thin piece of opaque or reflective polymer or adhesive tape. In some embodiments several masks are used to shape a variety of aspects of the illumination of the touch sensitive user surface. For example a detailed mask layer could be adhered to the back of the translucent layer 220 and thereby provide a detailed and aesthetically pleasing illuminated region (e.g. 250*a*) in response to a user touching switch cover and in particular the corresponding touch region (e.g. 150*a*). In the embodiment of FIG. 2E the illuminated regions are predominantly illuminated by indirect light from the front surface 222 of segments 210, rather than directly illuminated by direct light from light generation components. Previous illuminated light switches have used diffusers placed in front of the light generation components to soften and broaden the illuminated area presented to a user. Nevertheless the light from these designs is often direct light that is merely diffused by the diffuser and not reflected internally to provide an indirect illumination mechanism. For example a lampshade diffuses light from a light bulb but does not reflect a large portion of the light.

Dimmer switch 100 can contain one or more indirect sensors 240. Indirect sensors can be operable to sense an aspect of the environment in the vicinity of the switch or an aspect of a person in the vicinity of the switch. In FIG. 2E indirect sensor 240 can be a passive infrared sensor operable to sense the motion of a person in the vicinity of the switch. In other embodiments dimmer switch 240 can include many indirect sensors 240. Examples of other indirect sensors include sound sensors, vibration sensor, an ultrasound transceiver, a light level sensor and received signal strength indication (RSSI) sensors. Indirect sensors 240 can be located on one or more electronic substrates 228 behind the switch cover 145. In one aspect of several embodiments indirect sensor data can be used as a trigger to illuminate the present or most recent output power state of the dimmer switch when a person is sensed in the vicinity. Indirect sensor data can be combined in a variety of straightforward or complex manners for example to provide illuminate a region (e.g. 190*a*) and thereby help a person to find the switch in a dark room.

In one embodiment indirect sensor data (e.g. motion indications) can be used to verify direct sensor data (e.g. capacitance measurements). This enables the dimmer switch to reduce false positive touch indications, by determining that a person is present in the vicinity. For example in the absence of indirect sensor data indicating the presence of a person close to a dimmer switch, the illuminated dimmer switch 100 can use a high threshold for direct input sensor data (820 in FIG. 8). Conversely, when indirect sensors report a person close by a touch processor 155 can apply a lower threshold to direct sensor data. In this way dimmer switch 100 can reduce the occurrence of inadvertent dimmer switch activation when a person is not present.

Dimmer switch 100 can contain a touch processor 155. The touch processor can be operably connected to receive signals from the direct input sensors and indirect sensors 240. In FIG. 2E touch processor 155 is operable coupled to touch sensors 230*a*, 230*b* and 230*c* and motion sensor 240. Touch processor 155 can function to process sensor signals and generate signals to control light generation components 215 and one or more load control components 160. Touch processor 155 can be a microcontroller (e.g. the Dspic33 series from Microchip Technologies of Chandler Ariz. or ARM processors from ST Microelectronics of Geneva Switzerland). Touch processor 155 can also comprise one or more analog circuits such as a transistor, an operational amplifier or a comparator. The touch processor 155 can comprise a plurality of circuits operable to transmit load control signals to one or more load control components 160. For example a touch processor can include a zero crossing detector circuit operable to sense when an AC voltage between wires 120*a* and 120*b* is close to or equal to zero and generate a corresponding voltage indication. Microcontroller-based touch processors can use this indication of zero crossing, combined with sensor signals indicating a touch region to determine a delayed dimmer signals. In such touch processors the delay associated with the dimmer signal follow a zero crossing event can be selected based on the touch region a user touches and thereby control the power delivered to the load.

Dimmer switch 100 can contain one or more load control components 160. Load control component 160 can function to provide variable average power to a load. Examples of load control components include triacs, transistors and relays. In some embodiments the load control component can be pulse modulated whereby the load control component is operated in a digital manner and is turned ON and OFF in rapid succession. In other embodiments the load control component is an analog component and turns partially ON in response to receiving signals from the touch processor.

Dimmer switch 100 can contain two or more electrical terminals 135 operable to be attached to building-based wiring or wiring attached to a load. Building based wiring can include wiring within the walls of a building or carried in metallic or plastic tubing for the purpose of electrically connecting switches and service points in the building. Service points can include wall mounted electrical sockets, HVAC equipment, sprinkler components and lighting fixtures in ceilings and walls. Examples of terminals 135 include screw terminal (e.g. those found on many light switches) and wire pigtails (e.g. a length of wire protruding from the housing). In other embodiments the electrical terminal can be a connector such as a D-SUB connector, a crimp connector or a military or aerospace connector (e.g. series 38999 available from TE Connectivity of Berwyn Pa.).

Figure 2F:
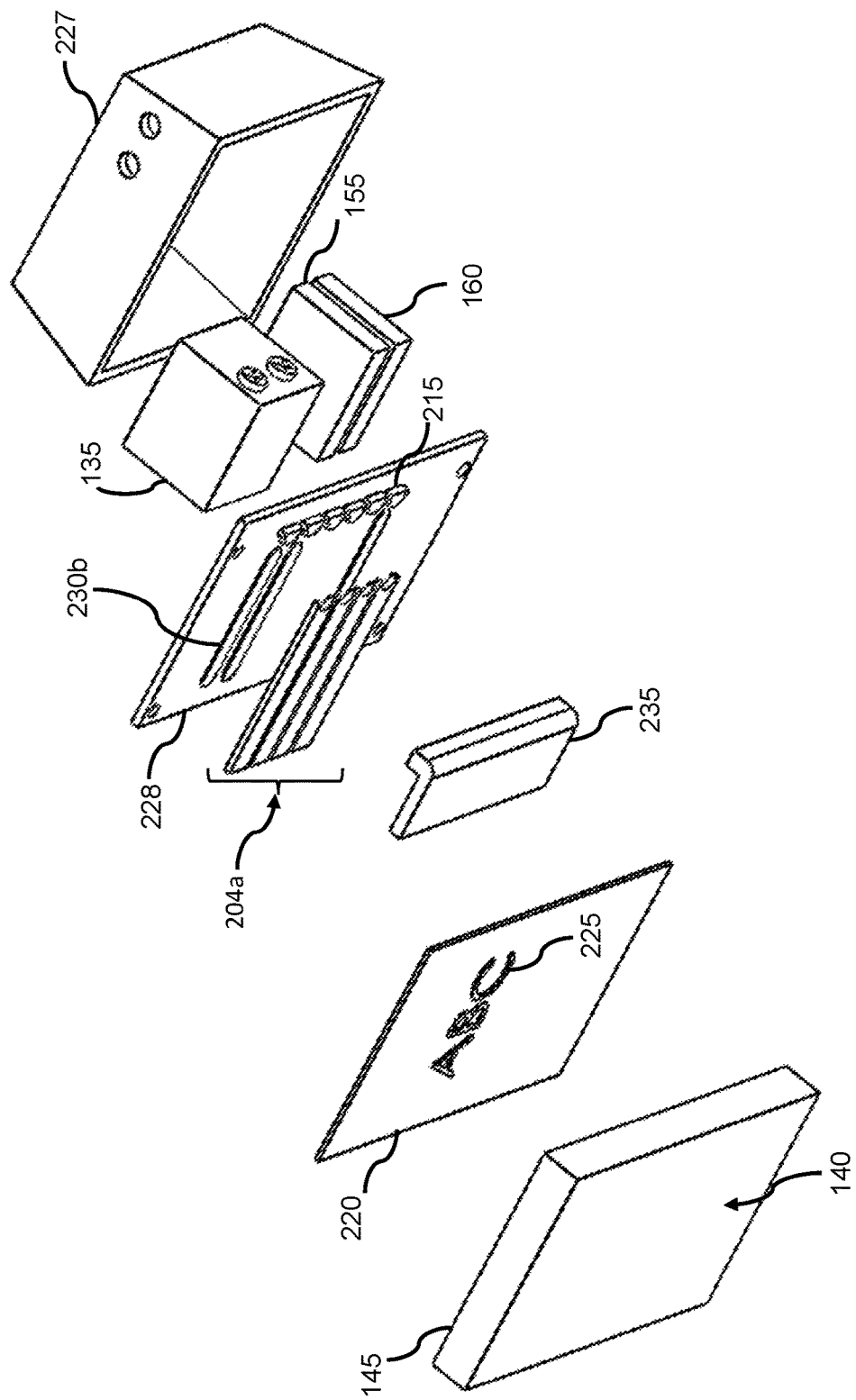
Figure 2G:
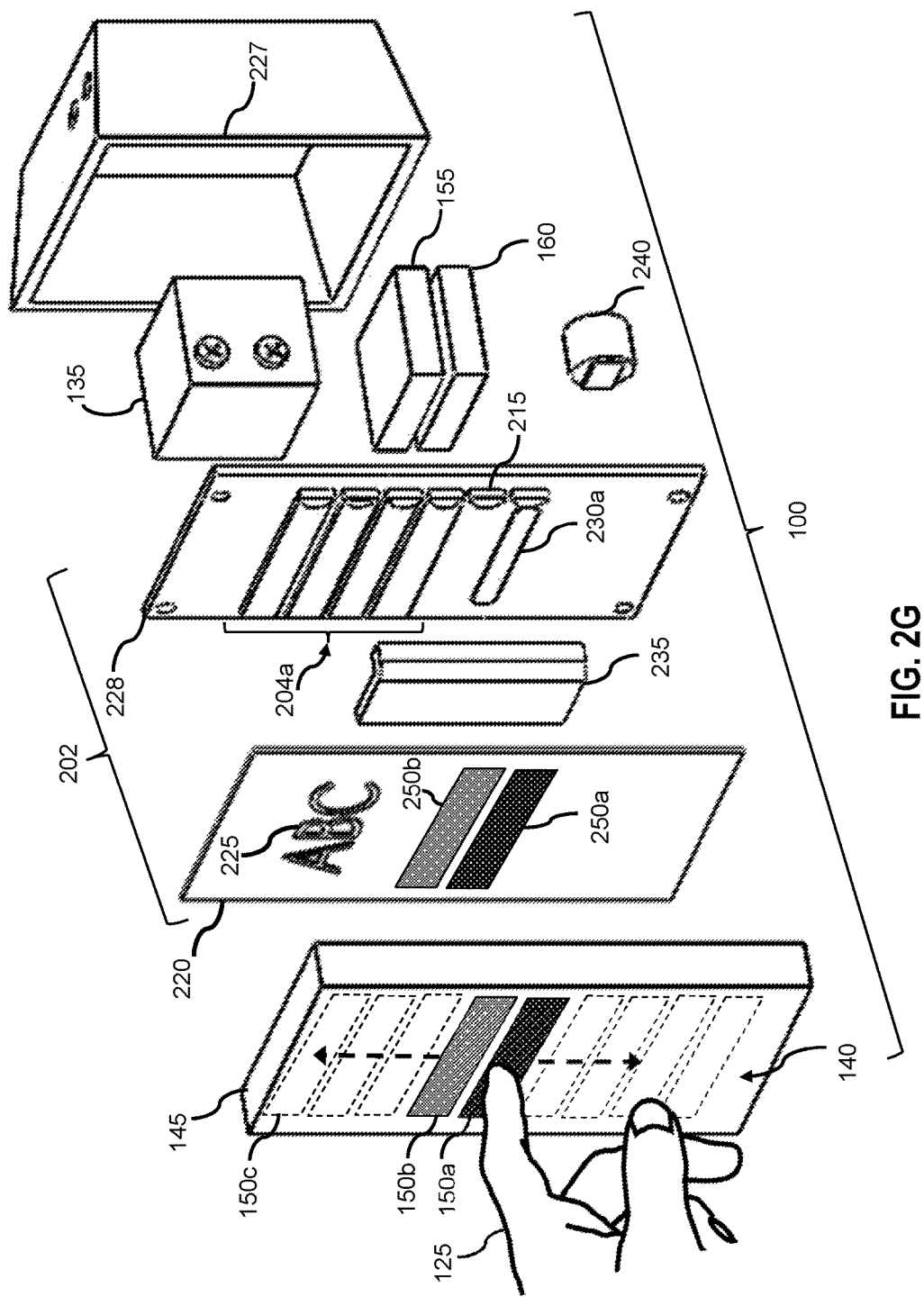

In FIG. 2F several components of the illuminated dimmer switch 100 are shown from above. In FIG. 2G the segments 210 are shown in the assembled position. In this position illumination devices 215 can transmit light in the elongated direction 180 (e.g. the second direction), wherein the majority of the light is transmitted parallel to the touch-sensitive surface. The segmented backlight subassembly 202 in FIG. 2F is an example of an edge-lit, side illuminated segmented backlight. Light from each illumination component 215 can be preferentially coupled into one segment.

In FIG. 2H the mask 235 is shown in the assembled position. In this position the mask covers the light generation components 215. In some embodiments there can be a plurality of masks, each covering one or more light generation components. Mask 235 can also function to cover a portion of the segments and thereby obscure light from some of the front surface of the segments from illuminating the touch sensitive user surface. In this way the mask can function to obscure direct illumination of the touch sensitive surface by light generating components 215 and function to obscure a portion of the segments thereby partially or fully defining the shape of the illuminated regions 250. In the configuration of FIG. 2H the touch sensitive surface is operable to be more indirectly illuminated by indirect light from the front surfaces of the light segments than directly illuminated by light from the light generation components 215.

In the embodiment of FIG. 2E an active display layer 260 (e.g. liquid crystal or organic LED layer) is placed between the transparent front cover and the segmented backlight. In some operating conditions the electrical switch can illuminate all segments of the segmented backlight 202 in order to backlight a message on the active display layer (e.g. LCD layer). In additional illuminating all segments at a first intensity dimmer switch 100 can illuminate a single segment at a higher intensity, corresponding to the operating state of the dimmer. In this way backlight can serve a dual purpose of dimmer indicator and LCD backlight. In another example the LCD can display information corresponding to the specific segment illuminated. For example as the user raises or lowers their finger on the touch sensitive surface both the illuminated segment and the active LCD area could move, such that the information displayed on the LCD is always behind the illuminated region. In this way the liquid crystal layer can provide relevant information, such as the wattage of the load at the current power output state or the annual energy cost at the present setting. In another related example the illuminated information could be the temperature of the room illuminated by a single segment of the backlight. Alternatively, if a person approaches the dimmer switch 100 in the middle of the night an indirect sensor 240 (e.g. a passive infrared sensor) can sense the person and illuminate a segment of the segmented backlight, thereby illuminating the time on the LCD display. In this way one advantage is the ability to illuminate a small section of the touch sensitive surface to show a small amount of information in a situation where illuminating the entire display could cause light pollution in the room.

With a standard LCD display one of the most difficult effects to generate is a uniform white background with a highlighted area of higher intensity on part of the display. This difficulty arises from the black and white nature of the liquid crystal layer in the unenergised and energized states respectively. The disclosed technology enables such a highlighted region on a white background, by providing means to selectively increase the illumination intensity of a region of the touch sensitive surface 140. In the embodiment of FIG. 2H the liquid crystal layer 260 is an active display layer. In several embodiments the liquid crystal layer can be actively controlled by direct user interaction with the touch sensitive surface 140.

In some embodiments a first segment from the lightguide can transmits from the forward facing surface substantially uniform intensity indirect light with a first light intensity, wherein the first intensity is greater than the light intensity transmitted by at least one other segment of the lightguide. For example a first segment can receive direct illumination from a light generation component 215 and transmit uniform intensity indirect illumination through the forward facing surface 222. At the same time all other segments in the lightguide are not directly illuminated by a light generation component and therefore transmit a far lower light intensity through their forward facing surfaces 222.

Figure 2I:
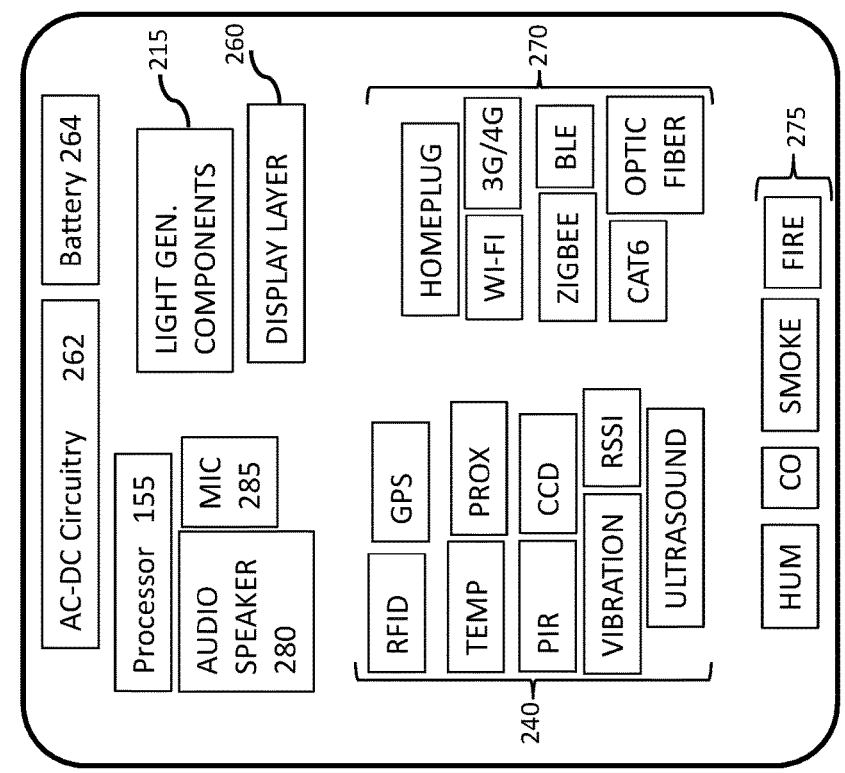
FIG. 2I is a simplified block diagram illustrating components of an electrical switch, according to an embodiment.

FIG. 2I is a simplified block diagram illustrating several components of electrical switch 100, according to an embodiment. Electrical switch 100 can incorporate a host of sensing, interface, and communications capabilities for enhancing occupant detection and ease of use. By virtue of being mounting in place of traditional wall fixture (e.g. power outlet), the electrical switch 100 has access to plentiful electrical operating power, such as by connecting to wires 120a and 120b (e.g., to 120V "hot" line voltage wires) in junction box 110 that are present in virtually all standard home junction boxes. This largely unlimited power, enable the electrical switch 100 to accommodate a wide variety of sensing, user interface, and communications options.

Occupancy sensing, for example, can be significantly enhanced by virtue of the well placed locations usually right next to room doorways. According to several embodiments electrical switch 100 can derive power for lower voltage electronics from sources including a rechargeable battery 264 or an AC-DC conversion circuit 262 operable to convert the 110 VAC alternating voltage supply to a DC voltage in the range of 0-28 VDC. The rechargeable battery can either be used as a convenient source of back-up power for the sensors, transceivers.

According to some embodiments, electrical switch 100 can contain a main processor 155, a display layer 260, audio speaker 280, microphone 285 and indirect sensors 240. The sensor suite can include an RFID reader, GPS receiver, temperature, proximity, passive infrared (PIR), ultrasound, and received signal strength indication (RSSI) sensors. The sensor suite can also include a camera and a vibration sensor. The vibration sensor can be particularly useful for sensing a user indication to turn on or off a light. For example a vibration sensor such as a MEMs device or a piezoelectric sensor can sense user interaction with touch sensitive surface 140 and faceplate 170. The faceplate 170 can be supplied by a wide variety of manufacturers with common attachment features for attaching the faceplate to the electrical switch. Once secured to the smart fixture in a predictable manner direct user interaction with the faceplate in the form of touching, swiping, tapping or pressing can be transferred as vibration indications from the faceplate to the light switch 100 and sensed by the vibration sensor. In this way a vibration sensor could provide a momentary (e.g. ON/OFF) switch capability to a passive faceplate provided by a wide variety of manufacturers or indeed a legacy faceplate predating the installation of the smart fixture. In another embodiment a vibration sensor could be mechanically coupled to the surrounding wall 115 (e.g. using the faceplate 170 as a bridging component) and thereby sense vibration associated with direct user interaction (e.g. tapping or touching) the wall 115 near the smart fixture. In this way a user can touch the wall close to the smart fixture and actuate a momentary switch aspect of the smart fixture (e.g. light switch).

Electrical switch can include a variety of communications capabilities 270, including Wi-Fi, ZigBee, 3G/4G wireless, CAT6 wired Ethernet, homeplug, and even optical fiber. In addition to sensors operable to sense aspects of a person electrical switch 100 can also contain one or more environment and hazard monitoring sensors 275, including light, fire, smoke, carbon monoxide.

Figure 3A:
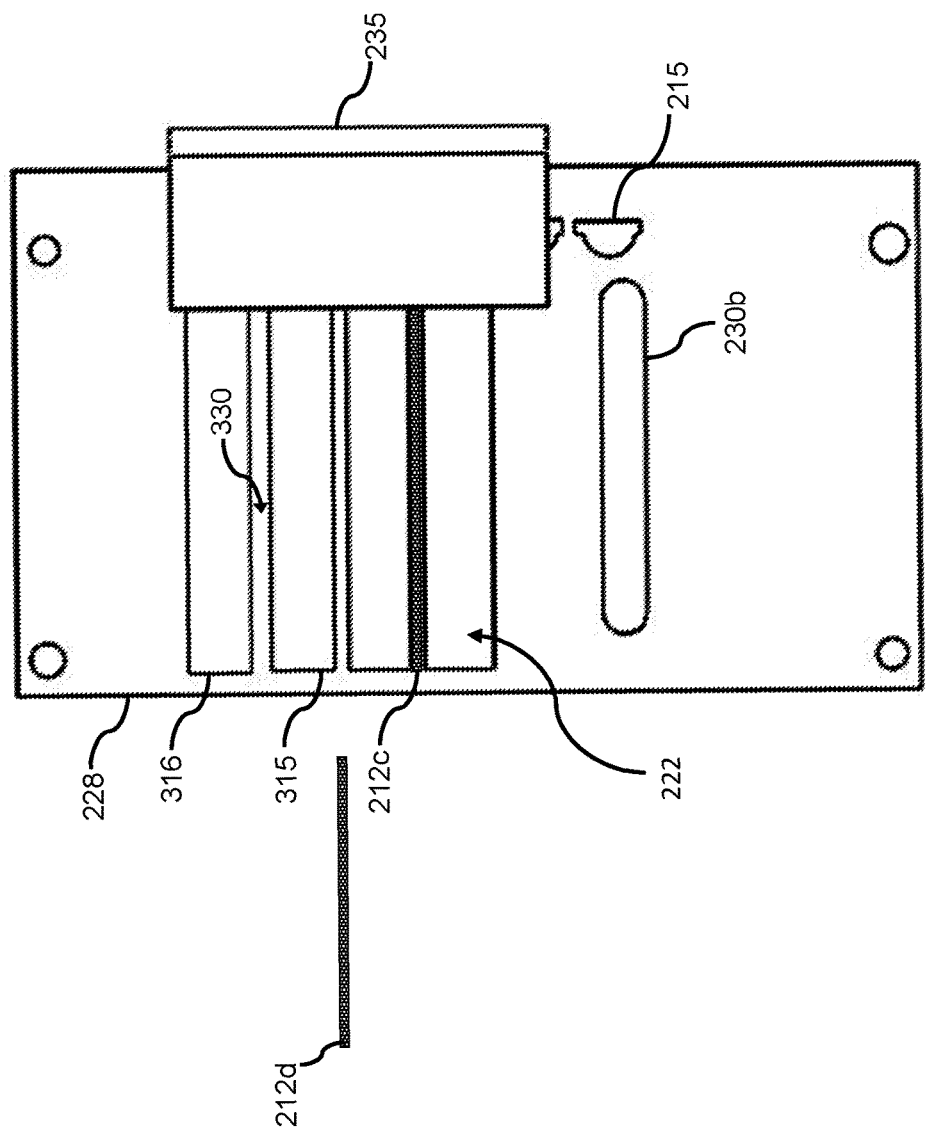
FIG. 3A, 3B show components of a dimmer switch for providing distinct illuminated touch control regions in accordance with an exemplary embodiment.
Figure 3B:
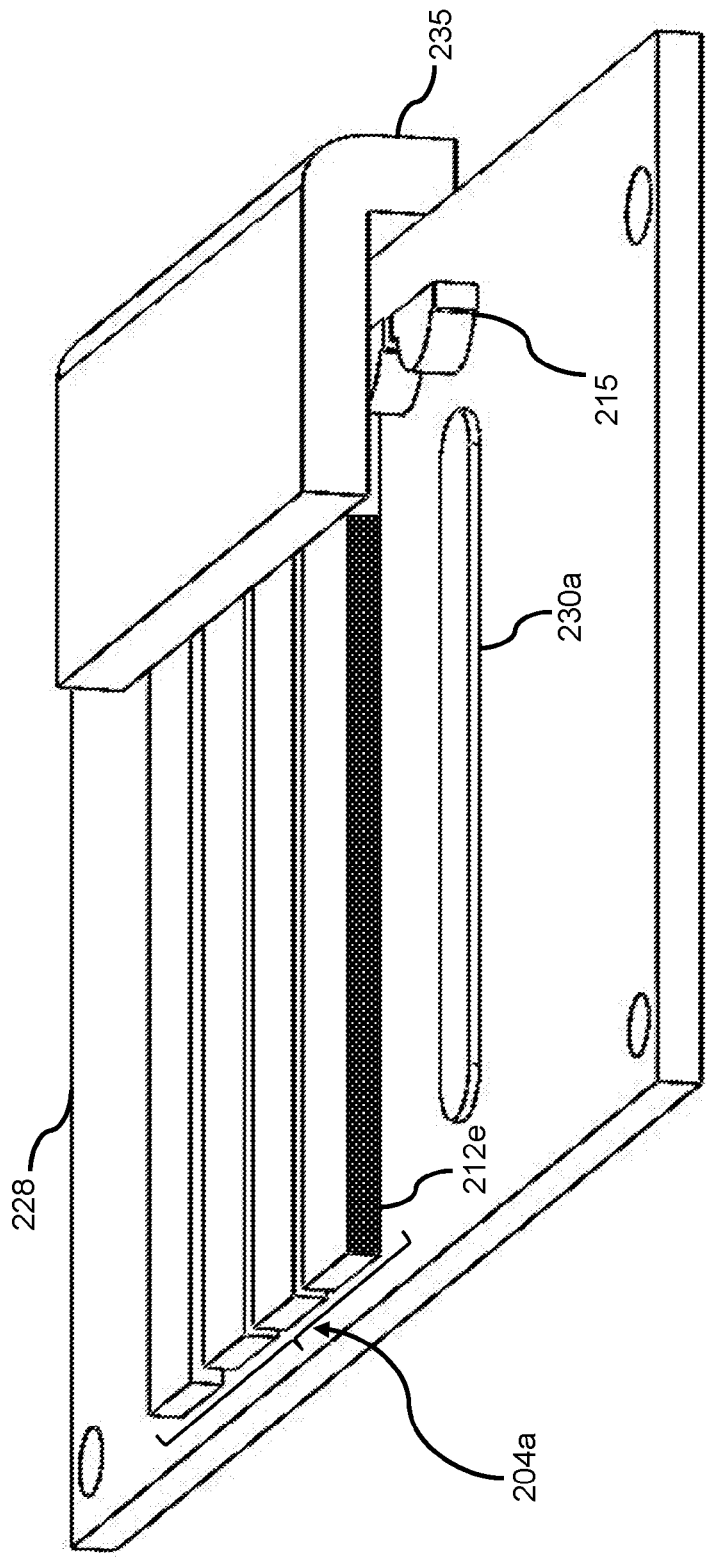

FIGS. 3A and 3B show components of an electrical switch with touch sensitive illuminated controls for providing distinct illuminated regions (e.g., 250a) behind touch regions (e.g. 150a) in accordance with an exemplary embodiment. The components are also able to provide distinct illuminated regions (e.g., 190a) on the touch sensitive surface 140. The load control device of FIG. 3A contains a plurality of separators 212c and 212d. Separators are operable to be placed in the gaps between neighboring segments. Separators 212 can function to optically isolate neighboring segments. In this way separators can enhance the contrast and definition of illumination regions (e.g. 250a and 190a in FIG. 2E). Separators can be bulk materials (e.g. polymer or metal parts) or thin layers adhered to one or more surfaces of a segment (e.g. 212e in FIG. 3B). For example separators can be metalized or opaque tape or paint applied to one or more surfaces of a segment thereby preventing light from leaking into adjacent segments. In some embodiments segments and light blocking separators can be molded single component. For example separators could be inserted during molding and encased in a transparent polymer lightguide during molding thereby dividing the lightguide into segments. In FIG. 3A segments 315 and 316 are separated by a gap 330 between them.

In one aspect of several embodiments a thin separator enables gap 330 to be very small (e.g., <3 mm) and thereby provides closely spaced discrete light sources. The close placement can provide a user with a sense of dragging a continuous illuminated slider, rather than disjointed illuminated segments with large separation. In the context of this disclosure a closely spaced plurality of segments is considered to be a plurality of segments wherein at least one point in each segment is separated another segment in the plurality of segments by at most some minimum distance. FIG. 3B illustrates that the separator 212c can be a thin layer adhered or painted on one or more surfaces of a segment 210.

Figure 4A:
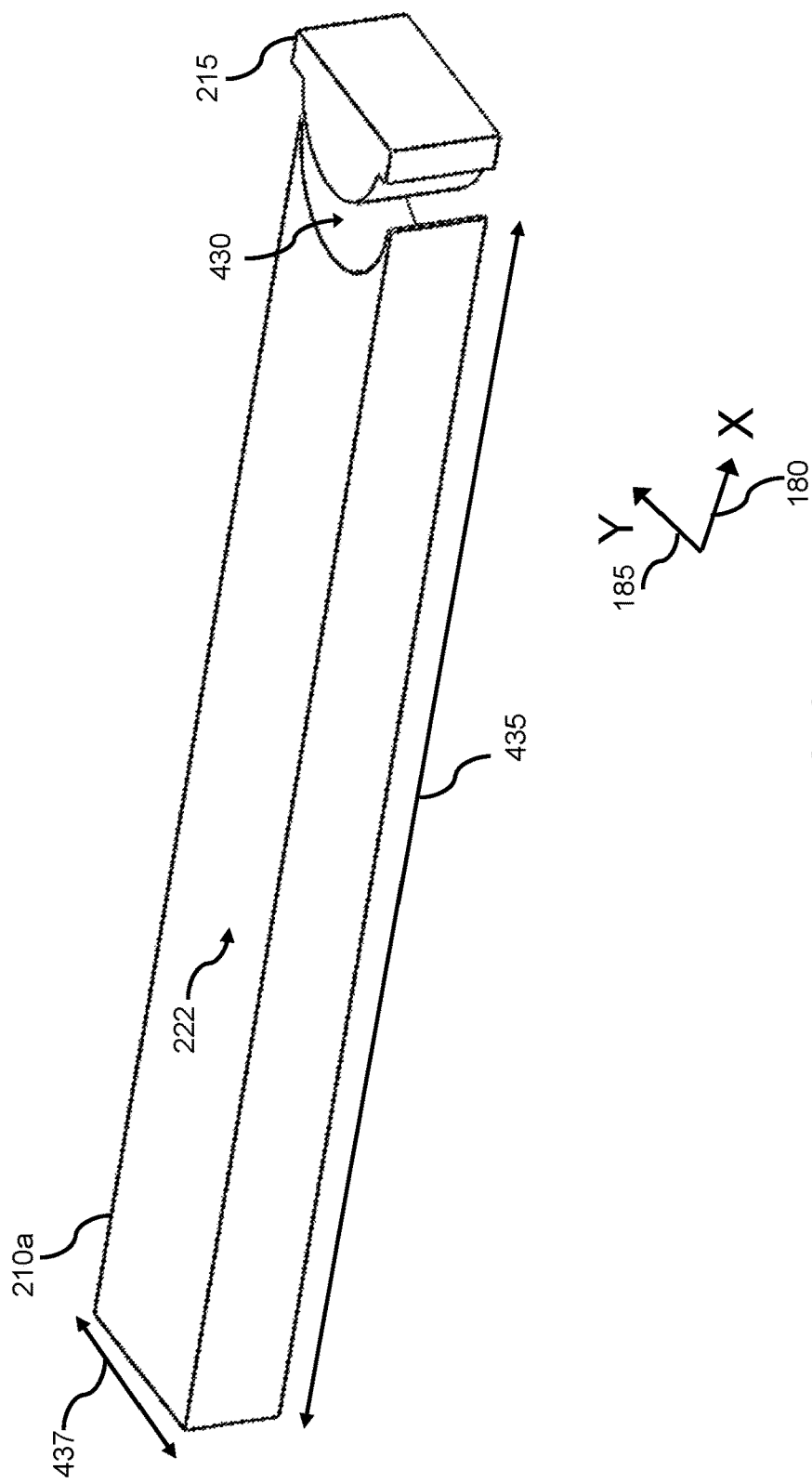
FIGS. 4A, 4B and 4C show a segment and illumination component in accordance with an exemplary embodiment.
Figure 4B:
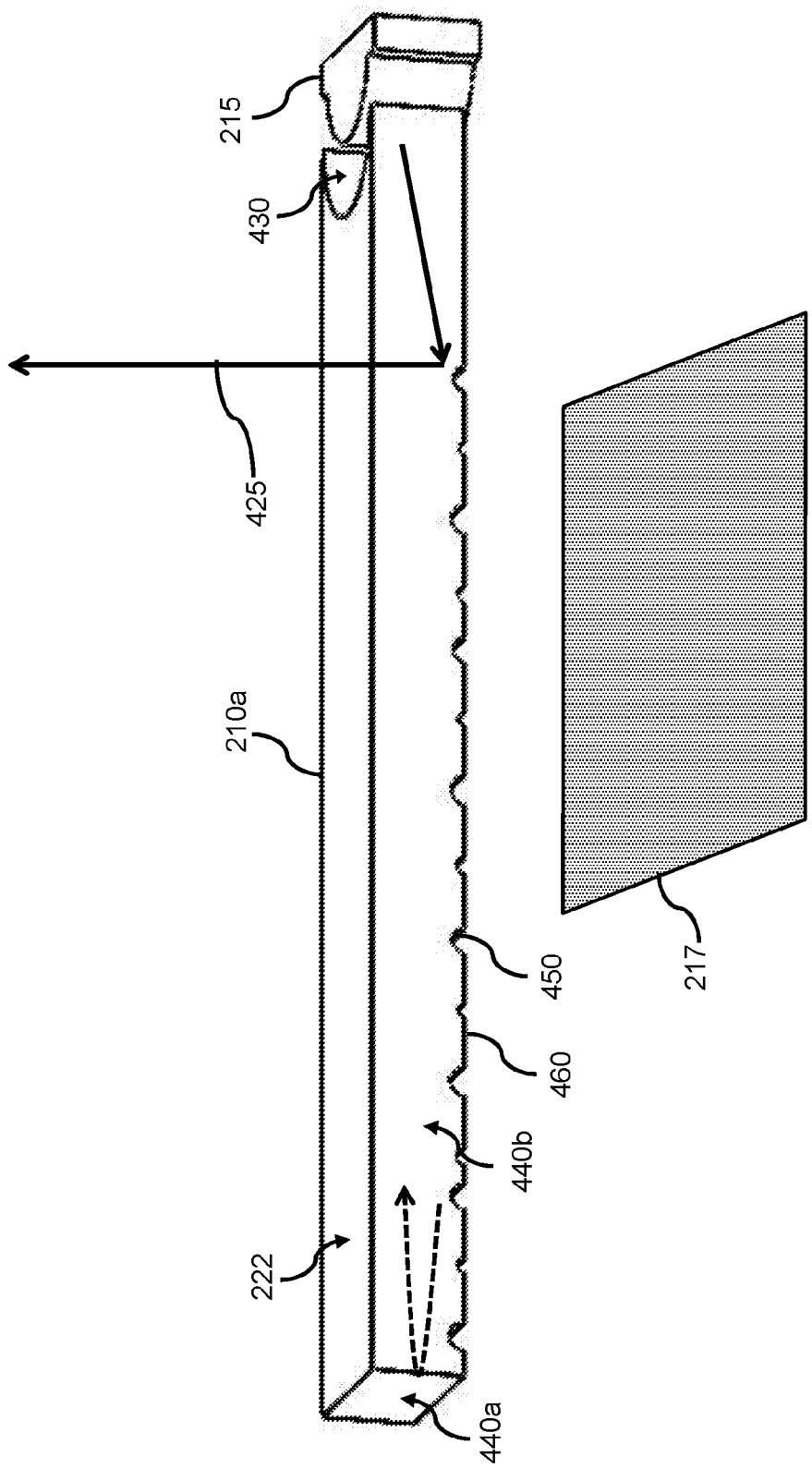
Figure 4C:
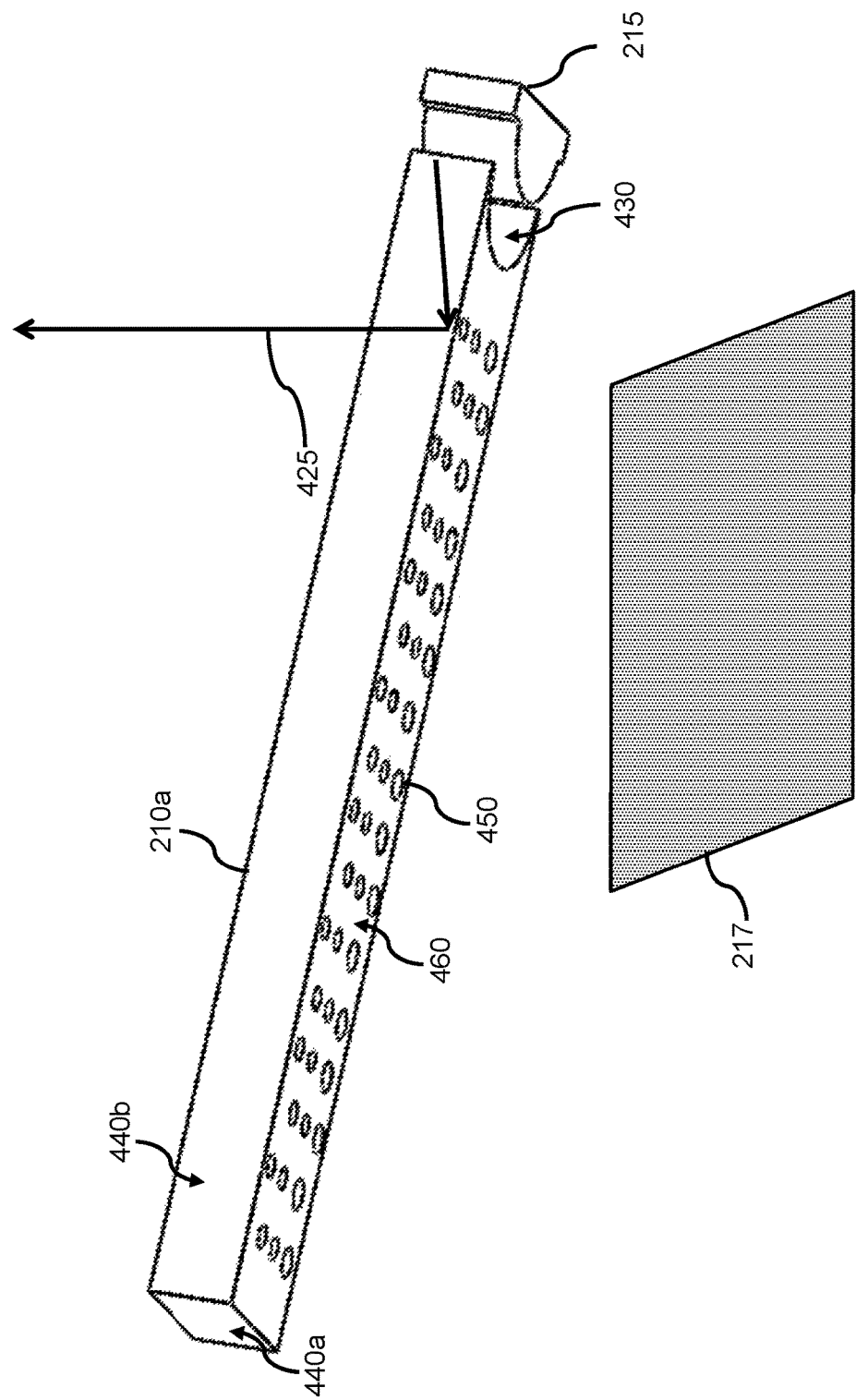

FIGS. 4A, 4B and 4C show illustrate a segment 210a of a segmented backlight 202 and an illumination component 215 in accordance with an exemplary embodiment. Segment 410 has a forward facing surface 222 and can have a light injection surface 430 designed to accept light from illumination component 215 into the segment. Segment 210a can have a length 435 in the elongated direction 180 and can have a width 437 in the Y direction. In the context of this disclosure a component or region is considered elongated if the ratio of the length to the width is greater than one. In some embodiments the ratio of length 435 to width 437 is considerable greater than one (e.g. a width of 6 mm enables approximately 9 segments to fit within the height of a standard Decora® light switch and each segment can be 30 mm in length providing an elongated segment with a ratio of 6)

Segment 210a functions to guide light from the light injection surface 430 to the forward facing surface 222. In the embodiment of FIG. 4A the light injection surface is more perpendicular than parallel to the forward facing surface 222. In this case the segment 210a serves to change the direction of highest illumination intensity from parallel to the touch sensitive surface 140 to perpendicular to the touch sensitive surface. In another aspect the segment functions to generate substantially uniform light intensity across forward facing surface 222. The uniformity of light intensity corresponds to the brightness variations that a user can observe. In one aspect light can be transmitted into the segment from a point illumination source (e.g. LED) at 430 and the segment can function to homogenize the light intensity across the forward facing surface through a process of total internal reflection.

Segment 210a can have a plurality of surfaces (e.g. 440a and 440b) designed to enhance and promote total internal reflection. Total internal reflection can be enhanced by making surfaces of the segment smooth (e.g. polishing or molding the surface to have a low surface roughness), thereby minimizing scattering of incident light and promoting reflection of light back into the segment. Total internal reflection can also be enhanced by placing a reflective non-light transmitting layer (e.g. 212e) in contact with a surface of the segment, for example reflective mylar tape adhered to one or more reflective surfaces, or a reflective paint applied to a reflective surface (e.g. 440a or 440b)

Segment 210a can have one or more surfaces (e.g. 460) with one or more features designed to enhance or promote scattering. For example surface 460 can be roughened to promote scattering of light through the front surfaces (e.g. scattered light ray 425). In the embodiment of FIG. 4B a plurality of bumps or dimples 450 on the rear surface 460 of the segment 210a enhances scattering of light at angles operable to transmit light through the forward facing surface 222. In many backlights at least one surface parallel to the intended direction of light transmission (e.g. facing surface 222) is modified to promote scattering of light perpendicular to surface 222. FIG. 4C illustrates an array of bumps on the rear surface 460 of segment 210a. The density of the bumps can be increased with increasing distance from the illumination source 215 to compensate for intensity variations and enable a substantially uniform intensity to be transmitted through the forward facing surface 222. In some embodiments the forward facing surface 222 can be the surface designed to promote scattering of light and achieve the same indirect uniform illumination functionality. In particular combining a front surface 222 designed to promote scattering and a rear scattering enhancer 217 (e.g. a reflective material) is an effective way to homogenize light and promote scattering through the forward facing surface. It can be appreciated a segment with scattering at the front surface still provides indirect illumination (reflection of light internally within the segment) as opposed promoting scattering on the front surface for the purpose of diffusing and refracting direct illumination. In other embodiments an equivalent scattering effect can be achieved by roughening a surface, painting the surface (particularly a matte white paint) or adhering a tape layer to surface 460. In the case of the tape layer the adhesive tends to interactive with the surface at a microscopic size scale, thereby promoting scattering. In other embodiments the front surface of the segment 222 can be modified to promote scattering and achieve a similar effect of scattering light through the forward saving surface 222. Dimmer switch 100 can contain a scattering enhancement layer 217 (e.g. a layer of diffusive paint, such as frosted paint), placed behind the rear surface of the segments 210a, designed to promote light to exit the segment through the front surface 222. The scattering enhancement layer can be a reflective layer, particularly if the scattering is initiated by modification of the front surface of segment 210a or the rear surface 460. In this case one or more of the front or rear surface of segment 210a can scatter incident light and light that is scattered towards the rear surface is reflected by the scattering enhancer, thereby promoting light to exit the segment through the front surface 222. In some embodiments the segmented backlight 202 each segment has three planar surfaces (e.g. 222, 460, 440a and 440b). At least two of the planar surfaces can promote total internal reflection and have a smooth surface finish and occupy a plan more parallel to the direction of light injection than perpendicular to the direction of light injection. At least one of the three planar surfaces can enhance scattering of light towards the touch sensitive surface (e.g. with dimples or surface roughening). In this way two surfaces promote the homogenizing of light intensity inside the structure of the segment while simultaneously promoting optical isolation and a third surface can enhance the preferential transmission of light towards the touch sensitive surface 222.

Figure 4E:
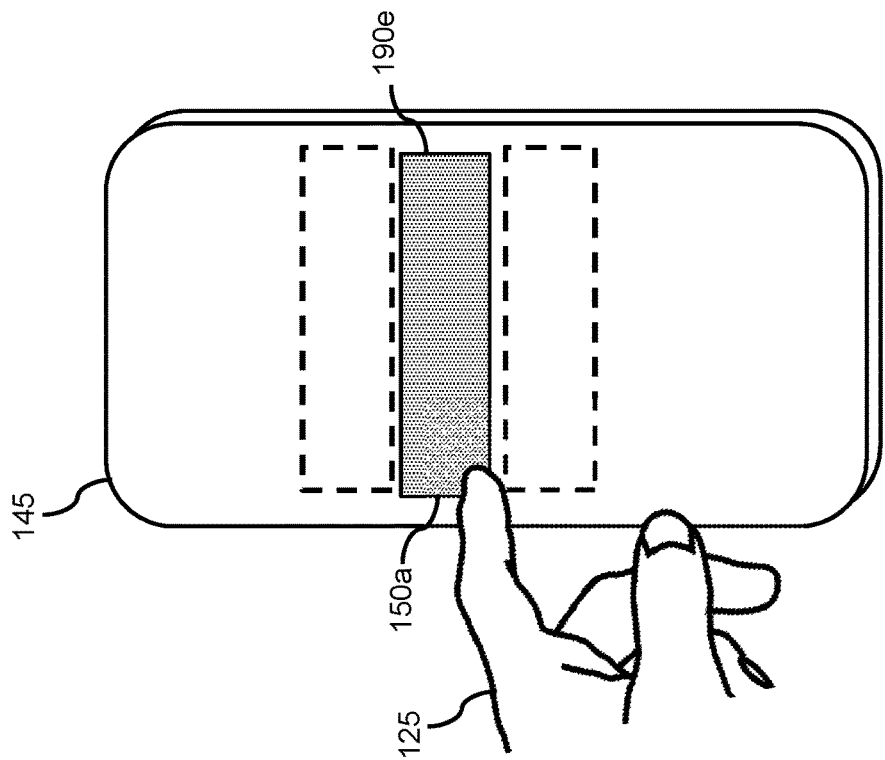
FIGS. 4D and 4E show touch sensitive surface with a uniformly illuminated touch region in accordance with an exemplary embodiment.
Figure 4D:
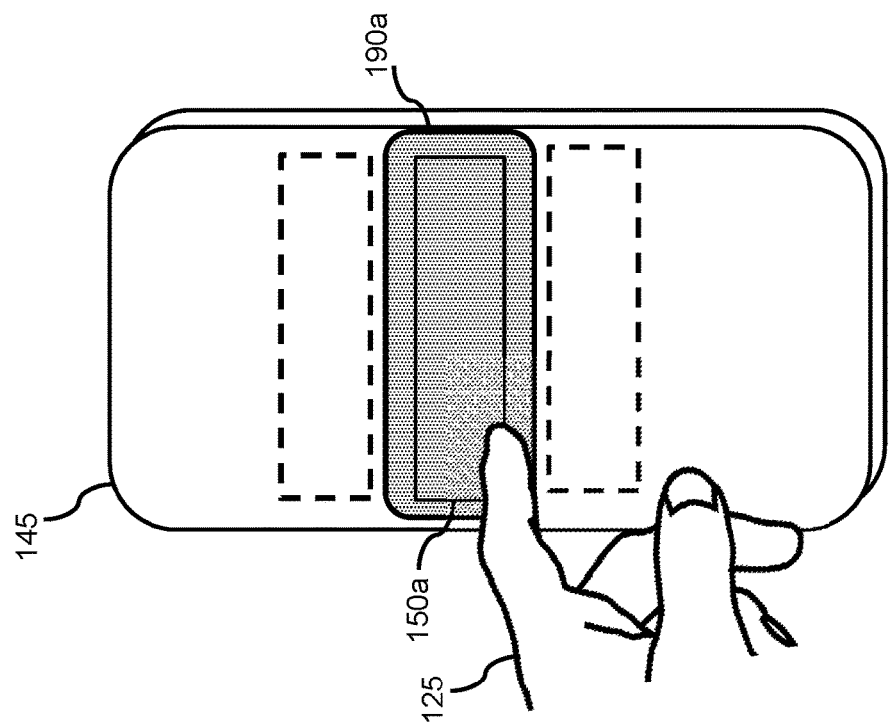

FIG. 4D illustrates an embodiment in which an illuminated segment (e.g. 210a) generates an illuminated region 190a encompassing a touch region 150a. The illuminated region 190a has substantially uniform intensity across the area of the region 190a has a several well defined edges. In the context of this disclosure a well-defined edge is a long narrow region illuminated on a surface (e.g. touch sensitive surface or front surface of translucent layer) in which an abrupt change in illumination intensity occurs. For example an illuminated region on the touch sensitive surface could have an average illumination intensity of 60 W/m². The illumination intensity could be within 50% of the average intensity over a 30 millimeter wide and 6 millimeter high rectangular region. This region could be considered to be a substantially uniformly illuminated illumination region. In the same example the illumination intensity could drop to just 1% of the average intensity at points on the perimeter of a rectangle with size 32 millimeters wide and 8 high centered on the illuminated region (i.e. centered on the first rectangular region). This dramatic reduction in illumination intensity in the narrow 1 millimeter border between the smaller and larger rectangles can identify the illuminated region as having well-defined edges. The disclosed combination of the segments and, separators are particularly useful for creating illuminated regions with such well-defined edges on the touch sensitive surface. In the embodiment of FIG. 4D the illuminated region 190a is circumscribed by well-defined edges. In other embodiments two illuminated regions can be adjoining and have the same intensity, such that each illuminated region has several edges that are well defined and one or more edges that adjoin a segment with equivalent intensity. In the embodiment of FIG. 4D the illuminated region is larger than the touch region 150a. In the embodiment of FIG. 4E illuminated region 190e is the same size as touch region 150a. In this case the perimeter of illuminated region 190e can substantially define the perimeter of touch region 150a. This can provide a very intuitive operation for the user wherein bounds of the illuminated region indicate the bounds the corresponding touch region operable to provide a particular output power state of the electrical switch. In the context of this disclosure an illuminated region can substantially define the perimeter of a touch region if for every point on at least 80% of the perimeter of the touch region there is a point on the perimeter of the illuminated region within 3 mm distance. In this way when a user places their finger on an illuminated region there is strong likelihood of interacting with the encompassed touch region.

Surround Electrodes

Figure 5A:
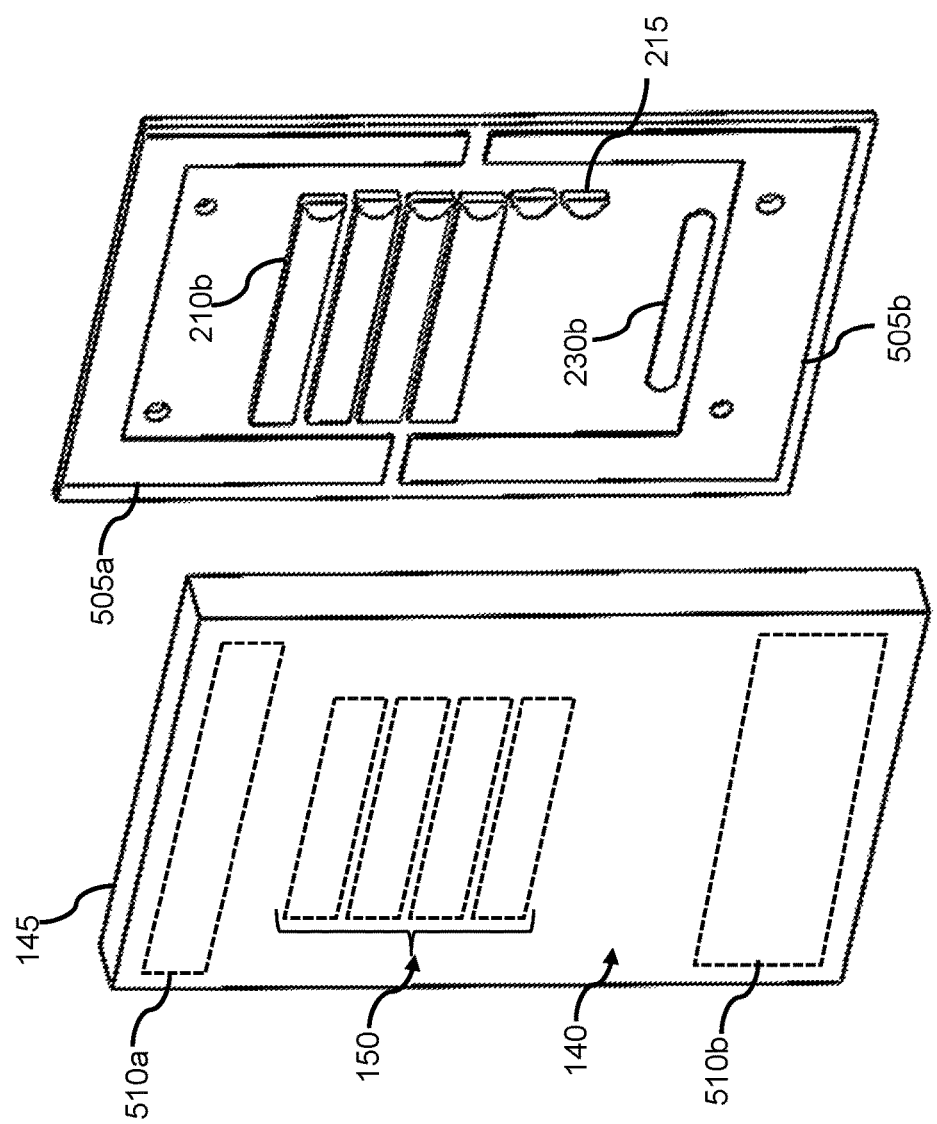
FIGS. 5A and 5B show components of the variable load control device for providing distinct illuminated touch control regions in accordance with an exemplary embodiment.
Figure 5B:
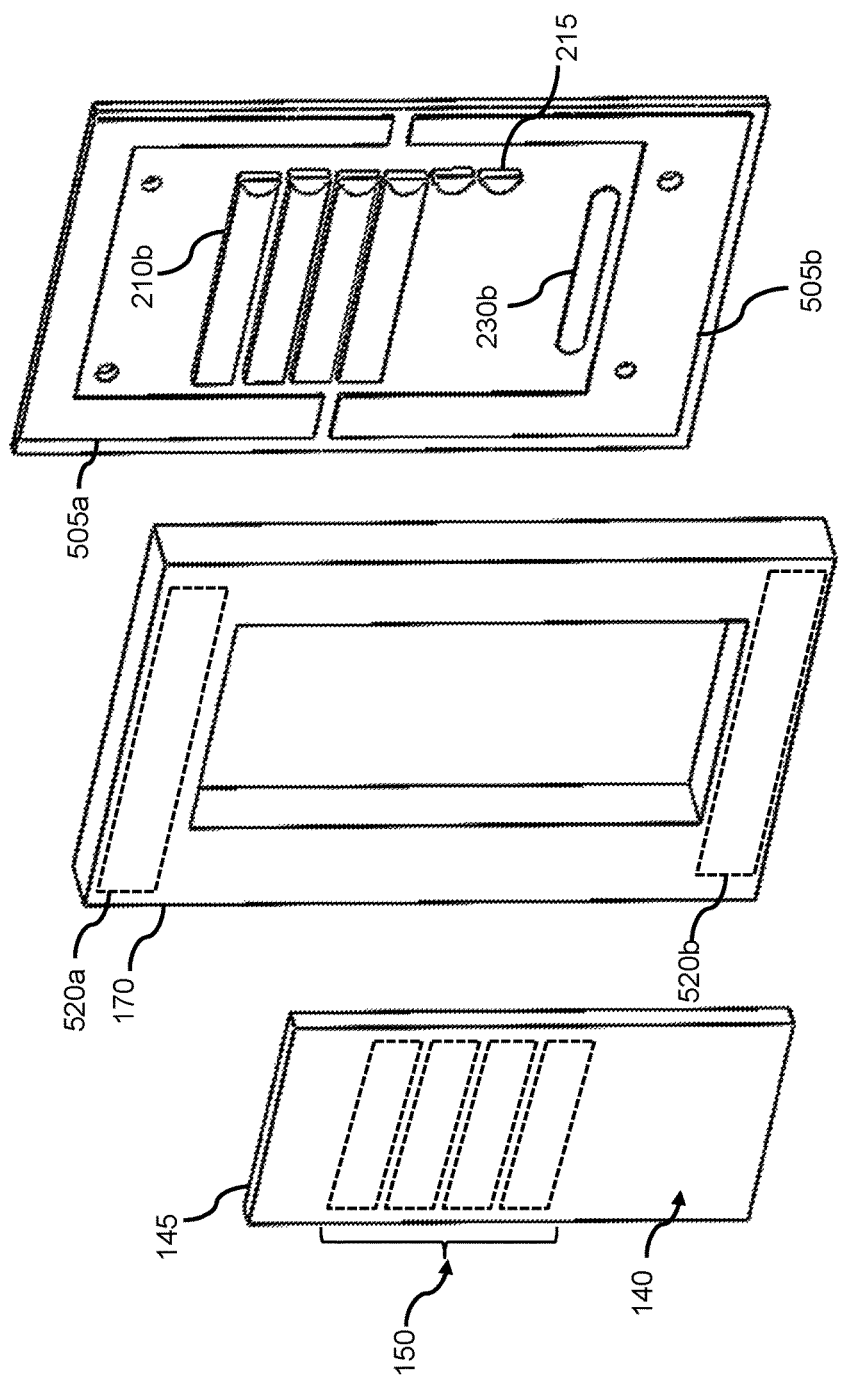

FIGS. 5A and 5B show components of a touch sensitive electrical switch for providing distinct illuminated touch control regions in accordance with an exemplary embodiment. The embodiment of FIG. 5A illustrates two large electrodes 505a and 505b surrounding the touch slider electrodes (e.g. 230b). Large electrodes 505a and 505b can provide touch sensitive ON/OFF functionality in regions (e.g. 510a and 510b) of the touch sensitive user surface 140.

In some embodiments touching the regions 510a or 510b can toggle the illuminated load control device between OFF and the previous load setting. This feature has the advantage that a person exiting a room does not have to interact with the dimmer portion of the touch sensitive user surface but can instead tap the larger surrounding regions 510a and 510b to turn a dimmer switch OFF. In the embodiment of FIG. 5A the switch cover 145 is enlarged to fit over the segmented backlight 202 as well as surround electrodes 505a and 505b. In the embodiment of FIG. 5B. The switch cover 145 does not extend over the surround electrodes 505a and 505b. The surround electrodes are instead covered by a faceplate 170. In this embodiment a user can interact with (e.g. touch) one or more regions of the faceplate 170 (e.g. regions 520a and 520b) and generate signals on electrodes 505a and 505b surrounding the touch sensitive slider portion of the electrical switch. In one aspect of FIG. 5B a compliant material (e.g. foam, rubber, sponge or a polymer or metallic mesh or metal loaded materials) can be placed over the surround electrodes (e.g. 505a and 505b). The compliant material can provide a continuous path for touch indications caused by direct user interaction to travel from the faceplate 170 through the compliant material to the surround electrodes (e.g. 505a and 505b). The compliant material and surround electrodes 505a and 505b can enable a standard off-the-shelf faceplate to have a touch sensitive surface. Examples of faceplate materials that can be made touch sensitive with a compliant material include polymers, glass and wood.

Figure 6B:
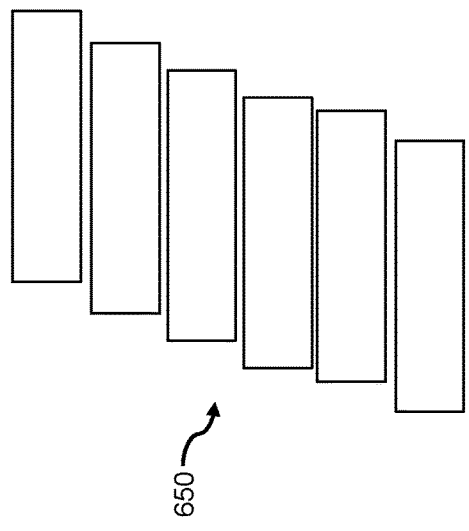
FIGS. 6A, 6B, 6C and 6D show exemplary arrays of elongated segments, operable to provide distinct illuminated touch control regions in accordance with an embodiment of the present disclosure.
Figure 6D:
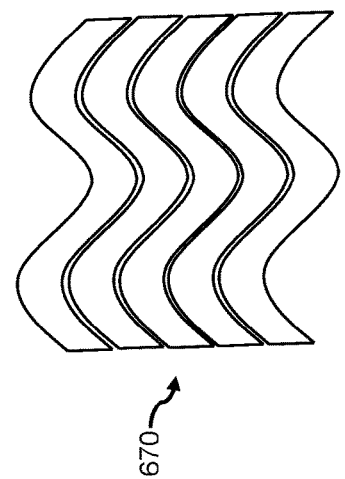
Figure 6A:
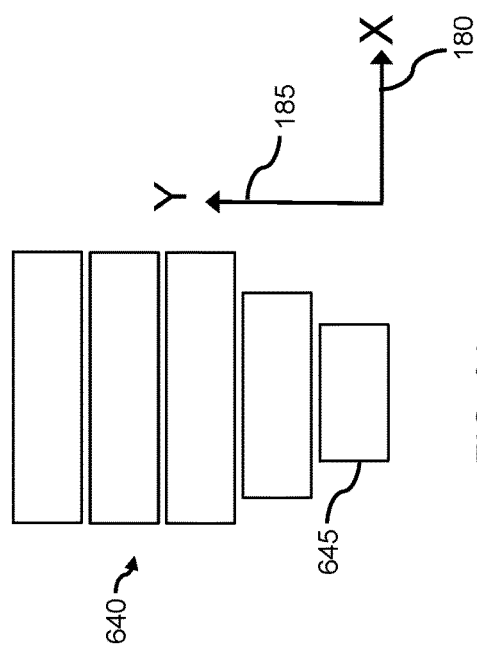
Figure 6C:
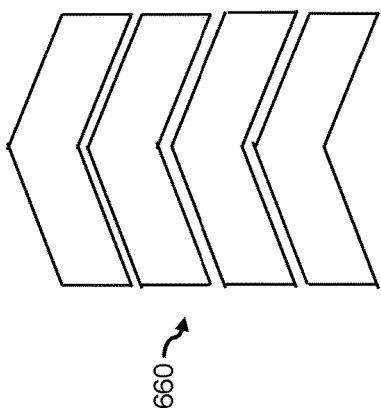

FIGS. 6A, 6B, 6C and 6D show exemplary arrays of elongated backlight segments, operable to provide distinct illuminated regions in accordance with an embodiment of the present disclosure. FIG. 6A illustrates an array of closely spaced segments 640 forming a column. In this embodiment segments lower in the column (e.g. 645) can be shorter in the X direction and thereby indicate a lower power state of the dimmer switch 100. FIG. 6B illustrates an alternative shape for the column of segments. Segments 650 form an offset column. FIG. 6C illustrates an alternative shape for the column of segments. Segments 660 form a closely spaced chevron pattern. FIG. 6D illustrates an alternative shape for the column of segments. Segments 670 form a closely spaced wave pattern. Segment arrays 640, 650, 660 and 670 are closely spaced in a first direction 185 (e.g. Y direction). The close spacing can be facilitated by thin separators (e.g. reflective tape 210e of thin airgaps 212a and 212e) disposed between the segments. Segment arrays 640, 650, 660 and 670 are elongated in a second direction (e.g. X direction). Segment arrays 640, 650, 660 and 670 can transmit light preferentially perpendicular to plane formed by the first and second directions, towards the touch sensitive user surface 140. The elongated shape of the segments can facilitate total internal reflection and homogenization of the light intensity by providing large surfaces (e.g. 440a and 440b in FIG. 4) parallel to the direction of light injection. This elongated nature of the segments promotes the light to reflect at an acute angle from these surfaces.

FIGS. 6E, 6F, 6G and 6H show exemplary lightguides 204. The light guide of a segment backlight can be considered dense or sparse. A dense light guide has a plurality of segments such that segments when viewed from the front (perpendicular to the X-Y plane in FIG. 6A) can all be encompassed by a single planar four-sided shape, such that the ratio of the area of the shape to the combined area of the front surfaces of the segments is less than some factor (e.g. 1.1 or 2.0). For example in FIGS. 6E, 6F and 6G the planar four-sided shape 675 encompasses each of the lightguides 204a, 204b and 677 and the ratio the area of shape 675 to the combined surface area of the segments in each lightguide 204a, 204b and 677 is less than 2. Therefore lightguides 204a, 204b and 677 can be considered dense in the context of a ratio of 2 for the areas. The advantage of a dense lightguide is that when all segments are illuminated the lightguide can uniformly illuminate a large continuous portion (e.g. 70% or 100%) of the touch sensitive surface, without significant gaps in the large continuous portion. In a similar advantage a dense light guide can light a large continuous portion (e.g. 70% or 100%) of a translucent layer behind the touch sensitive surface 140 and thereby uniformly illuminate artwork (e.g. a picture). In this way a segmented backlight with a dense lightguide can fulfill the traditional function of a backlight to illuminate an area with substantially uniform intensity. Conversely FIG. 6H illustrates a sparse lightguide. The lightguide in the segmented backlight can be sparse, such that when viewed from the front the forward facing surfaces of the plurality of segments in the lightguide, cannot be encompassed by a single planar four-sided shape, such that the ratio of the surface area of the shape to the combined surface area of the forward facing surfaces of the segments is less than some factor (e.g. 1.1 or 2.0). For example shape 685 can encompass the segments 686a, 686b and 686c but cannot do so and have a surface area less than twice the combined surface area of the forward facing surfaces 687a, 687b and 687c. While the lightguide of FIG. 6H can illuminate three distinct regions with uniform intensity, it would be difficult for the sparse lightguide of FIG. 6H to uniformly illuminate a rectangular area in front of the corresponding segmented backlight and thereby fulfill the legacy functionality of a backlight in a display.

Figure 7B:
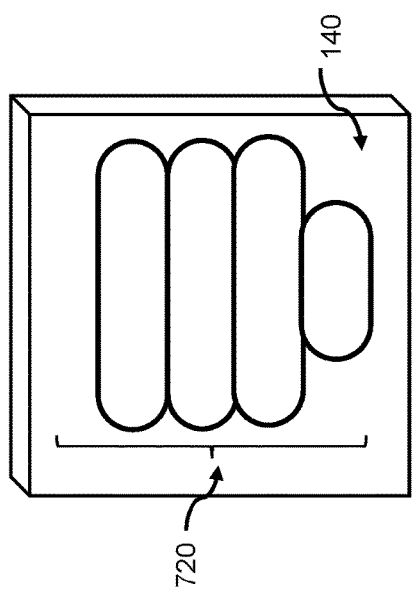
FIGS. 7A, 7B, 7C, 7D and 7E show exemplary touch sensitive surfaces with touch regions, in accordance with an embodiment of the present disclosure.
Figure 7A:
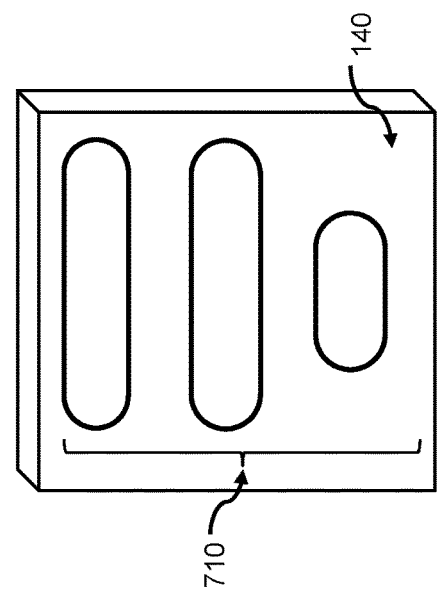

Turning to FIG. 7A-D, several arrangements of touch regions are illustrated on an exemplary switch cover 145. FIG. 7A illustrates a plurality of touch regions 710 that are separated and elongated. The elongated nature of the touch regions provides a touch sensitive electrical switch that can be invariant to unintended lateral movements of the user's finger on the touch sensitive surface. FIG. 7B illustrates a plurality of touch regions 720 that are non-overlapping, elongated and adjoining In the context of this disclosure non-overlapping refers a plurality of touch regions where for each touch region in the plurality all points in that touch region are mutually exclusive form the points in all other touch regions in the plurality. Adjoining refers to each touch regions in a plurality effectively touching at least one other touch region in the plurality.

Figure 7D:
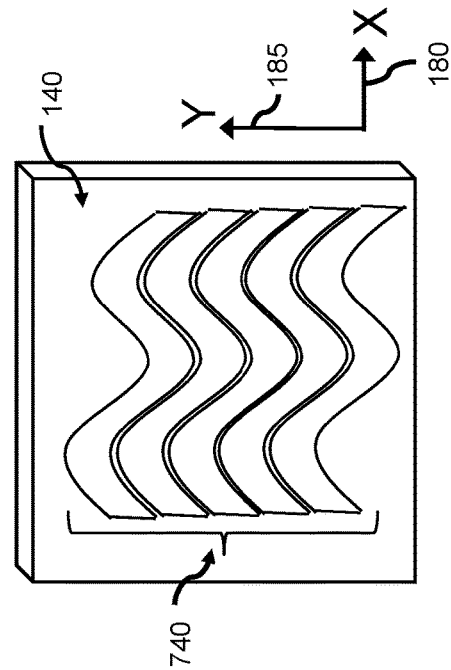
Figure 7C:
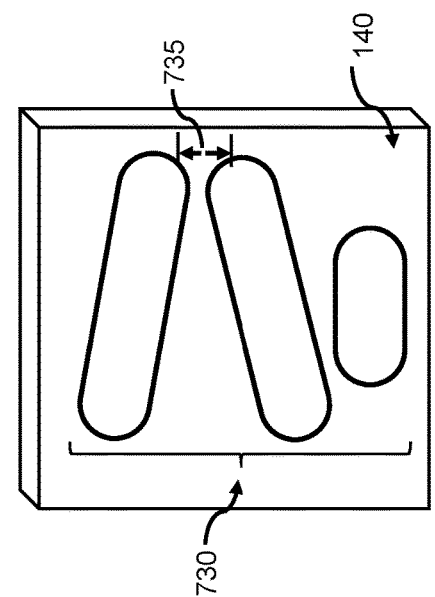

FIG. 7C illustrates a plurality of touch regions 730 that are closely spaced such that each touch region has a least one point within a minimum distance 735 of a neighboring touch region. FIG. 7D illustrates a plurality of touch regions 740 that are closely spaced in a first direction 185 and elongated in a second direction 180. As illustrated in FIG. 7D the touch regions can have a variety of complex shapes while remaining closely spaced in the first direction and elongated in the second direction.

Figure 7E:
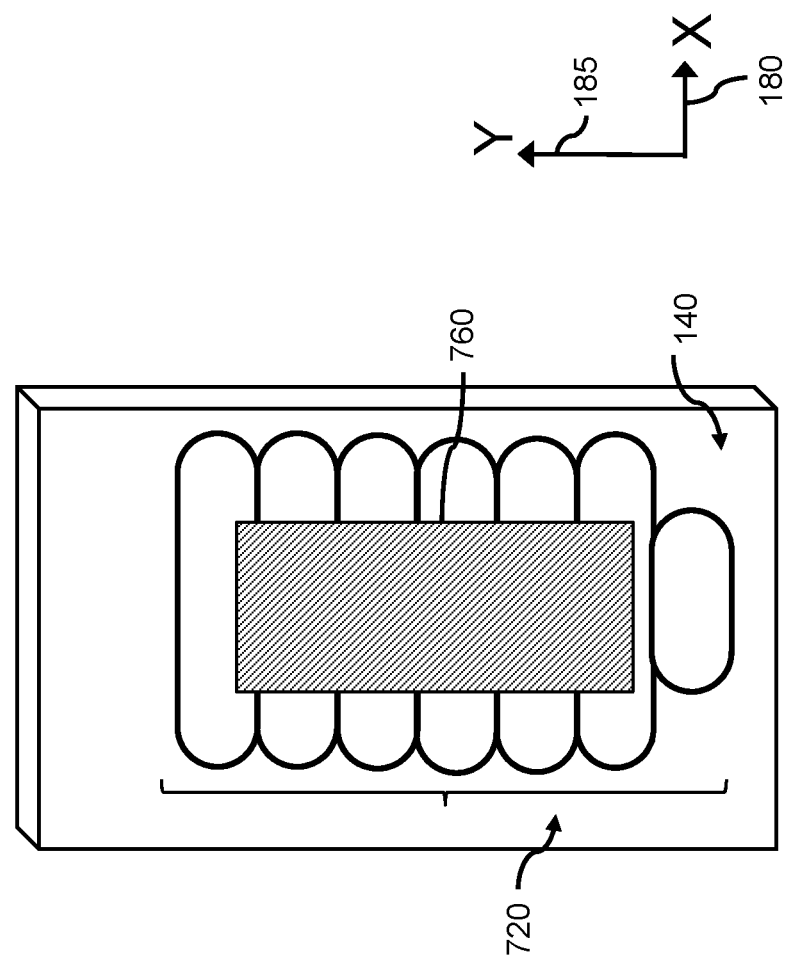

FIG. 7E illustrates a switch cover 145 with a touch sensitive surface 140, and a plurality of touch regions 720. FIG. 7E also illustrates a two-dimensional rectangular active region 760 on the touch sensitive surface. The active region spans a plurality of adjoining touch regions on the touch sensitive surface. In the installed orientation illustrated in FIG. 7E the active region 760 can have a height in the first direction 185 perpendicular to the ground and can have a width in the second direction, parallel to the ground. In several embodiments a defining feature of the active region is that any circle of area 1 square centimeter (1 cm$^2$), located fully within the active region, causes at least one illumination region to illuminate on the touch sensitive surface. In this way there are no finger sized areas within the active region 760 wherein direct user interaction does not illuminate a region of the touch sensitive surface. It can be appreciated that other active areas could be defined based on larger or smaller circular areas. In response to direct user interaction with a 1 cm$^2$ circle located in the active region the touch processor can transmit illumination signals to one or more of the light generation components and thereby generate an illuminated region. If the illuminated region is already illuminated the direct user interaction can nonetheless cause the previous illuminated region to continue illuminating, since illumination can be an ongoing process. In several embodiments touching any 1 cm$^2$ circular area located in the active region generates an illuminated region that encompasses at least some of the 1 cm$^2$ circular area. In this way a user can perceive that any area they touch in the active region 760 causes a well-defined illuminated region to encompass at least a portion of the area they touched. In many locations on the active region the user could perceive that the area they touch is fully encompasses by a uniformly illuminated region. This is advantageous over previous electrical switch designs where large portions of the touch sensitive surface were designed to produce no response or visible user feedback. In some embodiments the generated illuminated region can span the width of the rectangular active region (e.g. 2 cm) in the second direction 180. This is an improvement over electrical switch designs where touching an area of the touch sensitive surface causes a point light source to illuminate beneath the users finger and only a substantially diminished light intensity reaches beyond the user's finger.

Operation

Figure 8:
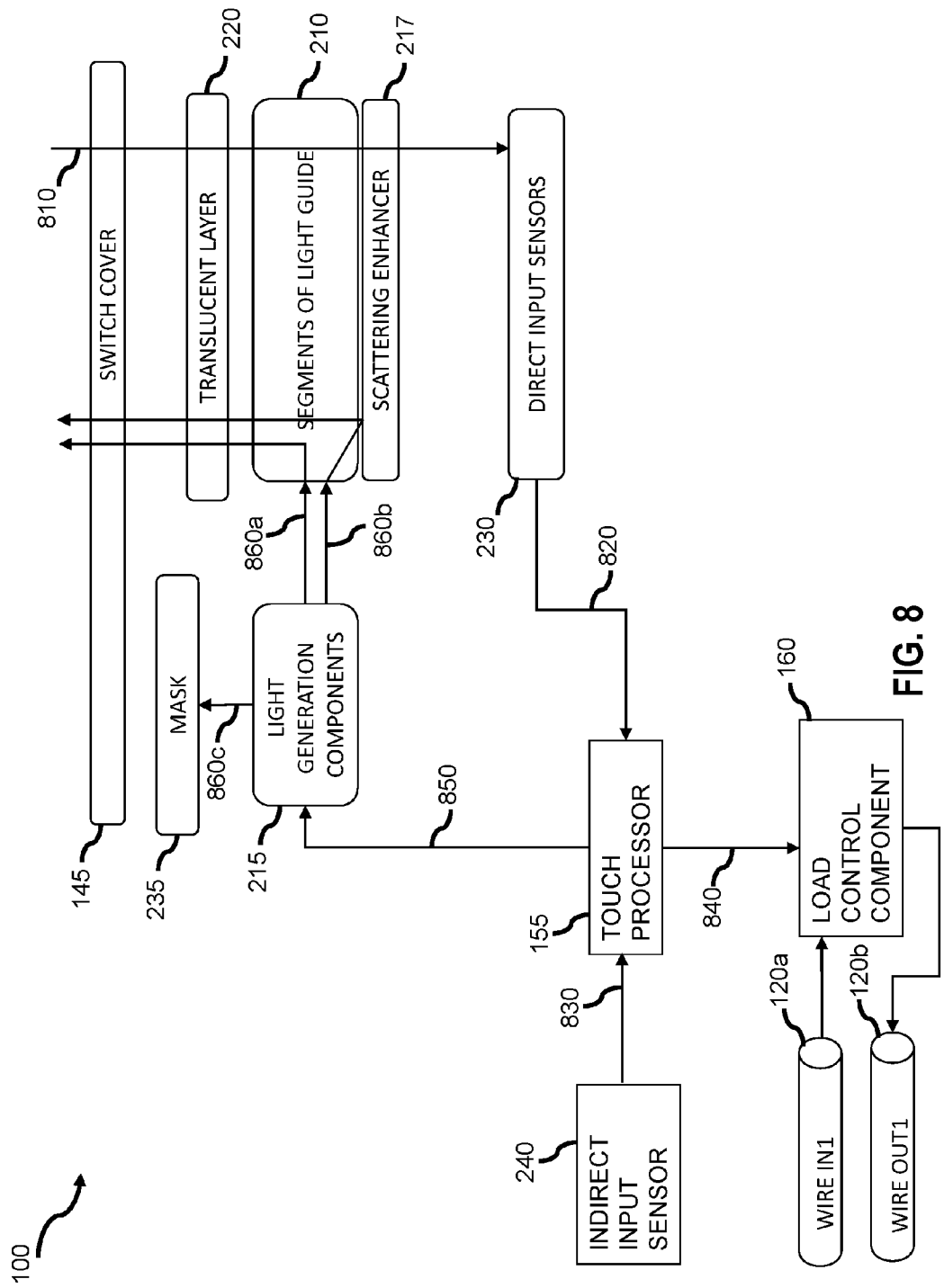
FIG. 8 is a functional diagram illustrating the operation of the variable load control device with distinct illuminated control surfaces in accordance with an exemplary embodiment.

FIG. 8 is a functional diagram illustrating the operation of a dimmer switch 100 with indistinctly illuminated touch regions in accordance with an exemplary embodiment. Dimmer switch 100 contains a plurality of direct input sensors 230. Direct user interaction (e.g. touching or pressing the touch sensitive user surface 140) causes a touch indication 810 to be transmitted to one or more direct user input sensors 230. Touch indications 810 can include changes in pressure, capacitance, or ambient light level. Touch indications can also include changes in frequency or intensity of a sound or light beam. The touch indication is transmitted through switch cover 145 and segments 210. In the embodiment of FIG. 8 the touch indication 810 also passes through a translucent layer 220 and scattering enhancer layer 217. Examples of touch indication 810 can include pressure changes, light level changes (e.g. a finger blocking ambient light), reflection of a signal transmitted from an input sensor 230 or from another component in the load control device (e.g. modulating the time of flight or intensity of a reflected infrared signal from an infrared transceiver such as those found on automatic faucets). Touch indications 810 can be a change in capacitance associated with a user touching the touch sensitive surface 140 and direct input sensors 230 can be electrodes operable to measure this capacitance change. Direct input sensors 230 receive touch indications 810 and generates direct sensor signals 820. Direct input sensors 230 are operably coupled to transmit direct sensor signals 820 to touch processor 155. This coupling can include one or more connectors, wires disposed on circuit boards. This coupling can also include capacitors and protection devices (e.g. zener diodes or transorb diodes) operable to prevent high voltages or high frequency signals from travelling between the direct input sensors 230 and the touch processor 155. Direct sensor signals 820 can be current, voltage, frequency or sound intensity changes associated with user input sensed by one or more direct user input sensors 230. Touch processor 155 can receive indirect sensor signals 830 from one or more indirect input sensors 240. Indirect sensor signals 830 can be current, voltage, frequency or sound intensity changes associated with user input sensed by one or more direct user input sensors 240.

Touch processor 155 can function to process sensor signals 820 and 830 and generate load control signals 840. Touch processor can comprise one or more microchip, a microcontroller and analog transducers (e.g. an operational amplifier, a bipolar junction transistor, a comparator or an analog to digital converter). Many modern microcontrollers have dedicated circuitry designed to implement low voltage touch sensitive switches. For example the Texas Instruments MSP430 processor from and the MicroChip DSPic33 processor families have analog-to-digital circuitry operable to implement the functionality of the touch processor 155. In some embodiments this circuitry enables conversion of direct user interaction with a surface (e.g. touching or pressing) into load control signals 840. In some embodiments, direct sensor signals 820 can cause small changes in the frequency of an oscillating circuit inside the touch processor 155. The touch processor is operable to measure these frequency changes and generate one or more load control signals 840. This type of frequency measurement is often used to transduce sensor signals from capacitive touch sensors. Several electrodes can be sequentially connected to a frequency measurement circuit inside touch processor 155 which can process direct sensor signals 820 and can identify when a user touches one or more of a large number (e.g. >50) of distinct regions on the touch-sensitive user surface 140. In other embodiments the touch processor can include an analog-to-digital converter operable to sense small changes in voltage from sensors and generate digital values corresponding to the magnitude of direct sensor signals 820 and indirect sensor signals 830. The touch processor 155 can have a preset threshold for the change in magnitude or frequency that would correspond to a user touching the faceplate. When the touch processor 155 measures a change in frequency or magnitude sufficient to cross this threshold the state of an output pin on the touch processor can be changed, thereby constituting a load control signal 840. In common implementation of modern dimmer switches a microcontroller generates a series of gating pulses for a load control component 160 (e.g. a triac). Direct sensor signals 820 are used to determine the timing of these signals 840, whereby a greater delay in load control signals 840 causes the load control component to lower power output state, thereby providing less power to a connected electrical load. In other embodiments, touch processor 155 can include one or more elements designed to increase the output power of a touch processor signal. This process is sometimes called "buffering" and can be performed for the purpose of controlling load control component 160. Examples of components that can perform buffering include power transistors and relays.

In some embodiments the touch processor 155 can accept a large number of direct sensor inputs 820 and indirect sensor inputs 830 and can produce a large number of load control signals 840, where a large number is for example ten or more. In this way the touch processor can transduce a plurality of sensor inputs into distinct switch output signals. In other embodiments the touch processor can combine several sensor signals 820 and 830, perform one or more calculations using a computer processor in touch processor 155 and generate one or more load control signals 840. For example touch processor 155 can receive a direct sensor signals 820 when a user touches the touch-sensitive user surface 140 and indirect sensor signal 830 from an indirect sensor 240 (e.g. motion sensor) when a person moves in front of the load control device. Touch processor 155 can contain a processor that can combine direct sensor signals 820 and indirect sensor signals 830 and generate load control signals 840. In some embodiments the touch processor 155 can perform timing calculations to determine when to generate load control signals 840. For example dimmer switch 100 can receive direct sensor signals 820 from the region 150a of the faceplate operable to turn off a light 130. About the same time touch processor 155 and can receive indirect sensor input 830 indicating a person moving in the vicinity of the switch assembly 100. In response to 820 and 830, touch processor 155 can delay the transition of a load control signal 840 operable to generate an OFF power state by a few seconds in order to provide light from an incandescent lamp 130 while the person leaves the vicinity.

In the context of this disclosure an ON state can be considered as having a voltage with a magnitude that is greater than a sizeable portion (e.g. >20%) of a power supply voltage (e.g. 5V) used to operate a touch processor 155. In the context of this disclosure an OFF state can be considered as having a voltage with a magnitude that is less than a sizeable portion (e.g. <20%) of a power supply voltage used to operate touch processor 155. The power supply voltage can be measured relative to a reference voltage supplied to the low voltage switch, often defined as a ground voltage or 0V. Touch processor 155 can include circuitry to operate one or more light generation components 215. Load control signals 840 can be voltages in the range of minus 20 volts to plus 20 volts relative to ground in the junction box, the neutral wire or a local ground reference voltage supplied to both the touch processor 155 and the load control component 160. In one implementation load control signals 840 can be a pulse width modulated signal (PWM) containing a series of pulses. Pulses can contain two or more distinct voltage levels; a high state and a low state voltage. By varying the time proportions of high and low state voltage the PWM voltage waveform voltage switch output signal 840 can control the dimmer switch 323a. Touch processor 155 can operate light generation components 215 (e.g. switch position indicator lights) in response to sensor signals (e.g. 820 or 830). For example in response to a user touching a region of the faceplate, touch processor 155 can operate light generation components 215 to illuminate sections 250a and 250b of the translucent layer 220 indicating the present state of the dimmer switch. In another example, a passive infrared sensor (PIR) could sense a person in the vicinity of dimmer switch 100 and signal touch processor 155 to illuminate regions 250a and 250b of the translucent layer 220 corresponding to the present value of load control signals 840.

Load control signals 840 are operable to control high voltage load control components and other aspects of the electrical switch assembly 100. Electrical switch assembly 100 can contain a variety of other components and circuits. For example switch assembly 100 can contain a rectifier or diode rectifier to convert high voltages to low voltages, a battery to power the speaker or low voltage switches, particularly during a power outage to the building where the switch assembly is located.

In the embodiment of FIG. 8 touch processor 155 is operable coupled to a plurality of light generation components 215. Touch processor 155 can transmit illumination signals 850 to the plurality of light generation components 215. Touch processor 155 can be coupled to light generation components using a variety of components designed to transmit signals, amplify the power of a signal, or demultiplex one or more illumination signals. This coupling can be accomplished using a variety of components including wiring on circuit boards, transistors, multiplexors and demultiplexors. In response to receiving illumination signals 850 one or more light generation components 215 transmit light into one or more segments 210. Light generation components (e.g. LEDs) can transmit light primarily in one direction or a narrow range of angles centered about a direction of maximum intensity The illuminated load control device can be designed to promote light generation components 215 to transmit light in the elongated direction (e.g. 180). This light transmitted in the elongated direction is represented by portions 860a and 860b of the transmitted light. Similarly the illuminated dimmer switch 100 can be designed to attenuate light from light generation component's 215 along other trajectories, such as direct illumination of the switch cover by the portion of light 860c. In one embodiment light generation components transmit light laterally, in the elongated direction 180, along path 860a, into one or more segments 210. Light in path 860a enters a segment and can be reflected internally, thereby enhancing intensity uniformity. Light in path 860a can exit through the forward facing surface of the segment, pass through the translucent layer and produce a uniform region of indirect illumination on the touch sensitive user surface 140. Light in path 860b follows a similar trajectory but is scattered and reflected as it bounces off a scattering enhancer 217 placed behind the rear surface of the segments. Path 860c illustrates light from the light generation components with a normal component to the touch sensitive user surface 140. Even a surface mounted LED designed to transmit light parallel to the mounting surface will generate some light perpendicular to the mounting surface. Such light (860c) could directly illuminate regions of the switch cover. In order to limit or prevent direct illumination of the switch cover, mask 235 can be used to block light in path 860c. Illumination signals 850 can be chosen to correspond to the region touched to produce direct sensor indications 810. In other embodiments the touch region (e.g. 150a in FIG. 1) corresponding to where a user touched can illuminate with a primary intensity and regions located vertically below the touched region can be illuminated at a second lower intensity, thereby generating a column of illuminated elongated regions, with a bright top segment indicating the present operating state. In yet other embodiments one or more regions surrounding the touched region (e.g. 150a in FIG. 1) can illuminate at a lower intensity (e.g. regions 150b and 150c in FIG. 1) in order to indicate the availability of lower or higher output power states.

In one embodiment of electrical switch assembly 100, the functionality of one or more touch regions can be determined by the present state of the load control device. For example, when a user walks into a room where the lights are OFF, low voltage electrical switch 155 can identify that dimmer switch 160 is in the OFF position and can interpret signals 820 from some or all touch regions (e.g. 150 in FIG. 5A) as indications to turn on the light to some previous power output state. In this way the electrical switch assembly can identify direct user interaction and estimate the associated intent based on the original state of the variable load control device. When a person enters a dark room they often reach for the light switch and use the tactile feel of the switch as user feedback. In one example electrical switch assembly could devote sensor signals 820 from user interaction with some or the entire surface of the grille to the function of turning on a light in this scenario, thereby alleviating the user from the burden of touching a particular ON location. In this example an indirect input sensor (e.g., a light level detector) located behind the switch cover 145 could supply sensor signals 830 to a touch processor 155, indicating the light level in the room and enabling the touch processor to interpret sensor signals 820 from a larger number of direct user input sensors 310 as indication to operate a high voltage switch to turn on a light. In another example, indirect user input sensors 240 (e.g. a PIR sensor or proximity sensor) could sense a person who has entered a dark room and generate one or more illuminated regions (e.g. 190a and 190b) on the touch sensitive user surface 140. In one aspect the dimmer switch 100 can illuminate regions (e.g. 250a in FIG. 2E) with increasing intensity as a person gets closer to the dimmer switch (e.g. as they reach for the switch), thereby avoiding unnecessarily disturbing a person who is simply moving in the vicinity of the dimmer switch and does not intend to operate an aspect of the assembly. Dynamic intensity variation can be controlled in part by sensing a person with a plurality of different sensing technologies. For example touch region 150a in FIG. 1 can glow with a low intensity when a person is sensed on a long range PIR sensor (e.g. with 10 meter range). Touch region 150a in FIG. 1 can glow with a higher intensity if the person is subsequently sensed by a shorter range proximity sensor (e.g. active infrared transceiver).

In one embodiment the dimmer switch operates as follows: a user can slide their finger 125 up or down on touch sensitive surface 140. The user's finger crosses several touch regions and generates touch indications 810 in each region. Touch indications 810 travel through the switch cover 145, translucent layer 220 and segments 210 to the touch sensors (e.g. 230a). Touch processor 155 receives direct sensor signals 820 based on the touch region the user is sliding their finger along and indirect sensor signals 830 (e.g. motion indications). The touch processor generates signals to a plurality of right-angle mounted LEDs 215 operable to couple light into segments 210. The segments homogenize the illumination intensity. The segments work in combination with a scattering enhancer 217 to transmit light preferentially towards the translucent layer 220. The flat front surface 222 of each segment can make uniform contact the translucent layer, thereby creating sharply illuminated boundaries at illuminated regions on the translucent layer. Mask 235 can block direct light 860c escaping from light generation components, thereby preventing direct illumination of the touch sensitive surface by the LEDs. Mask 235 can further cover a portion of one or more segment front surfaces 222, thereby further crating distinct, sharp illuminated regions on the translucent layer and illuminated regions 190 on the touch sensitive surface. As the user moves there finger, elongated illuminated regions with substantially uniform illumination are dynamically generated beneath their finger. The shapes are wider than a typical finger and therefore provide the user a clear indication of the dimmer switch operating point. Each illumination region (e.g. 190a) defines the bounds of a touch region (e.g. 150a) on the touch sensitive surface. Direct user interaction in the touch region is operable to illuminate the illuminated region and to generate a power output state of the dimmer corresponding to the illuminated region.

Figure 9:
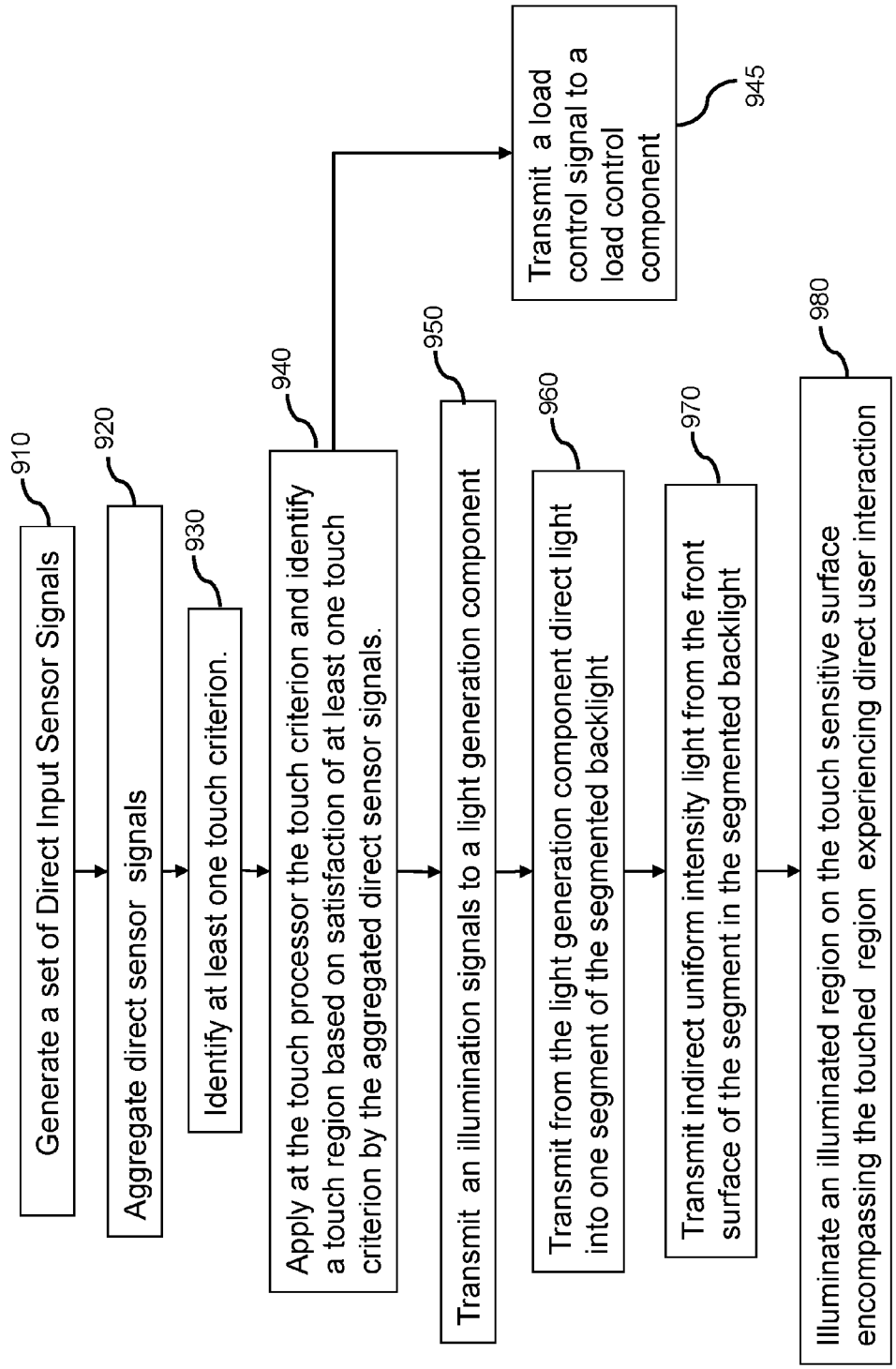
FIG. 9 is a functional diagram illustrating the process of illuminating a touch region on the touch sensitive surface in response to direct user interaction, in accordance with an exemplary embodiment.

FIG. 9 illustrates an algorithm by which the electrical switch generates an illumination region (e.g. 190a) on the touch sensitive surface such that the illumination region encompasses the bounds of a touch region in which direct user interaction is occurring. At block 910 a plurality of direct input sensors (e.g. touch electrode 230*a*) generate direct sensor signals. At block 910 direct input sensors can also transmit direct sensor signals to the touch processor 155. At block 920 direct sensor signals are aggregated. Step 920 can be performed by a touch processor 155 or by a dedicated data aggregator such as a memory microchip. The purpose of aggregating the direct signals is to gather sufficient data to identify if direct user interaction is occurring with the touch sensitive surface. For example at 920 a touch processor 155 could sample analog or digital direct sensor signals every 100 milliseconds and aggregate several samples (e.g. 10) to identify if a variation in one or more direct sensor signals is persistent across the 10 samples thereby confirming a variation and differentiating the variation as being meaningful and possibly indicative of direct user interaction instead of a random variations in the direct input signals.

At block 930 the touch processor identifies at least on touch criterion. An example touch criterion is a change in the value direct sensor signals from a touch electrode from one sample to the next sample that is larger than a particular value. Another touch criterion could a small change in the last 10 samples from one touch electrode (e.g. 230*a* FIG. 2E) relative to neighboring electrodes or relative to previous reading from that touch electrode. A small change over a number of samples can be particularly useful for identifying a stationary finger in a region of the touch sensitive surface. At block 940 the touch processor can apply the one or more criteria to the direct sensor signals and based on satisfaction of the criterion touch processor 155 can identify a touch region wherein direct user interaction is occurring. At block 945 the touch processor can optionally transmit a load control signal to a load control component 160 based on the identified touch region. At block 950 the touch processor can transmit an illumination signal to a light generation component, based in part on the identified touch region. At block 960 the light generation component transmits light into a segment of the segmented backlight. At block 970 the segment of the segmented backlight generates indirect light with uniform intensity and transmits the light through the forward facing surface of 222 of the segment. At block 980 the electrical switch generates an illumination region on the touch sensitive surface with indirect light and uniform intensity. The illuminated region encompasses the touch region in which direct user interaction was sensed.

Figure 10:
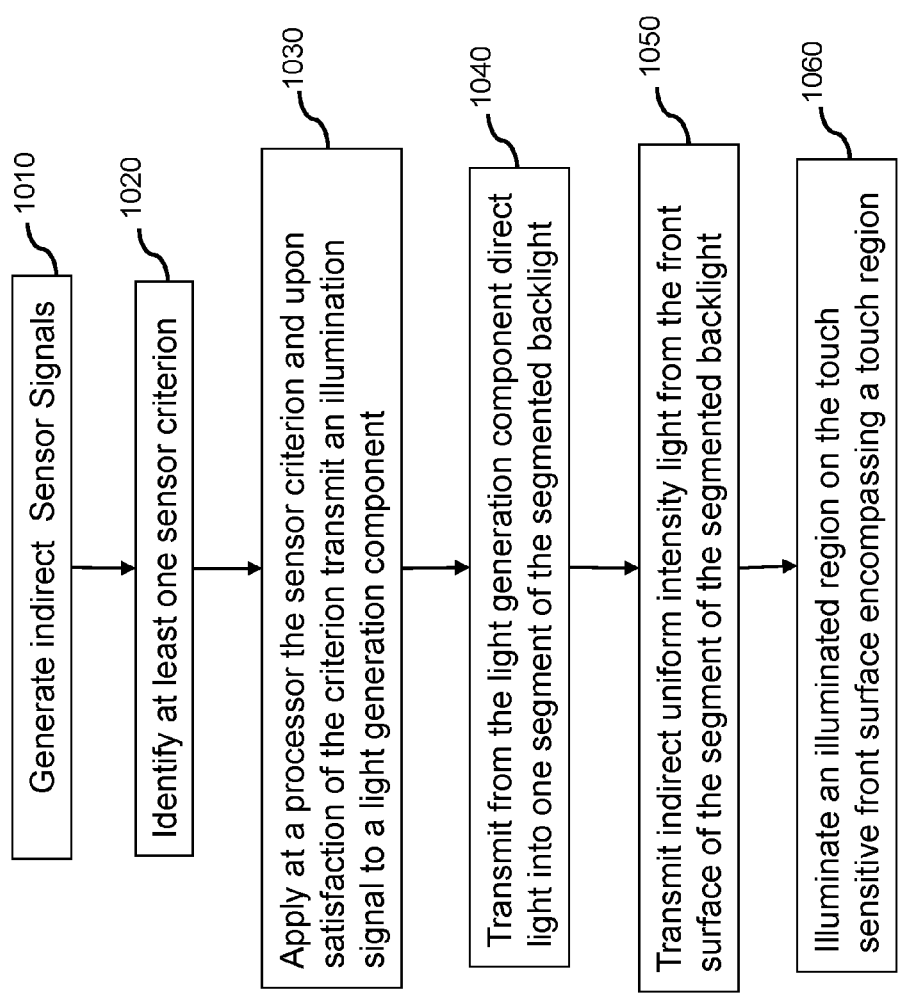
FIG. 10 is a functional diagram illustrating the process of illuminating a touch region on the touch sensitive surface in response to indirect sensor signals, in accordance with an exemplary embodiment.

FIG. 10 illustrates an algorithm for generating an illumination region 190 to illuminate on the touch sensitive surface in response to indirect sensor signals. At block 1010 one or more indirect sensors 240 generate indirect sensor signals 830. At block 1010 the indirect sensors can also transmit the indirect sensor signals 830 to other components in the electrical switch such as a touch processor 155. At block 1020 the touch processor identifies at least one sensor criterion. The sensor criterion can be a threshold value for an indirect sensor signals (e.g. magnitude or range) that indicates an event. For example a criterion for a light level sensor can be a threshold for an indirect sensor signal 830 from a light level sensor. Indirect sensor signals 830 below this threshold can indicate a poorly illuminated room and values above that threshold can indicate well illuminated room. An indirect sensor criterion could be threshold for the variation of a signal from a motion sensor (e.g. the difference between minimum value and maximum value in any five sensor samples). Motions sensor signals 830 above the threshold criterion could indicate motion in the vicinity of the electrical switch.

At block 1030 the processor 155 can apply the criterion to some or all of the indirect input signals and upon satisfaction of the criterion can generate an illumination signal to one or more of the illumination components. At block 1040 the light generation component transmits light into a segment of the segmented backlight. At block 1050 the segment of the segmented backlight generates indirect light with uniform intensity and transmits the light through the forward facing surface of 222 of the segment. At block 1060 the electrical switch generates an illumination region on the touch sensitive surface with the indirect uniform intensity light from the illuminated segment. The illuminated region encompasses a touch region. In some embodiments the touch region or the illumination region can indicate a present or previous state of the electrical switch. For example the electrical switch an be in the OFF position and in response to sensing a person in the vicinity the electrical switch can illuminate the previous power level of the dimmer thereby indicating the previous setting. The intensity of the illuminated segment can convey to the user that the illuminated segment indicates a previous setting and not the current setting. Subsequently, upon direct user interaction with the touch region illuminated by the illumination region the segment can transmit a greater uniform intensity and the electrical switch can in the previous output power state.

Other Embodiments

In one alternative embodiment some or all of the direct input sensors can be made from a transparent conductive material (e.g. conductive ink or Indium Tin Oxide (ITO)). These transparent direct input sensors can be deposited either of the forward facing surfaces of the segments. For example, the front of a segment 410 in FIG. 4B could be coated with ITO, thereby providing a touch sensitive electrode. One advantage of positioning the electrode in front of the segment is improved sensitivity to direct user interaction (e.g. a finger touch) because the electrode is closer to the surface. In a related embodiment transparent touch electrodes can be positioned on a transparent electronic substrate (e.g. a thin polymer layer) in front of the lightguide (e.g. 204*a*).

In another alternative embodiment the segments and front cover can be combined into a molded part. One challenge with this approach is preventing light from spreading into neighboring segments using the front cover as a transmission path. One approach to address this challenge is to include the translucent layer into the molded subassembly. In this case the segments 210, the translucent layer 220 and the front cover 140 can be constructed from a single molded part with each of the constituent parts maintaining their respective functional features. For example the translucent layer could be a piece of thin polymer sheet capable of withstanding the molding temperature of typical thermoplastics (e.g. approximately 160° C. for polycarbonate). The translucent layer 220 could be insert-molded with the segments and front cover into a single molded component.

Figure 11:
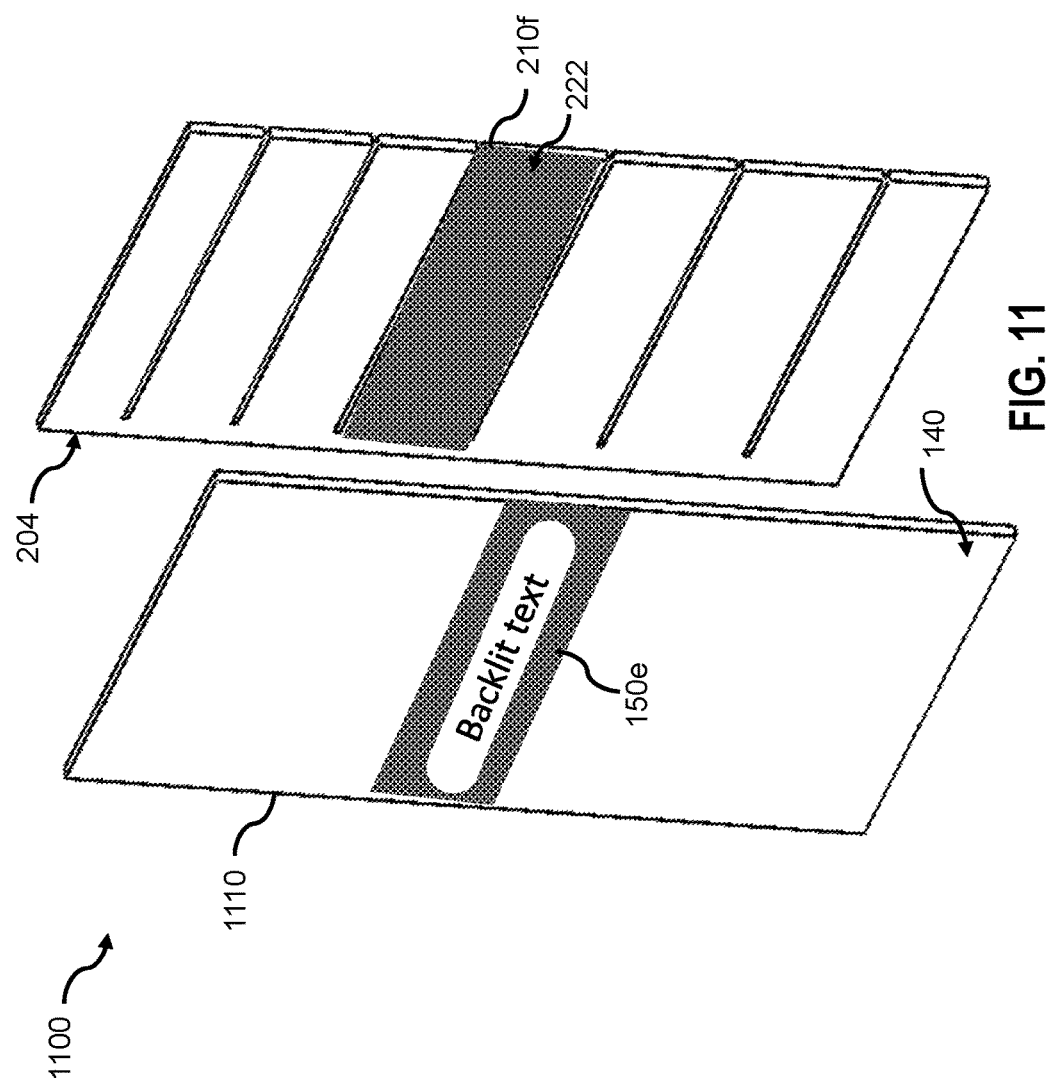
FIG. 11 is an exploded view of a touch sensitive display with a segmented backlight in accordance with an embodiment of this disclosure.

In another alternative embodiment a touch sensitive display 1100 has an edge-lit side illuminated segmented backlight. In response to direct user interaction with touch sensitive surface 140 on the display cover 1110 the display can illuminate touch regions (e.g. 150*e*) on the touch sensitive surface. More specifically in response to direct user interaction with a touch region (e.g. 150*e*) a touch processor 155 can instruct one or more illumination components 215 to illuminate a segment 210*f* of the lightguide 204. The segment can generate uniform intensity indirect light through the forward facing surface 222 of the segment and thereby illuminate a distinct region of the touch sensitive surface. In the embodiment of FIG. 11 the perimeter of the illuminated segment 210f defines the perimeter of the touch region 150e wherein direct user interaction illuminates segment 210f. For simplicity in FIG. 11 several layers typically found in a touch sensitive display are not shown. These layers include touch electrodes layers (e.g. ITO on a polymer substrate), liquid crystal layers, colored pixels, polarizer layers and diffuser layers. It would be known to someone of skill in art that these layers can be arranged in a standard manner behind the display cover 1110.

In one embodiment touch sensitive display 1100 can be an eReader or Tablet PC display. In response to a user touching an area of text on the display the segmented backlight can illuminate a corresponding segment behind the area, thereby illuminating the bounds of corresponding touch region. The user can move their finger up and down the display dragging the illuminated region with them. In this way a person can highlight the text as they read. For example the display could weakly illuminate most of the segmented backlight and strongly illuminate on the region the reader is presently reading, thereby conserving power and not bothering others with excess light. In comparison to rear illuminated segmented displays the mechanical isolation of the segments in the edge-lit design can provide improved definition of the bounds of an illuminated segment. In another embodiment of FIG. 11 the touch sensitive display 1100 does not need direct user interaction to illuminate a segment. For example a tablet PC can receive a new important email message and instruct the edge-lit side-illuminated segmented backlight to increase the intensity to a segment behind the new message. The segmented backlight can illuminate the bounds of a touch region on the touch sensitive surface 140 operable to open the important message. Hence a user could scroll through their messages and the segmented backlight would illuminate segments corresponding to the location of the features on the display to be highlighted (e.g. an important email message). In this way the touch sensitive display 1100 of FIG. 11 could highlight a plurality of touch regions (e.g. 150e) with different intensities by illuminating segments corresponding to the regions with different intensities and can in some embodiments dynamically move the touch regions and vary the intensity of the segmented backlight to track certain features (e.g. important messages) on the display. In another use case a touch sensitive display 1100 could be in a low power mode and operable to awaken from low power mode to a higher power full brightness state upon performance of a gesture (e.g. screen swipe) by a user. In the low power mode the segmented backlight can illuminate one segment with a higher intensity than the rest of the display, thereby indicating to the user a touch region operable to initiate the swipe gesture. Upon direct user interaction with the first touch and subsequent touch regions on the path subtended by the users finger the segment backlight can illuminate the touch region corresponding to the touch region most recently interacted with. In this way the user appears to drag the illuminated segment up or down on the screen, performing a gesture recognizable by the touch processor 155 and thereby bring the display to a high power state. In this way the touch sensitive display can save power by lighting only one segment at a time. Similarly the display can indicate the bounds of a touch region during the gesture without relying on a liquid crystal layer of similar dynamic masking to generate the well-defined illuminated region.

Figure 12:
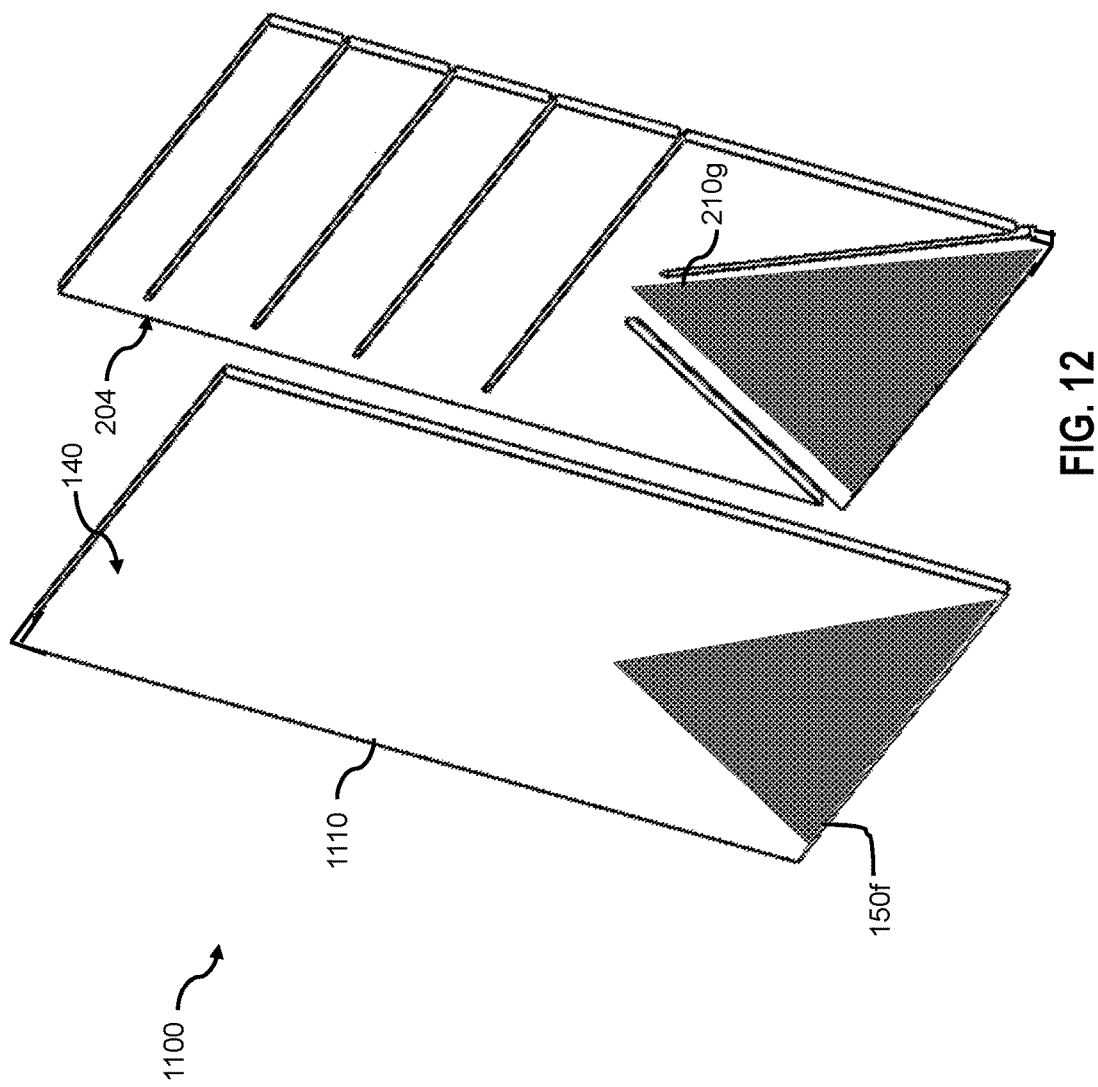
FIG. 12 is an exploded view of a touch sensitive display with a segmented backlight in accordance with an embodiment of this disclosure.

The segments of the segmented backlight in FIG. 11 are illustrated as elongated bars joined to form a single-piece lightguide. It can be appreciated that the touch sensitive display can have segments with a wide variety of shapes, such as those illustrated in FIGS. 2D,6A,6B, 6C,6D, 6G and 6H. It can further be appreciated that several lightguides comprising these or other arrangements of segments can be dense or sparse and can accomplish the legacy functionality of a touch display backlight to uniformly illuminate the display area. In one embodiment of a touch sensitive display the display can have a dedicated function, such as a check-in kiosk at an airport ticket desk. The segmented backlight can be designed to complement this dedicated function by to uniformly illuminate a section of the screen at a point in the check-in process, hereby highlighting an option in a portion of the display by illuminating a segment of the segmented backlight. In this way the display can highlight the bounds of a region on the touch sensitive surface operable to indicate a particular customer selection or option. The disclosed technology teaches how to indirectly, uniformly and distinctly illuminate the region with well-defined boundaries, thereby providing dynamic intensity as a visual indication to the customer. This dynamic illumination complements the dynamic masking offered by liquid crystal (LCD) layers. FIG. 12 illustrates an alternative embodiment of the touch sensitive display 1100, wherein triangular segment 210g is illuminated and illuminates the bounds of touch region 150f on the display cover 1110.

Figure 13:
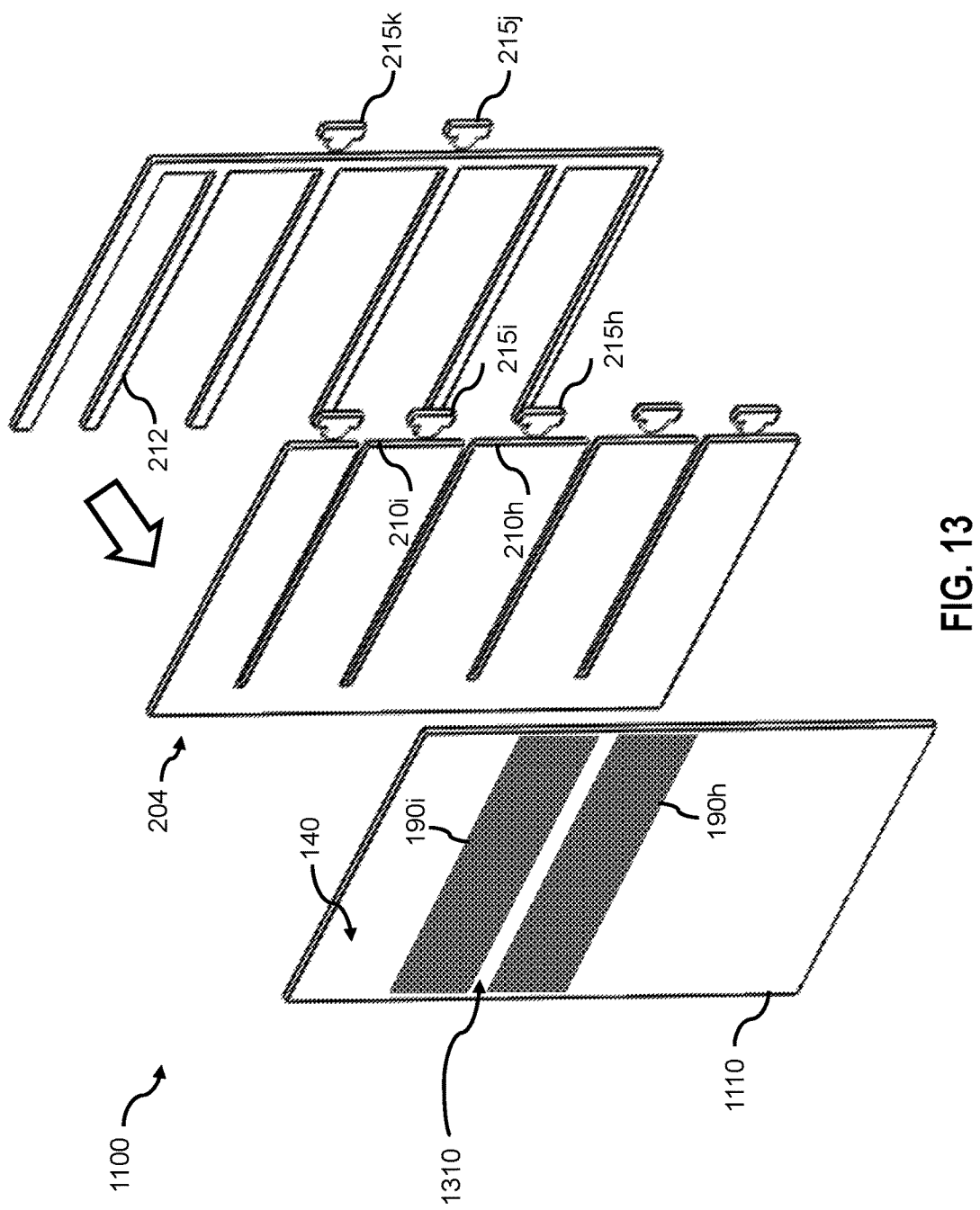
FIG. 13 is an exploded view of a touch sensitive display with a segmented backlight and an array of separators, wherein the separators are operable to illuminate, according to an embodiment of this disclosure.

In yet another embodiment, it can be desirable to uniformly illuminate the touch sensitive display to accomplish the legacy functionality of evenly backlighting the display. Uniformly illuminating all segments of the backlight can produce regions of lower illumination over the separators. The address this challenge the plurality of separators between segments can themselves form a second lightguide, optically isolated from the segments 210 of the segmented backlight 202. Turning to FIG. 13 a touch sensitive display 1100 with a segmented backlight is illustrated. Lightguide 204 comprises closely spaced joined segments (e.g. 210h and 210i). LEDs 215h and 215i shine light parallel to the touch sensitive surface 140 into segments 210h and 210i respectively. Therefore segments of the lightguide 204 can illuminate distinct illuminated regions on the touch sensitive surface (e.g. 190h and 190i). When some or all of the segments are illuminated simultaneously there can be regions (e.g. 1310) with lower illumination between the illuminated regions, due in part to the plurality of separators 212. In the embodiment of FIG. 13 the separators 212 can be a transparent material. The interface between segments (e.g. 210h) and a transparent separator 212 can still function to optically isolate neighboring segments, due in part to reflection of light at the interface between the segments and separators. The separators can be illuminated by light generation sources (e.g. 215j and 215k). Separators 212 can be joined such that light spreads throughout the separators. When LEDs 215j and 215k are not illuminating the separators can provide optical isolation between neighboring segments in the primary array. When LEDs 215j and 215k are energized, the separators can provide illumination to compensate for the illumination gap (e.g. 1310) between neighboring segments, thereby providing a more uniform overall intensity to a display when the segments and separator are operated simultaneously.

In another alternative embodiment an electrical switch can comprise a single segment backlight behind a touch sensitive surface 140. In response to direct user interaction with the touch sensitive surface the single segment backlight can generate and illumination region 190 on the touch sensitive surface. An aspect of the illuminated region (e.g. light intensity) can convey the output power state of the dimmer electrical switch. For example when the electrical switch is providing power to an electrical load (e.g. a light switch 130) an illuminated region can be generated on the touch sensitive surface. A user can swipe upwards or downwards on the touch sensitive surface and cause the electrical switch to transition through several output power states. The intensity of the illuminated region can increase or decrease corresponding to the output power state. This design is useful because the single segment backlight can uniformly and indirectly illuminate an illuminated region. A translucent layer behind the touch sensitive surface can uniformly illuminate artwork. In one embodiment this design can provide uniform illumination to help guide a person who has just turned off a light connected to the electrical switch.

In another aspect of this disclosure a structural component of the electrical switch (e.g. the switch cover 145 or faceplate) can function as a lightguide operable to homogenize injected light. In several embodiments this aspect could be used to uniformly illuminate a faceplate or switch cover of an electrical junction box, upon sensing a person in the vicinity, thereby providing a smart night-light. The uniform illumination can be more pleasing to a user than bright point-source LEDs shining directly outwards from an illuminated wall fixture (e.g. light switch or power outlet). To illustrate this illumination mechanism consider that many overhead EXIT signs are made from transparent acrylic and are directly illuminated by LEDs along one edge. The direct light bounces inside the transparent acrylic, is scattered by the lettering on the sign and ultimately transmitted through the front surface of the sign as uniform intensity indirect light.

Referring to FIG. 1, several embodiments of electrical switch 100 can have a transparent switch cover 145 or transparent faceplate 170. Light can be injected along one or more edges and the transparent component (e.g. transparent substrate or cover) can thereby act as a lightguide. The injected light can be reflected internally, thereby homogenizing the intensity within the switch cover or faceplate. A faceplate (e.g. 170 in FIG. 1) can be illuminated by LEDs and reflect light internally through a process of total internal reflection, thereby homogenizing the light to provide a more pleasant uniform illumination of the vicinity of the faceplate, instead of directly illuminating the vicinity of the faceplate with the LEDs. Decorative artwork (e.g. 225 in FIG. 2) can be etched, painted or adhered to a surface of the switch cover or faceplate. For example, an image of a starry night could be placed behind the switch cover 145 and light injected along one edge. The light could reflect internally several times and eventually scatter from etched highlights on the image (e.g. the stars in an image), thereby causing distinct features to illuminate. This process could be used to highlight accents on an image. The image can be static (e.g. printed) and the highlights can be dynamic in terms of color, intensity and appearance, provided by light scattering from etched or adhered features on a forward facing surface. This embodiment can also provide uniform illumination of the artwork (e.g. 225 in FIG. 2). In several embodiments a switch cover or faceplate can act as a smart night-light. The operation of the smart nightlight feature is described below in the context of a light switch cover 145. However this technology can easily be embodied in a variety of other faceplates and covers for wall mounted electrical junction boxes. For example, in one embodiment an electrical switch can be designed with several illumination components designed to interface with a range of compatible faceplates that also act as lightguides. In this way, the electrical switch can provide the power conversion, indirect sensing of occupants and illumination functions of a smart nightlight and the faceplate can provide a customizable lightguide operable to uniformly illuminate a customized etched image or artwork.

Figure 14:
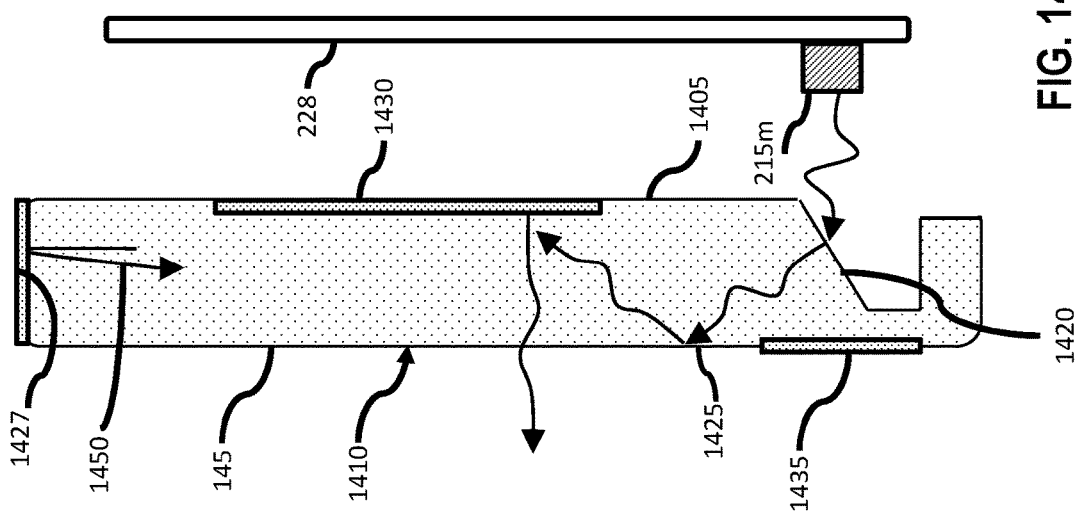
FIG. 14 is a side view of an illuminated switch cover in accordance with one embodiment of the present disclosure.

FIG. 14 is a side view of an illuminated switch cover 145 for a wall mounted electrical junction box in accordance with one embodiment of the present disclosure. Light generation component 215*m* transmits light into the switch cover 145 at surface 1420. In the embodiment of FIG. 14 215*m* shines light primarily in a direction perpendicular to the touch sensitive surface. Surface 1420 can be angled to promote transmitting light into the switch cover parallel to the front surface 1410. A reflective layer 1435 placed in front of the light generation component 215*m* can both attenuate direct illumination of the front surface 1410 and serve to transmit light parallel to the front surface 1410. In other embodiments light generation component 215*m* can be oriented to shine light parallel to surface 1410, thereby promoting internal refection of light within the switch cover. Switch cover 145 can have a smooth rear surface 1405 and front surface 1410. The smooth nature of the front and rear surfaces can enable light projected into switch cover to undergo a process of internal reflection (illustrated at location 1425 in FIG. 14).

The switch cover 145 of FIG. 14 can further comprise a plurality of regions (e.g. 1430) operable to scatter light towards the front surface 1410. Region 1430 can be roughened or can promote scattering through adhered materials. Inscribed features in region 1430 can be formed with a variety of laser etching processes and machines. Exemplary laser engraving machines include those available from Epilog Laser Inc. of Golden Colorado. The engraving process can be used to produce fine lines and roughened areas on the rear or front surfaces of the switch cover. Engraved features can be used to illustrate touch regions (e.g. 150 in FIG. 5A). It can be appreciated that by varying parameters of the laser process (e.g. raster rate, dwell time and laser power) the engraving process can produce a variety of different surface roughness values and line widths. In other embodiments, features in region 1430 can be deposited as an ink or printed coating operable to scatter light from only those regions of the rear surface 1405 where the coating adheres. Semitransparent "frosted" paint, such as that used to make privacy glass can be deposited through a stencil onto a faceplate and produce the same light scattering effect as engraving. Region 1430 can be a portion of a front or back surface of a faceplate or switch cover. The switch cover 145 of FIG. 14 further comprises an opaque section 1435 designed to obscure direct light from illumination components 215*m*. The switch cover can have a reflective layer 1427 on one or more edges. The reflective layer 1427 reflects light incident from inside the faceplate back into the faceplate as illustrated at 1450. The reflective layer acts to promote stronger light intensity within switch cover 145 and also serves to avoid illuminating the edges of the switch cover. In other embodiment the absence of such a reflective coating can enable some light to escape at the edges of the faceplate thereby delineating the edges and offering a decorative option.

Figure 15:
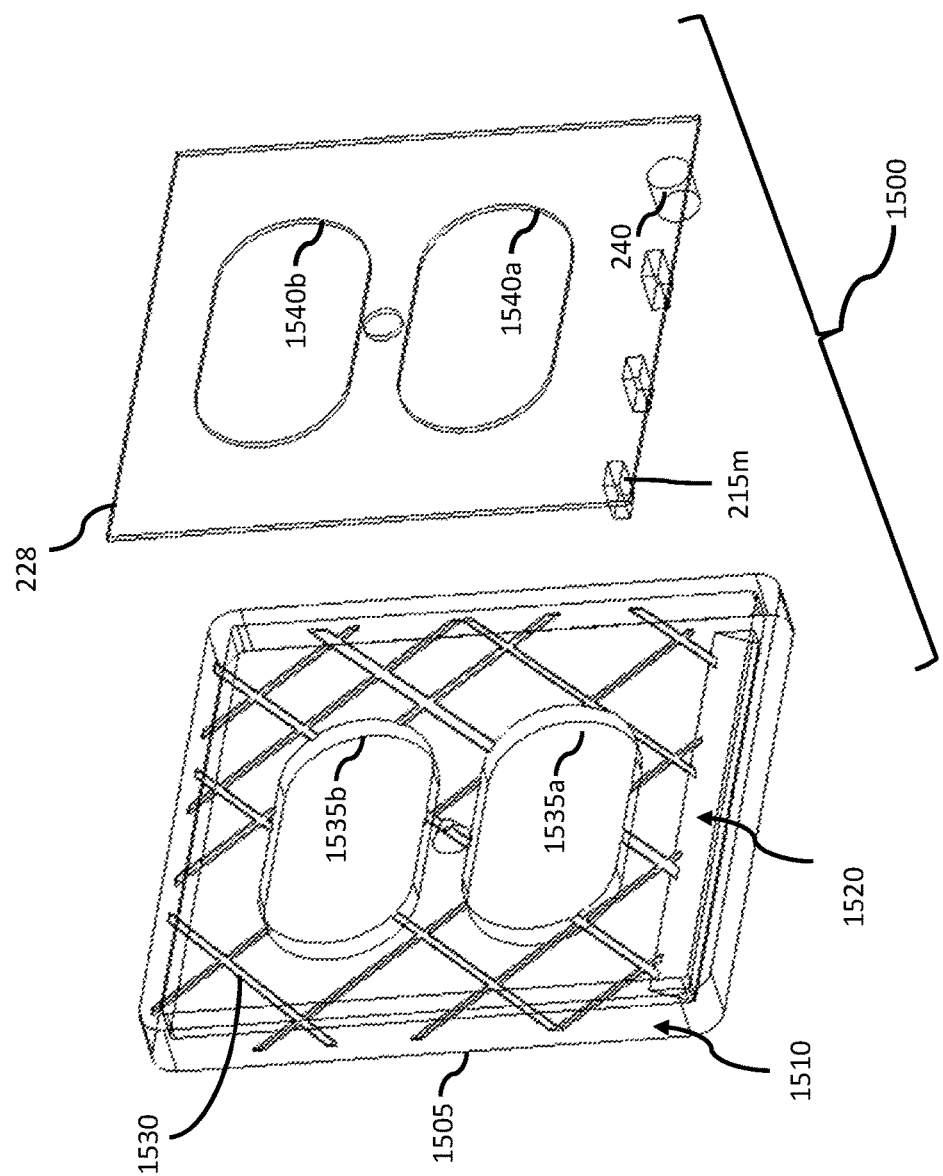
FIG. 15 is a side view of an illuminated faceplate for an electrical power outlet in accordance with one embodiment of the present disclosure.

FIG. 15 is a perspective view of an illuminated faceplate 1500 for a wall mounted electrical power outlet according to one embodiment of the present disclosure. Illuminated faceplate 1500 is operable to illuminate detailed features, such as a decorative image or touch sensitive control areas, based on scattering of light that is internally reflected within a transparent cover portion 1505 of the faceplate 1500. The illuminated faceplate can comprise a transparent cover 1505 that functions as a lightguide with a surface operable to introduce LED light into the faceplate. The faceplate can be easily attached and detached enabling a user to use various illuminated faceplates to suit their decorating preference. The illuminated faceplate can further comprise a sensor 240, operable to sense an aspect of a person or light level in a room. The faceplate can uniformly illuminate in response to sensing the presence of a person.

Figure 16:
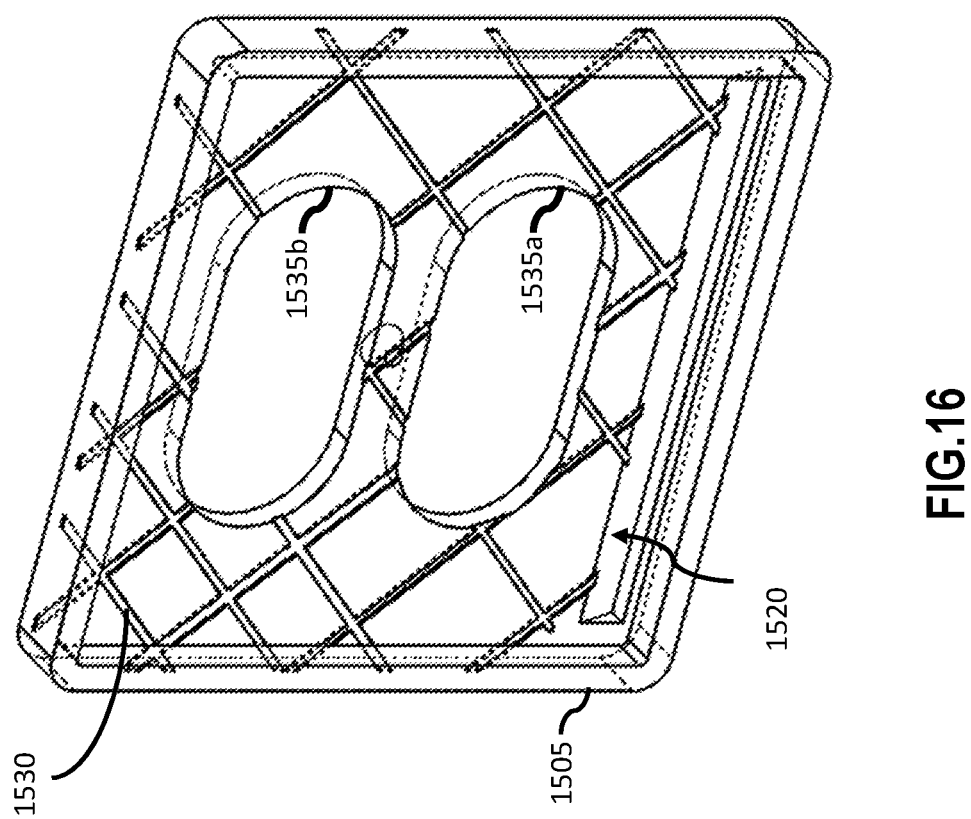
FIG. 16 is a rear view of an exemplary illuminated faceplate operable to fit over a 2-gang wall outlet and illuminate detailed features on the faceplate.

In this embodiment the illuminated faceplate 1500 is operable to cover an electrical power outlet. Transparent cover 1505 can function as a lightguide, thereby providing uniform intensity indirect light through the forward facing surface 1510. In several embodiments illuminated faceplate 1500 can illuminate in response to sensing a person in the vicinity with an indirect sensor 240. In other embodiments illuminated faceplate 1500 can sense when the power outlet is providing power and illuminate to indicate that the outlet is in use. Illuminated faceplate 1500 operates on a similar principal to the illuminated switch cover of FIG. 14. Indirectly illuminating the faceplate of a power outlet can be particularly advantageous because the power outlet itself may not provide sufficient room or access to directly illuminate the faceplate from behind. Circuit substrate 228 can function to hold light generation components (e.g. 215m) and indirect sensor 240. Similar to the illuminated switch cover of FIG. 14, the light generation components can transmit light into the transparent cover 1505 parallel to front surface 1510. A surface 1520 can be angled substantially perpendicular to the front surface 1510 and thereby promote light incident on surface 1520 to travel into the transparent cover 1510 at a shallow angle where it is then reflected internally. Etched features 1530 or etched areas can scatter the light inside the transparent cover, thereby uniformly illuminating the faceplate. The transparent cover can have holes 1535a and 1535b designed to align with holes 1540a and 1540b and surround power outlets in the assembled position. This design is particularly useful for generating uniform illumination that surrounds the openings 1535a and 1535b for the power outlets. In one embodiment indirect sensor 240 can be a motion sensor and the illuminated faceplate can provide uniform effective floor level lighting for a person when they are sensed moving in a darkened room. FIG. 16 is a rear view of illuminated faceplate 1500 operable to fit over a 2-gang wall outlet and illuminate detailed features on the faceplate.

Figure 17A:
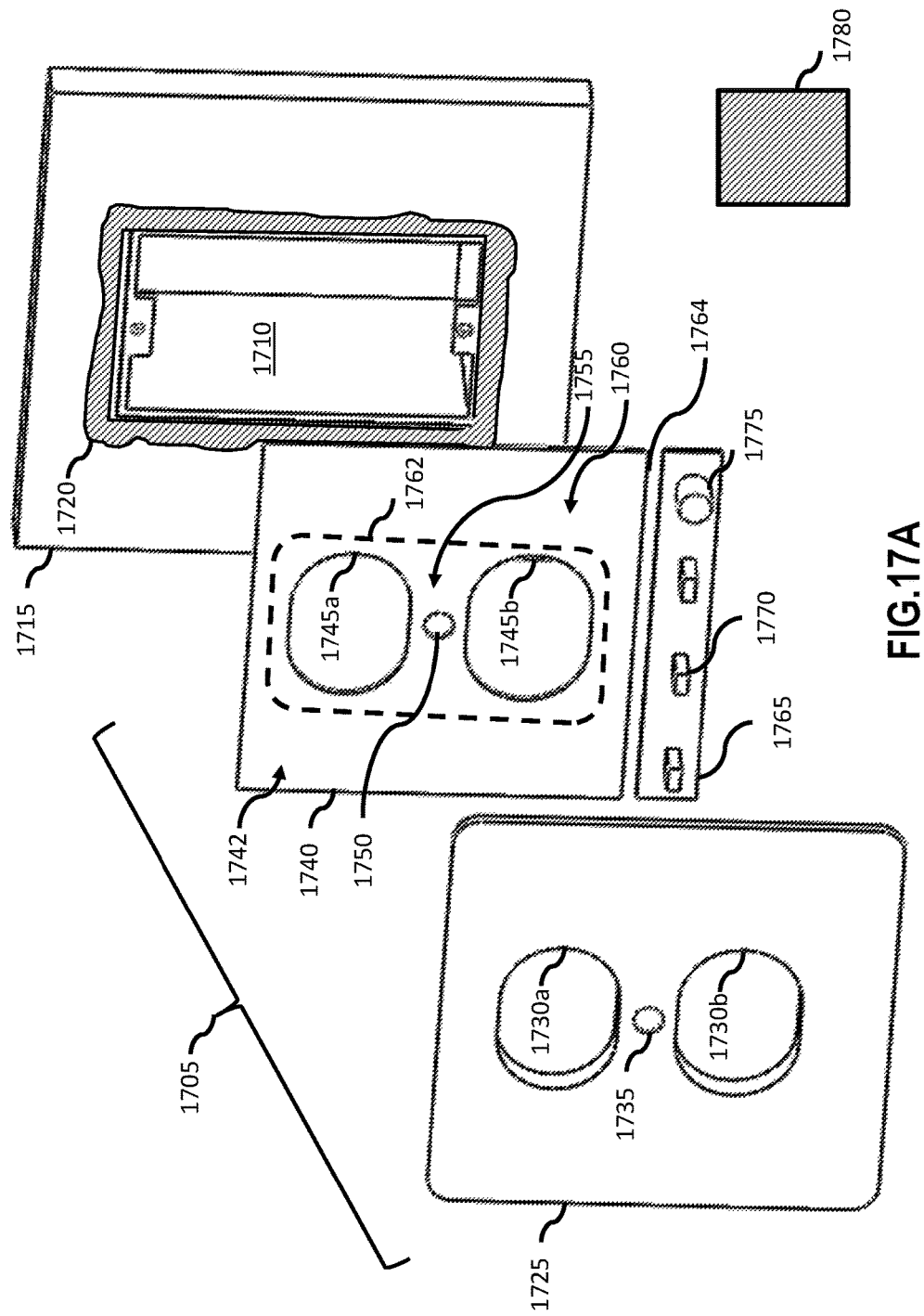
FIGS. 17A and 17B are disassembled views of an illuminated faceplate operable to cover a 2-gang wall outlet in an electrical junction box.

FIG. 17 illustrates an embodiment of an illuminated faceplate 1705 for an electrical junction box 1710. Illuminated faceplate 1705 is operable to cover an electrical junction box 1710 mounted behind wall 1715. In particular, illuminated faceplate 1705 can provide electrical insulation from components (e.g. light switches or power outlets) disposed inside junction box 1710 by covering the transitional region 1720 between the wall 1715 and the junction box 1710. Transitional region 1720 can include an interface between the junction box 1710 and the wall 1715. For example, the transitional region often includes unsightly regions of paint and drywall that are modified to allow access to the electrical junction box. In the embodiment of FIG. 17A the illuminated faceplate can comprise an electrically insulating front cover 1725 and a lightguide 1740 operable to transmit light through the front cover. Front cover 1725 can be transparent or translucent and thereby transmit light from the lightguide to the vicinity of the illuminated faceplate. Front cover 1725 can comprise features such as patterns, artwork, lettering or molded shapes operable to be illuminated by the lightguide. For example, the front cover 1725 can include a decorative pattern that is etched, painted or printed on the rear surface of the front cover and hidden from view when the lightguide is not illuminated. Upon illumination of the lightguide the pattern can be illuminated to provide decorative illumination of the faceplate. In the embodiment of FIG. 17A insulating cover front 1725 contains openings 1730a and 1730b that align with corresponding openings 1745a and 1745b in the lightguide. Openings 1730a-b and 1745a-b can provide access to electrical components disposed inside electrical junction box 1710 to people. Opening 1735 in the insulating cover can align with opening 1750 in the lightguide to enable a fastener to attach the illuminated faceplate 1705 to an electrical component in the junction box 1710 such as a light switch or electrical outlets. For example openings 1735 and 1750 can be sizes to allow the threaded portion of a fastener to pass through the openings but not allow the head portion of the fastener to pass through. Lightguide 1740 can comprise front surface 1742 with a portion 1755 (e.g. inside line 1762) operable to cover junction box 1710 in the installed position. Front surface 1742 can further comprise a portion 1760 operable to cover transitional regional 1720, thereby hiding the interface between the junction box and wall. In some embodiments illuminated faceplate 1705 can further comprise a circuit substrate 1765 that can provide electrical conductors and a mounting surface for one or more illumination components (e.g. LED 1770) and a sensor 1775. Sensor 1775 can be a passive infrared sensor or a light level sensor operable to generate a signal that causes illumination components (e.g. LED 1770) to illuminate.

Figure 17B:
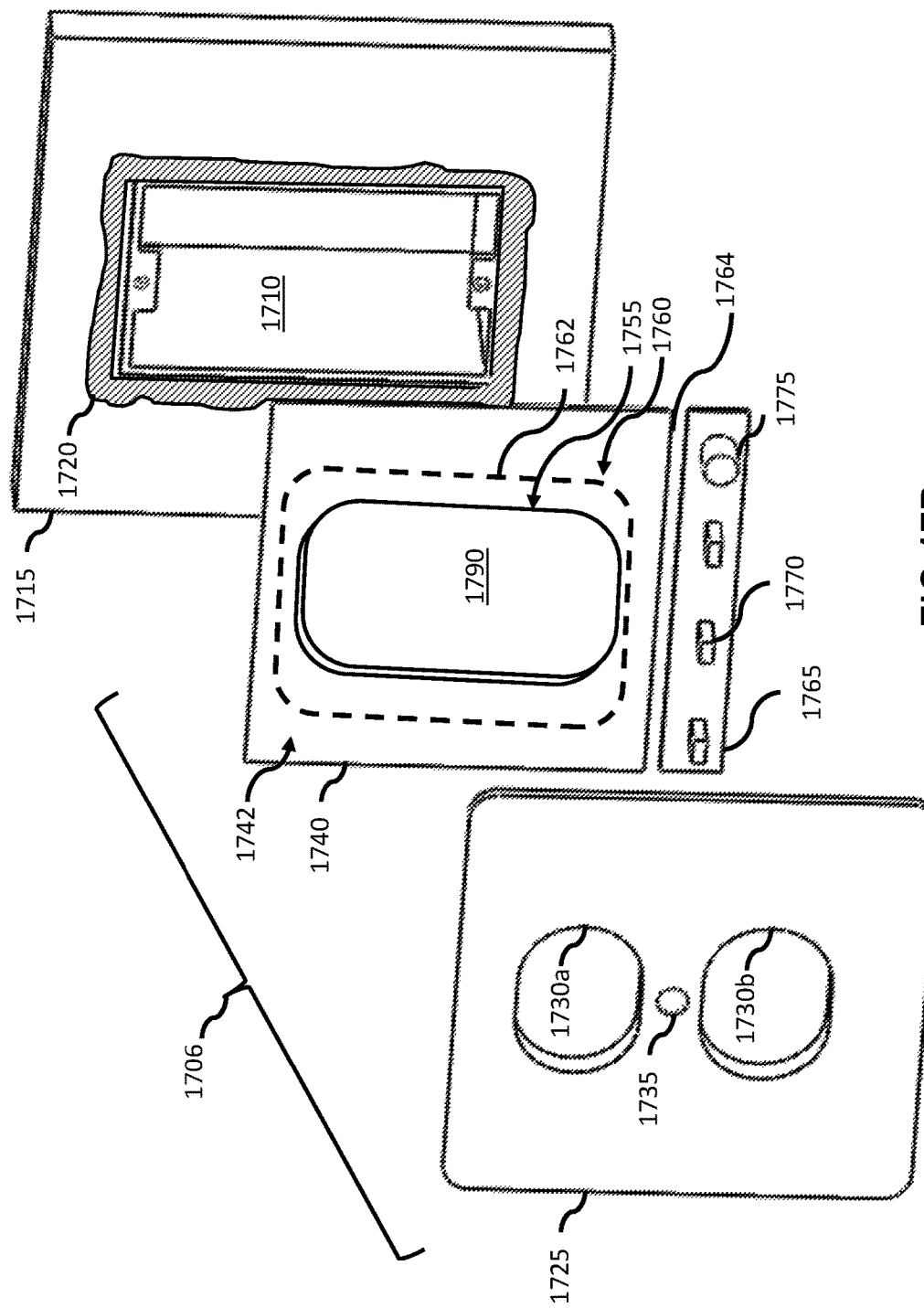

Lightguide 1740 can comprise a transparent substrate (e.g. a polymer or glass substrate) that can be thin (e.g. 0.1-5 millimeters) and have a light receiving surface 1764, such as surface 1420 in FIG. 14 or 1520 in FIG. 15, operable to transmit or guide light from the illumination components (e.g. LED 1770) into the lightguide. Light receiving surface surface 1764 can be substantially perpendicular to the front surface 1742 such that light transmitted into the lightguide undergoes total internal reflection at the front surface and bounces internally inside the light multiple times, thereby homogenizing the light intensity to generate homogenized intensity light. In one advantage, the lightguide enables the light to be spread uniformly around openings (e.g. 1745a) in the lightguide and the insulating cover. One or more surfaces in the lightguide can be functionalized to scatter the homogenized intensity light through the front surface 1740. For example, a back surface of the lightguide can be have a rough texture (e.g. introduced during a molding process) operable to scatter light through the front surface 1740. In another example the back or front surface can have adhered, etched or molded patterns or features operable to scatter the homogenized intensity light from the substrate of the lightguide through the front surface. A reflector (e.g. reflective layer 1780) located behind the lightguide can function to redirect light scattered away from the front surface to be directed towards the front surface. For example, a Mylar or metalized polymer layer is used in several backlight assemblies to increase the intensity of light scattered through the forward surface by redirecting light from the backward direction towards the front surface. In the embodiment of FIG. 17A openings 1745a and 1745b are sized to fit components (e.g. electrical outlets) disposed inside the electrical junction box. In the context of the present disclosure openings in the lightguide are considered to be sized to fit components in a junction box if the size of the openings forms a tight seal that conforms to the shape (e.g. oval or rounded rectangle) of an electrical component encompassed by the opening in the installed position. FIG. 17b illustrates an alternative embodiment of an illuminated faceplate 1706 wherein the insulating front cover 1725 has openings that fit components (e.g. power outlets or light switches) disposed in an electrical junction box but the lightguide 1740 has a larger opening 1790 sizes to merely encompass components disposed in the electrical junction box. The illuminated faceplate 1706 can function to uniformly illuminate the transparent or translucent insulating front cover 1725 while providing user access to electrical components disposed inside an electrical junction box. While illuminated faceplates 1706 and 1705 can be designed to enable access to a 2-gang electrical outlet disposed in junction box 1710 a wide variety of other illuminated faceplates embodiments can cover other electrical components such as light switches of various sizes, mechanical dimmer switches, a display mounted inside a junction box and various connectors such as BNC, USB and RJ-45 connectors. In several embodiments the illuminated faceplate can have one or more openings that hold a connector (e.g. provide a substrate that resist movement of the connector upon user interaction with the connector) in a secured position to enable user access to the connector. In several embodiments a transparent portion of a front cover (e.g. front cover 1505 in FIG. 15) is the lightguide and comprises the front surface, the transparent substrate, the light receiving or light injection surface and the surface or portion of a surface that scatters light through the front surface. In other embodiments of the illuminated faceplate (e.g. embodiments 1705 and 1706 in FIGS. 17A and 17B) the lightguide can be layer behind an insulating front cover.

What is claimed is:

1. A faceplate for a wall mounted electrical junction box comprising: a lightguide comprising: a transparent substrate, a front surface configured to extend beyond and cover at least a portion of the electrical junction box, a light receiving surface to transmit light into the transparent substrate, wherein the light receiving surface is positioned relative to the front surface to cause the light to undergo internal reflection at the front surface and thereby at least in part homogenize the intensity of the light in the transparent substrate, a back surface, and a first portion of the front or back surface that functions to scatter the light through the front surface, wherein the lightguide further comprises at least one opening in the front surface sized to encompass at least a portion of an electrical component operable to be disposed in the electrical junction box.

2. The faceplate of claim 1 wherein the first portion of the front or back surface further comprises features that scatter the light and thereby cause the lightguide to illuminate the features.

3. The faceplate of claim 1 wherein the lightguide further comprises at least one opening in the front surface sized to provide a user access to the electrical component.

4. The faceplate of claim 1 wherein the lightguide further comprises a first opening configured to provide a user access to the electrical component disposed at least partially in the electrical junction box and a second opening configured to enable at least a portion of a fastener to pass through the faceplate.

5. The faceplate of claim 1 further comprising one or more light generation components configured to generate the light and to transmit the light to the light receiving surface of the lightguide.

6. The faceplate of claim 5 further comprising a sensor to cause one or more light generation components to generate the light in response to sensing an aspect of a person.

7. The faceplate of claim 5 further comprising a front cover positioned in front of the front surface of the lightguide, such that upon generation of the light by the one or more light generation components, the front cover is more indirectly illuminated by the light that has undergone internal reflection within the lightguide than directly illuminated by the one or more light generation components.

8. The faceplate of claim 5 wherein the one or more light generation components are positioned relative to the lightguide to transmit the light substantially into the lightguide and to transmit the light transmit substantially more parallel to the front surface than perpendicular to the front surface.

9. The faceplate of claim 1 further comprising a front cover positioned in front of the front surface of the lightguide, such that the lightguide functions to illuminate at least a portion of the front cover.

10. The faceplate of claim 9 wherein the front cover further comprises a feature that is uniformly illuminated by the light, upon scattering of the light through the front surface of the lightguide.

11. The faceplate of claim 9 wherein the front cover further comprises a touch region operable to transmit direct user interaction to one or more touch sensors located behind the faceplate and wherein the lightguide is operable to illuminate the touch region on the front cover.

12. The faceplate of claim 11 wherein the lightguide is configured to delineate a boundary of the touch region based at least in part on the light scattered through the front surface.

13. The faceplate of claim 1 further comprising a reflector located behind the lightguide to reflect light scattered from the back surface of the lightguide.

14. The faceplate of claim 1 wherein the lightguide is sized to cover at least a portion of the interface between the electrical junction box and a wall.

15. A faceplate for an electrical junction box comprising: a transparent substrate configured to cover a transition region between a wall and at least a portion of the electrical junction box, a front surface, a light receiving surface to transmit light into the transparent substrate and positioned relative to the front surface to cause the light to undergo total internal reflection at the front surface and thereby generate homogenized intensity light in the transparent substrate, a rear surface positioned behind the front surface, and at least one portion of the front or rear surface that functions to scatter the homogenized intensity light through the front surface.

16. The faceplate of claim 15 wherein the front surface is substantially more indirectly illuminated by the homogenized intensity light scattered by the at least one portion of the front or rear surface than directly illuminated by the light transmitted through the light receiving surface into the transparent substrate.

17. A faceplate for an electrical junction box with indirect illumination comprising: a front cover that functions as a lightguide to homogenize light within the front cover through a process of internal light reflection, the front cover configured to extend over a transitional region between a wall and the electrical junction box, the front cover comprising: a front surface sized to cover at least a portion of the electrical junction box, a light receiving surface to transmit light into the transparent substrate and positioned relative to the front surface to cause the light to undergo internal light reflection at the front surface and thereby generate homogenized intensity light in the transparent substrate, a second surface positioned behind the front surface, and at least a portion of the front or second surface that functions to scatter the homogenized intensity light through the front surface.

18. The faceplate of claim 17 wherein the front cover further comprises at least one opening sized to encompass at least part of an electrical component operable to be disposed at least partially inside the electrical junction box.

19. The faceplate of claim 17 wherein the front surface further comprises an opening that is configured to permit a portion of an electrical component housed in the electrical junction box to protrude through the faceplate.

20. The faceplate of claim 19 wherein the opening in the front surface is configured to enable at least some of the electrical component to protrude through the faceplate.

21. The faceplate of claim 19 wherein the opening in the front surface is sized to enable direct user interaction with the electrical component disposed at least partially in the electrical junction box.

22. The faceplate of claim 17 wherein the front cover further comprises a touch region operable to transmit direct user interaction to one or more touch sensors located behind the faceplate and wherein the light receiving surface is positioned relative to the front cover to illuminate the touch region on the front cover.

\* \* \* \* \*